(12) United States Patent
Unuma et al.

(10) Patent No.: US 12,294,391 B2
(45) Date of Patent: May 6, 2025

(54) ENCODING DEVICE, ENCODING METHOD, DECODING DEVICE, DECODING METHOD, AND PROGRAM

(71) Applicant: Sony Semiconductor Solutions Corporation, Kanagawa (JP)

(72) Inventors: Masayuki Unuma, Kanagawa (JP); Hiroshi Shiroshita, Kanagawa (JP); Daisuke Okazawa, Kanagawa (JP); Aritoshi Kimura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 180 days.

(21) Appl. No.: 18/009,527

(22) PCT Filed: Jun. 16, 2021

(86) PCT No.: PCT/JP2021/022799
§ 371 (c)(1),
(2) Date: Dec. 9, 2022

(87) PCT Pub. No.: WO2022/004376
PCT Pub. Date: Jan. 6, 2022

(65) Prior Publication Data
US 2023/0223953 A1     Jul. 13, 2023

(30) Foreign Application Priority Data

Jun. 30, 2020   (JP) .................................. 2020-112712

(51) Int. Cl.
*H03M 7/30*     (2006.01)
*G06F 11/08*    (2006.01)
(Continued)

(52) U.S. Cl.
CPC ........... *H03M 7/6011* (2013.01); *G06F 11/08* (2013.01); *H03M 5/145* (2013.01); *H03M 7/14* (2013.01);
(Continued)

(58) Field of Classification Search
CPC .. H03M 7/6011; H03M 7/6005; H03M 5/145; H03M 13/31; H03M 13/63;
(Continued)

(56) References Cited

U.S. PATENT DOCUMENTS 8,494,081 B2 *  7/2013  Takahashi ........... H04L 25/4917
                                                        375/301
2019/0207744 A1  7/2019  Reinhardt

FOREIGN PATENT DOCUMENTS

EP        0977411 A     2/2000
EP        1351462 A1   10/2003
(Continued)

OTHER PUBLICATIONS

International Search Report (PCT/ISA/210), International Application No. PCT/JP2021/022799, dated Sep. 21, 2021.

*Primary Examiner* — Khai M Nguyen
(74) *Attorney, Agent, or Firm* — Michael Best & Friedrich LLP

(57) ABSTRACT

Encoding devices, methods and programs that encode with high transmission efficiency by controlling a running disparity are disclosed. In one example, an encoding device includes a scrambling circuit that scrambles an input data string, a calculation circuit that calculates a first running disparity of the scrambled data string, a determination circuit that determines whether or not to invert the scrambled data string on the basis of a first running disparity calculated by the calculation circuit and a second running disparity calculated at a time point before the first running (Continued)

disparity, and an addition circuit that inverts or non-inverts the scrambled data string on the basis of a determination result by the determination circuit, adds a flag indicating the determination result, and outputs the data string. The technology can be applied to devices that perform SLVS-EC standard communication.

20 Claims, 65 Drawing Sheets

(51) Int. Cl.
- *H03M 5/14* (2006.01)
- *H03M 7/14* (2006.01)
- *H03M 13/00* (2006.01)
- *H03M 13/19* (2006.01)
- *H03M 13/31* (2006.01)
- *H04L 1/00* (2006.01)
- *H04L 25/49* (2006.01)
- *H04N 23/60* (2023.01)

(52) U.S. Cl.
CPC ......... *H03M 7/6005* (2013.01); *H03M 13/19* (2013.01); *H03M 13/31* (2013.01); *H03M 13/63* (2013.01); *H04L 1/0057* (2013.01); *H04L 1/0061* (2013.01); *H04L 25/4908* (2013.01); *H04N 23/665* (2023.01)

(58) Field of Classification Search
CPC ......... H03M 13/19; H03M 7/14; G06F 11/08; H04N 23/665; H04L 1/0057; H04L 1/0061; H04L 25/4908
USPC ...................................................... 341/50, 58
See application file for complete search history.

(56) References Cited

FOREIGN PATENT DOCUMENTS

| | | |
|---|---|---|
| JP | 863290035 A | 11/1988 |
| JP | H0223737 A | 1/1990 |
| JP | H0537389 A | 2/1993 |
| JP | H11500887 A | 1/1999 |
| JP | H11177430 A | 7/1999 |
| JP | 2012120159 A | 6/2012 |
| KR | 20110101012 A | 9/2011 |

\* cited by examiner

FIG. 6

| CURRENT CUMULATIVE VALUE RDc | PAST CUMULATIVE VALUE RDp | FLAG |
|---|---|---|
| RDc>0 | RDp>0 | 1 |
| | RDp=0 | 1 |
| | RDp<0 | 0 |
| RDc=0 | RDp>0 | 0 |
| | RDp=0 | 0 |
| | RDp<0 | 1 |
| RDc<0 | RDp>0 | 0 |
| | RDp=0 | 0 |
| | RDp<0 | 1 |

FIG. 7
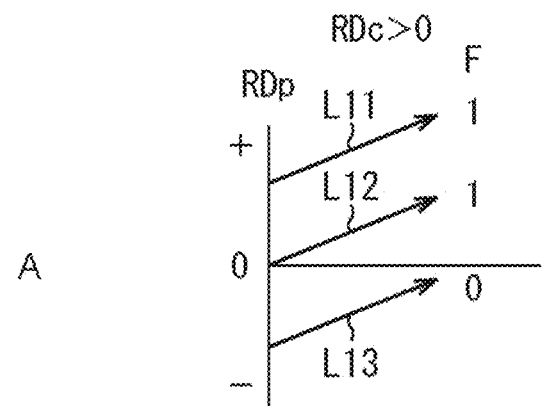
A
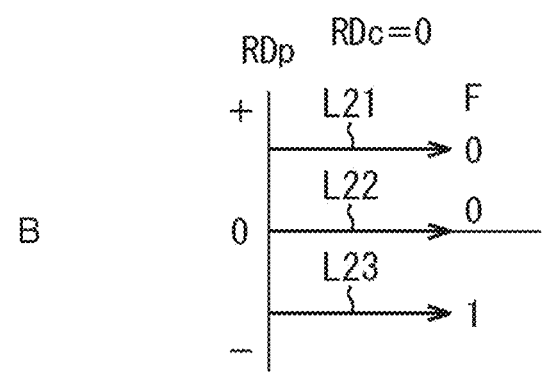
B
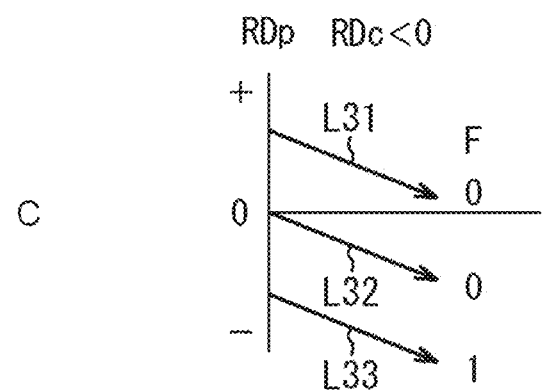
C

FIG. 19

| MAJOR ITEM | MINOR ITEM | INFORMATION AMOUNT | CONTENT |
|---|---|---|---|
| FRAME INFORMATION | Frame Start | 1bit | INDICATING BEGINNING OF FRAME (FOR EXAMPLE: FIRST LINE) |
| | Frame End | 1bit | INDICATING END OF FRAME (FOR EXAMPLE: REAR DUMMY FRONT LINE) |
| LINE INFORMATION | Line Valid | 1bit | INDICATING VALID/INVALID OF LINE |
| | Line Number | 13bit | INDICATING LINE NUMBER |
| OTHERS | Reserved | 32bit | RESERVED FOR FUTURE EXPANSION |
| | Header ECC | 18byte | ECC OF HEADER INFORMATION |

FIG. 20

| Byte | Bit | Contents |
|---|---|---|
| H1 | 15 | CRC[15] X^15 |
|  | 14 | CRC[14] X^14 |
|  | 13 | CRC[13] X^13 |
|  | 12 | CRC[12] X^12 |
|  | 11 | CRC[11] X^11 |
|  | 10 | CRC[10] X^10 |
|  | 9 | CRC[9] X^9 |
|  | 8 | CRC[8] X^8 |
| H0 | 7 | CRC[7] X^7 |
|  | 6 | CRC[6] X^6 |
|  | 5 | CRC[5] X^5 |
|  | 4 | CRC[4] X^4 |
|  | 3 | CRC[3] X^3 |
|  | 2 | CRC[2] X^2 |
|  | 1 | CRC[1] X^1 |
|  | 0 | CRC[0] X^0 |
| H3 | 31 | Reserved[15] |
|  | 30 | Reserved[14] |
|  | 29 | Reserved[13] |
|  | 28 | Reserved[12] |
|  | 27 | Reserved[11] |
|  | 26 | Reserved[10] |
|  | 25 | Reserved[9] |
|  | 24 | Reserved[8] |
| H2 | 23 | Reserved[7] |
|  | 22 | Reserved[6] |
|  | 21 | Reserved[5] |
|  | 20 | Reserved[4] |
|  | 19 | Reserved[3] |
|  | 18 | Reserved[2] |
|  | 17 | Reserved[1] |
|  | 16 | Reserved[0] |
| H5 | 47 | Reserved[31] |
|  | 46 | Reserved[30] |
|  | 45 | Reserved[29] |
|  | 44 | Reserved[28] |
|  | 43 | Reserved[27] |
|  | 42 | Reserved[26] |
|  | 41 | Reserved[25] |
|  | 40 | Reserved[24] |
| H4 | 39 | Reserved[23] |
|  | 38 | Reserved[22] |
|  | 37 | Reserved[21] |
|  | 36 | Reserved[20] |
|  | 35 | Reserved[19] |
|  | 34 | Reserved[18] |
|  | 33 | Reserved[17] |
|  | 32 | Reserved[16] |
| H7 | 63 | Frame Start |
|  | 62 | Frame End |
|  | 61 | Line Valid |
|  | 60 | Line Number[12] |
|  | 59 | Line Number[11] |
|  | 58 | Line Number[10] |
|  | 57 | Line Number[9] |
|  | 56 | Line Number[8] |
| H6 | 55 | Line Number[7] |
|  | 54 | Line Number[6] |
|  | 53 | Line Number[5] |
|  | 52 | Line Number[4] |
|  | 51 | Line Number[3] |
|  | 50 | Line Number[2] |
|  | 49 | Line Number[1] |
|  | 48 | Line Number[0] |

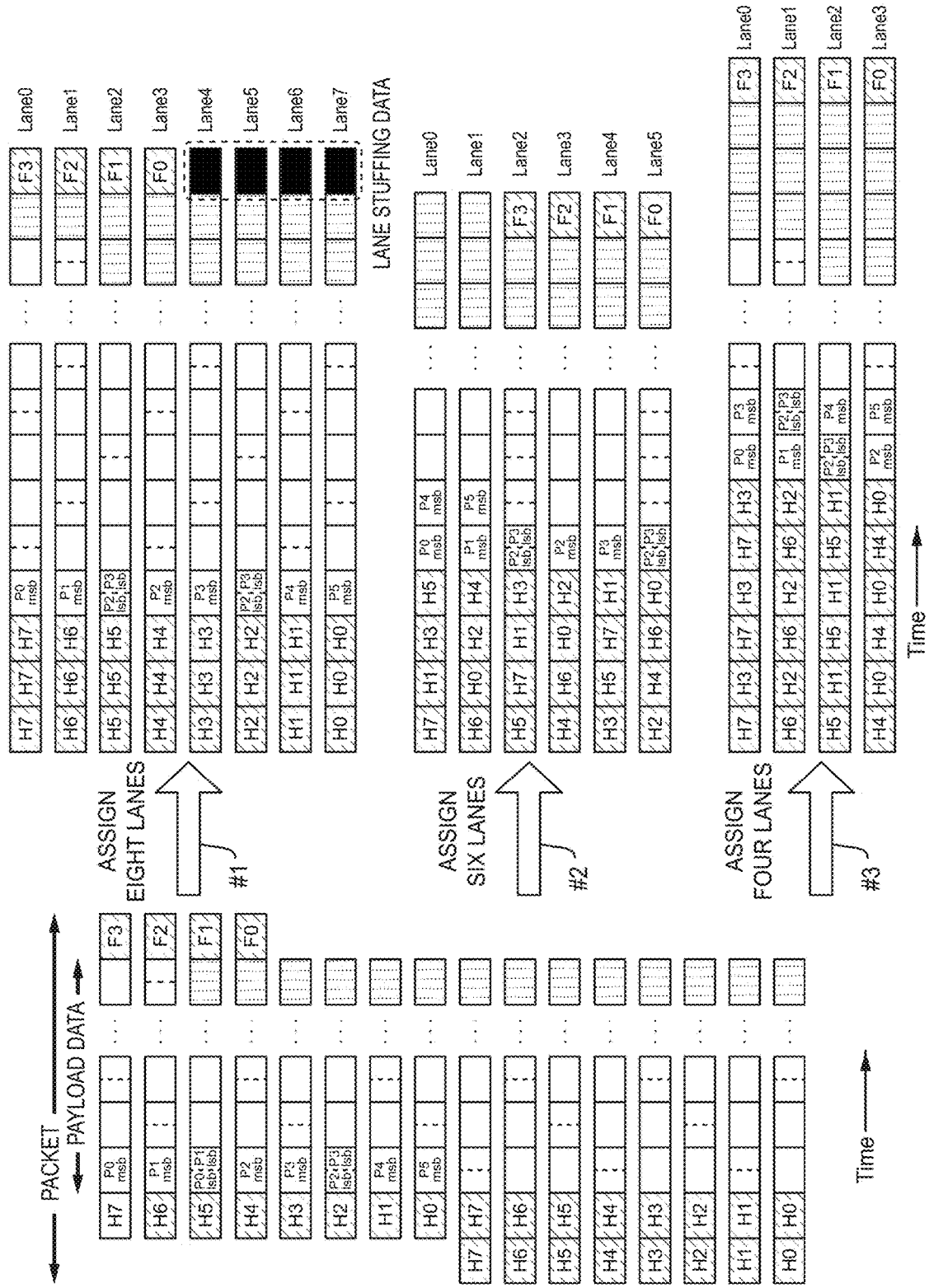

FIG. 33

| PHY CONTROL CODE | USE | 8B10B SYMBOL CONFIGURATION | | | |
|---|---|---|---|---|---|
| Idle Code | GROUP OF SYMBOLS (MARGIN PERIOD OR THE LIKE) FOR KEEP TOGGLING OUTPUT SIGNAL OTHER THAN TIME OF PACKET TRANSMISSION | D00.0 | | | |
| Start Code | INDICATES START OF PACKET (LINE/H) | K28.5 | K27.7 | K28.2 | K27.7 |
| End Code | INDICATES END OF PACKET (LINE/H) | K28.5 | K29.7 | K30.7 | K29.7 |
| Pad Code | GROUP OF Padding SYMBOLS INSERTED TO FILL DIFFERENCE BETWEEN PIXEL DATA (PAYLOAD DATA) BAND AND PHY TRANSMISSION BAND | K23.7 | K28.4 | K28.6 | K28.3 |
| Sync Code | GROUP OF SYMBOLS FOR BIT SYNCHRONIZATION AND 8B10B SYMBOL SYNCHRONIZATION OF I/F | K28.5 | Any** | ↓ | ↓ |
| Deskew Code | GROUP OF SYMBOLS USED AS MARKING FOR CORRECTING Data Skew BETWEEN LANES | K28.5 | Any** | ↓ | ↓ |
| Standby Code | GROUP OF SYMBOLS FOR NOTIFYING RX SIDE THAT TX OUTPUT BECOMES High-Z | K28.5 | Any** | ↓ | ↓ |

FIG. 34

Control Symbol

| Code | 8B<br>HGF_EDCBA | 10B abcdei_fghj | | memo |
|------|----------------|-----------------|------------------|------|
|      |                | RD−             | RD+              |      |
| K23.7 | 11110111 | 1110101000 | 0001010111 | Used in Pad Code |
| K27.7 | 11111011 | 1101101000 | 0010010111 | Used in Start Code |
| K28.0 | 00011100 | 0011110100 | 1100001011 | Reserved |
| K28.1 | 00111100 | 0011111001 | 1100000110 | Reserved |
| K28.2 | 01011100 | 0011110101 | 1100001010 | Used in Start Code |
| K28.3 | 01111100 | 0011110011 | 1100001100 | Used in Pad Code |
| K28.4 | 10011100 | 0011110010 | 1100001101 | Used in Pad Code |
| K28.5 | 10111100 | 0011111010 | 1100000101 | Comma Character |
| K28.6 | 11011100 | 0011110110 | 1100001001 | Used in Pad Code |
| K28.7 | 11111100 | 0011111000 | 1100000111 | Reserved |
| K29.7 | 11111101 | 1011101000 | 0100010111 | Used in End Code |
| K30.7 | 11111110 | 0111101000 | 1000010111 | Used in End Code |

FIG. 46

ENCODING DEVICE, ENCODING METHOD, DECODING DEVICE, DECODING METHOD, AND PROGRAM

TECHNICAL FIELD

The present technology relates to an encoding device, an encoding method, a decoding device, a decoding method, and a program, and for example, relates to an encoding device, an encoding method, a decoding device, a decoding method, and a program that enable DC-free encoding and decoding.

BACKGROUND ART

With the increase in image quality and frame rate of image sensors, a data transmission capacity required for an interface between an image sensor and a digital signal processor (DSP) that processes an image captured by the image sensor has increased.

As a standard of an interface for data transmission between chips such as between an image sensor and a DSP, there are a Mobile Industry Processor Interface (MIPI) standard and a Scalable Low Voltage Signaling-Embedded Clock (SLVS-EC) standard.

Patent Document 1 describes a transmission method in which packets storing image data are distributed to a plurality of lanes and data is transmitted from an image sensor to a DSP via the plurality of lanes. In this transmission method, image data constituting each line of one frame is stored in each packet in the image sensor and transmitted to the DSP.

CITATION LIST

Patent Document

Patent Document 1: Japanese Patent Application Laid-Open No. 2012-120159

SUMMARY OF THE INVENTION

Problems to be Solved by the Invention

In data transmission between chips, an encoding method such as an 8b/10b encoding method, a 64b/66b encoding method, or a 64b/67b encoding method is used, and decoding is performed by a decoding method corresponding to the encoding method. According to the 8b/10b encoding method, there is a possibility that transmission efficiency is reduced. Furthermore, there is a possibility that the DC free is not achieved by the 64b/66b encoding method. According to the 64b/67b encoding method, a run length is deteriorated, and there is a possibility that accurate decoding cannot be performed on the reception side.

The present technology has been made in view of such a situation, and is intended to enable encoding and decoding with a running disparity and a run length controlled without deteriorating transmission efficiency.

Solutions to Problems

An encoding device according to one aspect of the present technology includes a scrambling unit that scrambles an input data string, a calculation unit that calculates a first running disparity of the data string scrambled by the scrambling unit, a determination unit that determines whether or not to invert the data string scrambled by the scrambling unit on the basis of the first running disparity calculated by the calculation unit and a second running disparity calculated at a time point before the first running disparity, and an addition unit that inverts or non-inverts the data string scrambled by the scrambling unit on the basis of a determination result by the determination unit, adds a flag indicating the determination result, and outputs the data string.

An encoding method according to one aspect of the present technology includes, by an encoding device, scrambling an input data string, calculating a first running disparity of the scrambled data string, determining whether or not to invert the scrambled data string on the basis of the calculated first running disparity and a second running disparity calculated at a time point before the first running disparity, and inverting or non-inverting the scrambled data string on the basis of a determination result, adding a flag indicating the determination result, and outputting the data string.

A first program according to one aspect of the present technology causes a computer that controls an encoding device to execute processing including scrambling an input data string, calculating a first running disparity of the scrambled data string, determining whether or not to invert the scrambled data string on the basis of the calculated first running disparity and a second running disparity calculated at a time point before the first running disparity, and inverting or non-inverting the scrambled data string on the basis of a determination result, adding a flag indicating the determination result, and outputting the data string.

A decoding device according to one aspect of the present technology includes a determination unit that refers to a flag added to an input data string and determines whether or not the data string has been inverted, an output unit that inverts and outputs the input data string in a case where the determination unit determines that the data string has been inverted, and outputs the input data string without inversion in a case where the determination unit determines that the data string has not been inverted, and a descrambling unit that descrambles the data string output by the output unit.

A decoding method according to one aspect of the present technology, a decoding method including, by a decoding device, referring to a flag added to an input data string and determining whether or not the data string has been inverted, inverting and outputting the input data string in a case where the data string is determined to have been inverted, and outputting the input data string without inversion in a case where the data string is determined to have not been inverted, and descrambling the data string output.

A second program according to one aspect of the present technology causes a computer that controls a decoding device to execute processing including referring to a flag added to an input data string and determining whether or not the data string has been inverted, inverting and outputting the input data string in a case where the data string is determined to have been inverted, and outputting the input data string without inversion in a case where the data string is determined to have not been inverted, and descrambling the data string output.

In the encoding device, the encoding method, and the first program according to one aspect of the present technology, an input data string is scrambled, a first running disparity of the scrambled data string is calculated, whether or not to invert the data string is determined on the basis of the calculated first running disparity and a second running disparity calculated at a time point before the first running disparity, and the data string is inverted or non-inverted on the basis of a determination result, a flag indicating the determination result is added, and the data string is output.

In the decoding device, the decoding method, and the second program according to one aspect of the present technology, a flag added to an input data string is referred to and whether or not the data string has been inverted is determined, the input data string is inverted and output in a case where the data string is determined to have been inverted, and the input data string is output without inversion in a case where the data string is determined to have not been inverted, and the data string output is descrambled.

Note that the encoding device or the decoding device may be an independent device or an internal block constituting one device.

Furthermore, the program can be provided by transmitting via a transmission medium or by recording on a recording medium.

BRIEF DESCRIPTION OF DRAWINGS

FIG. 6 is a diagram for describing a flag.

FIG. 7 is a diagram for describing a relationship between the running disparity and the flag.

FIG. 19 is a diagram depicting content and an information amount of header information.

FIG. 20 is a diagram depicting an example of a bit array.

FIG. 32 is a diagram depicting an example of assignment of packet data.

FIG. 33 is a diagram depicting an example of control codes.

FIG. 34 is a diagram depicting values of K Character.

FIG. 46 is a diagram depicting an example of a conversion table.

MODE FOR CARRYING OUT THE INVENTION

Hereinafter, modes for carrying out the present technology (hereinafter referred to as embodiments) will be described.

<System Configuration Example>

Figure 1:
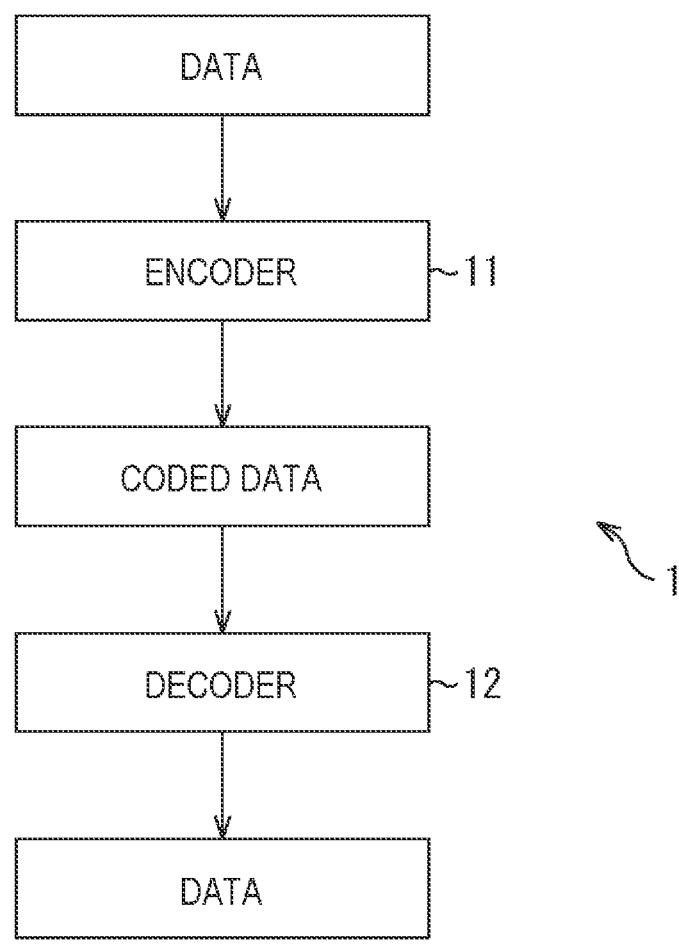
FIG. 1 is a diagram depicting a configuration of one embodiment of a data processing system to which the present technology is applied.

FIG. 1 is a diagram depicting a configuration example of a data processing system to which the present technology is applied. A data processing system 1 includes an encoder (encoding device) 11 that encodes data and a decoder (decoding device) 12 that decodes (combines) the coded data.

Before describing an encoding method and a decoding method to which the present technology is applied, an example of a conventional encoding method will be described. As a conventional encoding method, there is an 8b/10b encoding method. The 8b/10b encoding method is a method of encoding eight-bit data into 10-bit data, and by embedding a clock in serial data, transfer of the data and the clock is performed by the same wiring.

However, since eight bits are converted into 10 bits, the band is lost by 20%. Accordingly, a 64b/66b encoding method has also been proposed, and the 64b/66b encoding method executes a similar operation by a method different from the 8b/10b encoding method. The 64b/66b encoding method uses a technology called scrambling instead of a code table used in the 8b/10b encoding method.

With scrambling, patterns of 0 and 1 of coded data are randomized by frequent shifts, and 0 and 1 are controlled not to be continuous with high probability. Even the coded data randomized as described above can be restored again on the reception side. With such scrambling, output data is randomized, and the DC balance is balanced.

64b/66b does not guarantee full DC free since running disparity, which is a cumulative value of 0 or 1, is not controlled. As an encoding method for controlling the running disparity, a 64b/67b encoding method has also been proposed. According to the 64b/67b encoding method, the running disparity is controlled, but a run length generated by continuation of 0 or 1 may not be controlled.

Thus, in both the 64b/66b encoding method and the 64b/67b encoding method, the running disparity and the run length may be deteriorated depending on a data sequence to be transmitted, and there is a possibility that clock reproduction performance on the reception side (decoding side) is adversely affected. Furthermore, according to the 64b/67b encoding method, three-bit data is required as control data for 64 bits of data to be transmitted, and thus transmission efficiency deteriorates.

Accordingly, an encoding method to which the present technology described below is applied and that is DC-free, controls the running disparity, also controls the run length, and suppresses deterioration of transmission efficiency will be described. Furthermore, a decoding method for decoding data encoded by such an encoding method will also be appropriately described.

Figure 2:
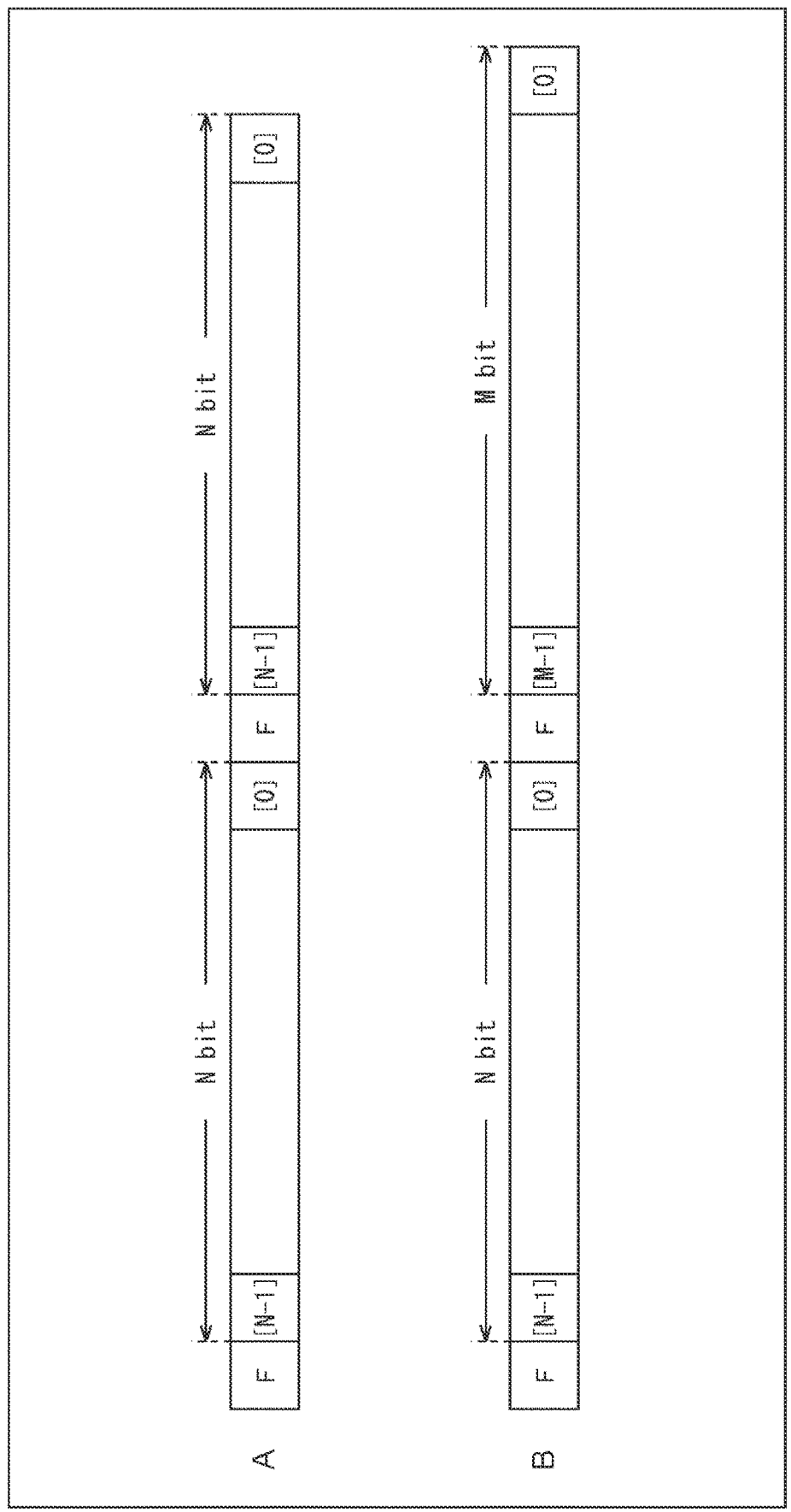
FIG. 2 is a diagram for describing the bit depth to be divided.

The encoder 11 to which the present technology is applied converts an input data string into a data string as depicted in FIG. 2. As depicted in A of FIG. 2, the encoder 11 divides the input data string into N-bit data strings, and adds a one-bit flag to the beginning of each N-bit data string.

Alternatively, as depicted in B of FIG. 2, the encoder 11 divides the input data into N-bit and M-bit data strings, adds a one-bit flag to the beginning of the N-bit data string, and adds a one-bit flag to the beginning of the M-bit data string.

In the following description, an N-bit or M-bit data string is described as one block. Furthermore, a (N+1)-bit data string in which a one-bit flag is added to the N-bit data string is also appropriately described as one block. Similarly, a (M+1)-bit data string in which a one-bit flag is added to the M-bit data string is also appropriately described as one block.

The encoder 11 may perform encoding to divide the input data into the same bit depth as depicted in A of FIG. 2, or may perform encoding to divide the input data into different numbers of bits as depicted in B of FIG. 2.

N and M are odd numbers. Since the one-bit flag is added to the N bits, the (N+1) bits are an even number. Furthermore, the (M+1) bits are also an even number. In this manner, N or M is set such that one block including the flag has even bits.

In the following description, an example in which the input data string is divided into N bits and M bits as depicted in B of FIG. 2 will be mainly described as an example, but the present embodiment described below can also be applied to a case where the input data string is divided into N bits as depicted in A of FIG. 2. In other words, the present embodiment can be applied even in a case where N=M.

<Configuration of Encoder>

Figure 3:
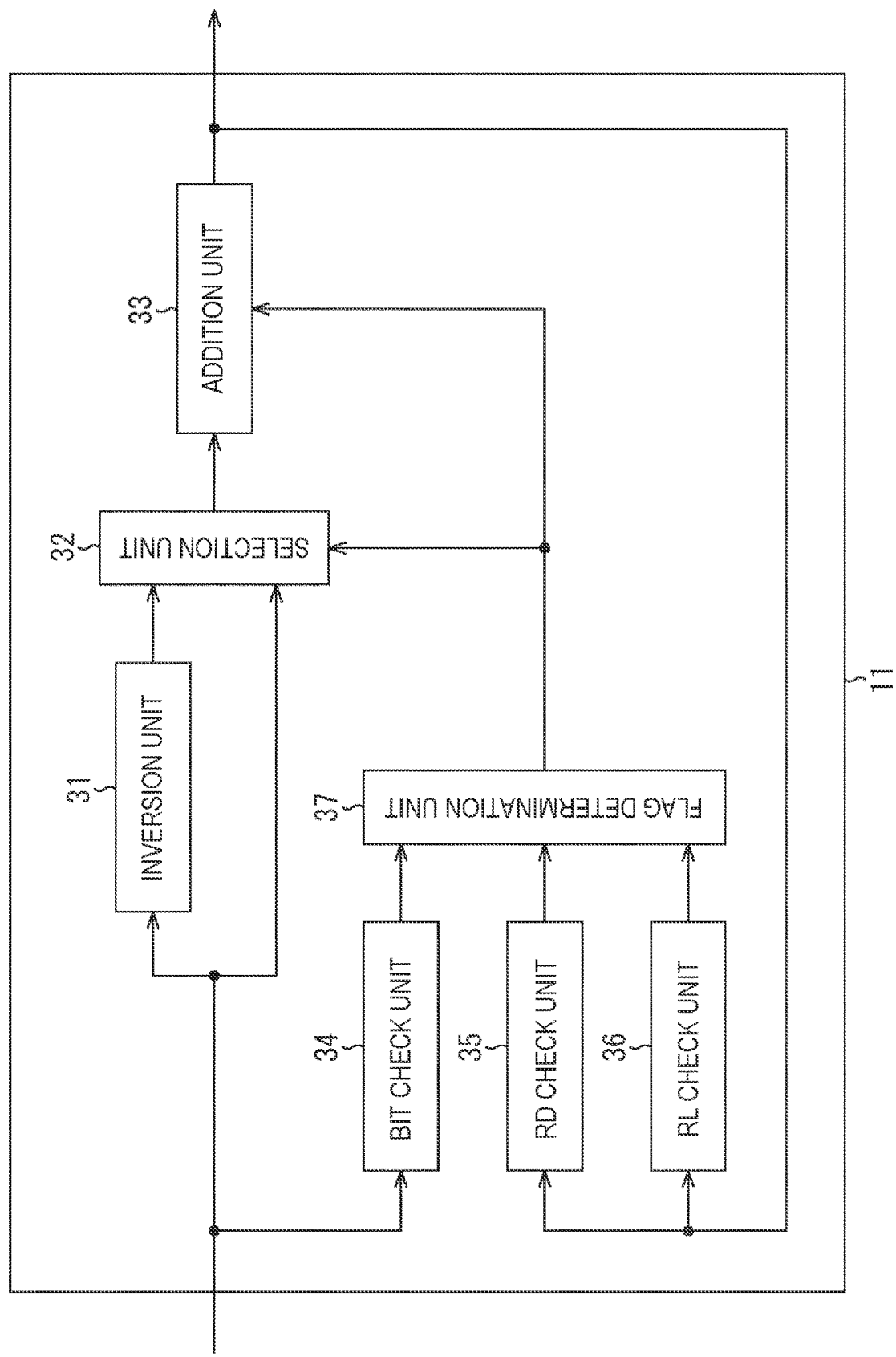
FIG. 3 is a diagram depicting a configuration example of an encoder.

FIG. 3 is a diagram depicting a configuration of the encoder 11. The encoder 11 includes an inversion unit 31, a selection unit 32, an addition unit 33, a bit check unit 34, an RD check unit 35, an RL check unit 36, and a flag determination unit 37.

Data input to the encoder 11 is supplied to each of the inversion unit 31, the selection unit 32, and the bit check unit 34. The inversion unit 31 inverts the supplied data. The inversion unit 31 converts the input data into "0" in a case where the input data is "1", and converts the input data into "1" in a case where the input data is "0". The data (n-bit data string) inverted by the inversion unit 31 is supplied to the selection unit 32.

The data string itself input to the encoder 11 is also input to the selection unit 32. That is, an inverted data string and a non-inverted data string are input to the selection unit 32. The selection unit 32 supplies either the inverted data string or an undetermined data string to the addition unit 33 according to a determination result from the flag determination unit 37.

The addition unit 33 adds the flag supplied from the flag determination unit 37 to the data string output from the selection unit 32. For example, in a case where the N-bit data string is output from the selection unit 32, the one-bit flag is added, and an (N+1)-bit data string is output. The flag is a flag indicating whether or not the data is inverted. In the following description, it is assumed that the flag in a case where the data is inverted is "1" and the flag in a case where the data is not inverted is "0", but setting other flags is also within the scope of application of the present technology.

The bit check unit 34 checks the input data string. The bit check unit 34 monitors the running disparity (hereinafter described as RD) and the run length (hereinafter described as RL) of the input data string.

The bit check unit 34 assigns "1" in a case where the input data is "1", assigns "−1" in a case where the input data is "0", and sets a value obtained by cumulatively adding the assigned numerical values as the cumulative value RD. Furthermore, the bit check unit 34 manages the number of times RL that the "1" of the input data is continuous and the number of times RL that the "0" is continuous.

The bit check unit 34 functions as a calculation unit that calculates a running disparity and a run length of input data.

The RD check unit 35 checks the past cumulative value RD. The RL check unit 36 checks the past number of times RL. The RD check unit 35 and the RL check unit 36 check the cumulative value RD and the number of times RL in the data string at a time point before the data string checked by the bit check unit 34.

The flag determination unit 37 determines whether or not to invert the data string using check results from the bit check unit 34, the RD check unit 35, and the RL check unit 36, and generates a corresponding flag. Although details will be described later, the flag determination unit 37 determines whether or not to invert the data string by using the cumulative value RD and the number of times RL of the data string currently processed, and the cumulative value RD and the number of times RL of the past data string.

The flag determination unit 37 generates data of "1" as the flag in a case where it is determined to invert the data or generates data of "0" as the flag in a case where it is determined not to invert the data, and supplies the data to the selection unit 32 and the addition unit 33.

In a case where the flag of "1" is supplied, the selection unit 32 outputs the data string supplied from the inversion unit 31 to the addition unit 33, and the addition unit 33 adds the flag of "1" to the data string. Furthermore, in a case where the flag of "0" is supplied, the selection unit 32 outputs a non-inverted data string input to the encoder 11 to the addition unit 33, and the addition unit 33 adds the flag of "0" to the data string.

<Configuration of Decoder>

Figure 4:
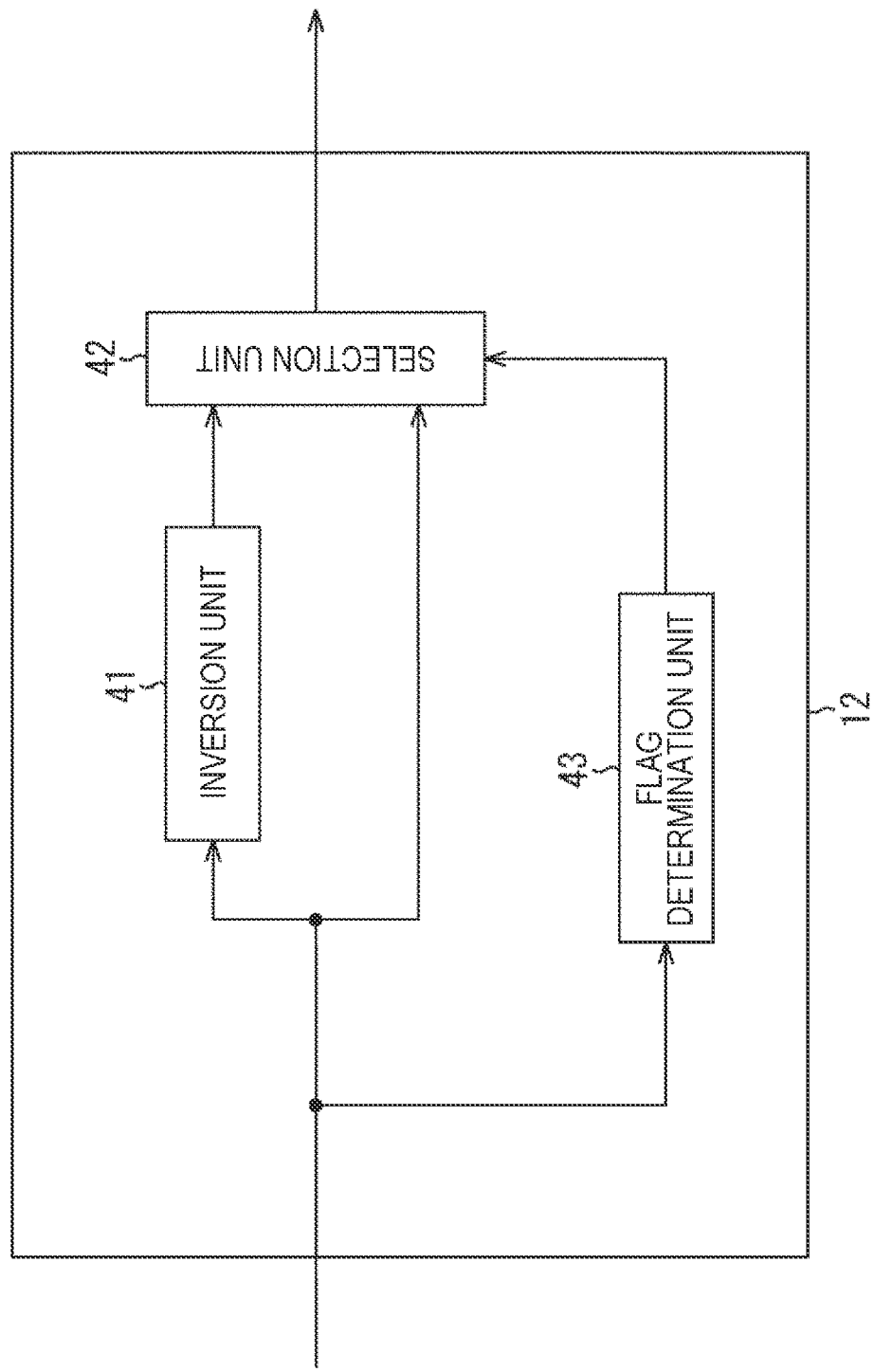
FIG. 4 is a diagram depicting a configuration example of a decoder.

FIG. 4 is a diagram depicting a configuration of the decoder 12. The decoder 12 includes an inversion unit 41, a selection unit 42, and a flag determination unit 43.

Data input to the decoder 12 is supplied to each of the inversion unit 41, the selection unit 42, and the flag determination unit 43. The inversion unit 41 inverts the supplied data and supplies the inverted data to the selection unit 42. A non-inverted data string input to the decoder 12 is also input to the selection unit 42.

The flag determination unit 43 refers to the one-bit flag included in the data string input to the decoder 12, and in a case where the flag indicates inversion, in this case, in a case where it is "1", the flag determination unit 43 instructs the selection unit 42 to select and output the data string from the inversion unit 41. Furthermore, the flag determination unit 43 refers to the one-bit flag included in the data string input to the decoder 12, and in a case where the flag indicates non-inversion, in this case, in a case where it is "0", the flag determination unit 43 instructs the selection unit 42 to select and output the data string input without passing through the inversion unit 41.

In this manner, the encoder 11 adds the one-bit flag to the data string, and the decoder 12 performs a process of determining whether or not the data string is inverted with reference to the flag. On the encoder 11 side, in a case where data to be encoded is N bits, the one-bit flag is added and the data is converted into a (N+1)-bit data string, but since only one bit is added, encoding in which deterioration of transmission efficiency is suppressed can be performed.

Furthermore, on the encoder 11 side, the running disparity (RD) and the run length (RL) are monitored, and encoding based on the monitored running disparity and the run length is performed, so that encoding with the running disparity and the run length controlled can be performed.

Furthermore, decoding according to the encoding performed on the encoder 11 side can be performed on the decoder 12 side. Also on the decoder 12 side, it is possible to decode data encoded on the basis of the running disparity and the run length, and perform decoding in which deterioration of transmission efficiency is suppressed.

<Control of Running Disparity>

In the encoder 11, the running disparity (RD) is monitored by the bit check unit 34 and the RD check unit 35, and is configured so that a flag according to the running disparity is set. Here, control of the running disparity will be described.

Figure 5:
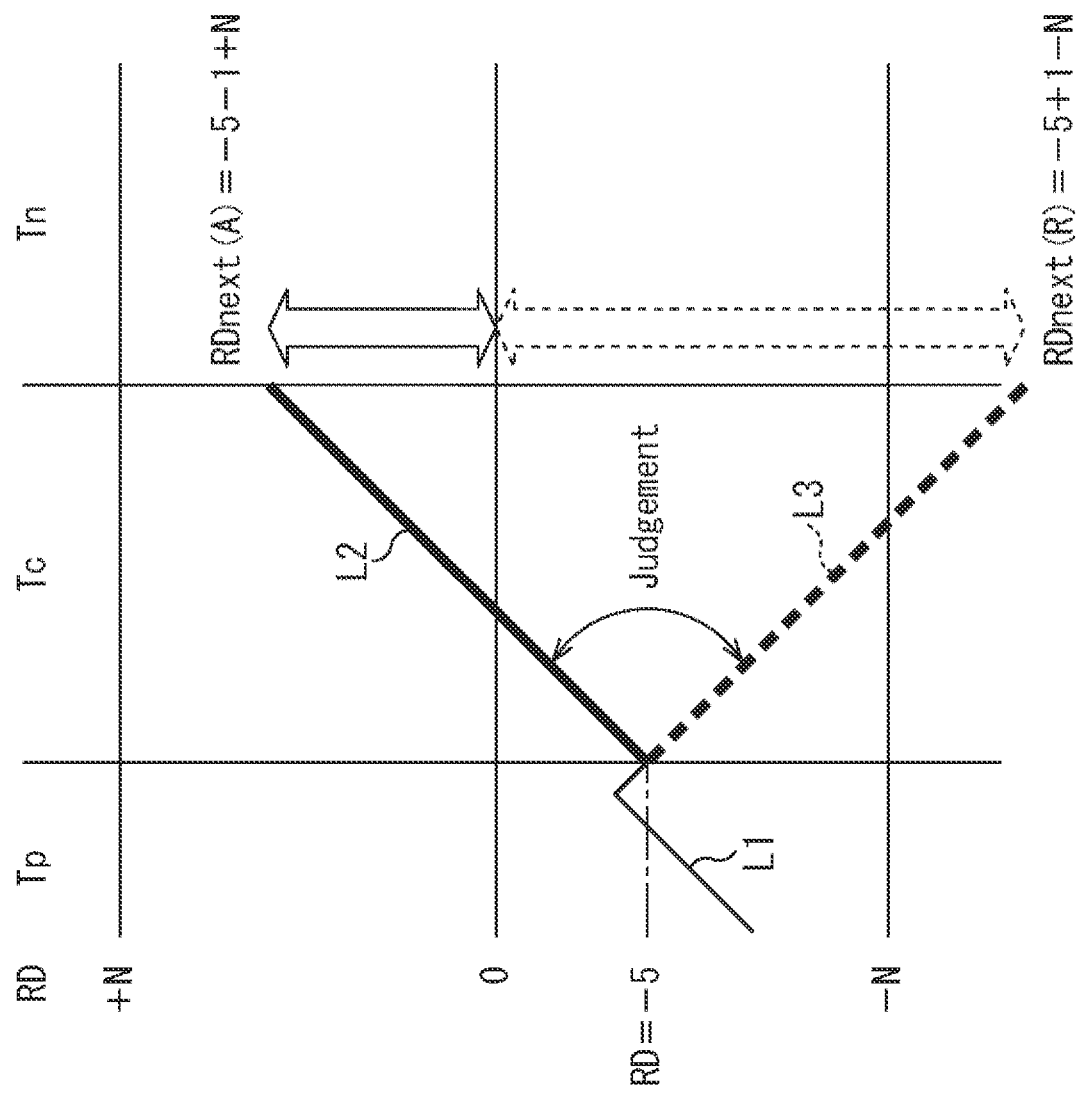
FIG. 5 is a diagram for describing control of a running disparity.

The graph depicted in FIG. 5 is a diagram for describing the control of the running disparity. Time Tc represents time at present (during processing), time Tp represents time before the time Tc, and time Tn represents time after the time Tc.

The bit check unit 34 (FIG. 3) calculates the cumulative value RD of the data string being processed at the time Tc. The RD check unit 35 (FIG. 3) refers to the cumulative value RD of the data string processed until time before the time Tc, in this case, at the time Tp. The cumulative value RD is a value calculated as "1" in a case where the data is "1" and as "−1" in a case where the data is "0" after the process in the encoder 11 is started.

A case where an N-bit data string is processed at the time Tc will be described as an example. In other words, as depicted in A of FIG. 2, a case will be described as an example where the encoder 11 divides the input data into every N bits and adds the one-bit flag to generate a data string with one block being (N+1) bits.

In the graph depicted in FIG. 5, a graph L1 depicted by a thin line represents a change in the cumulative value RD at the time Tp. It is assumed that the cumulative value RD at the time point when the time Tp ends (the time point when the time Tc starts) is RD=(−5).

It is assumed that all N-bit data strings to be processed at the time Tc are "1". In a case where all the N-bit data strings to be processed at the time Tc are "1", as in a graph L2 indicated by a thick line in FIG. 5, it is a graph in which the cumulative value RD rises straight from (−5) as a start point. In this case, since the data is not inverted, the flag is "0". Thus, the cumulative value RDnext(A) at the time point when the time Tc ends (the time point when the time Tn starts) is a value obtained by adding the cumulative value RD at the time point when the time Tp ends and the cumulative value RD calculated in the time Tc.

The value obtained by adding the cumulative value RD calculated in the time Tc is N because all the N bits are "1". Since "0" of the flag is included in the cumulative value RDnext(A) as "−1", the cumulative value RDnext(A) is the following value.

$$\text{Cumulative value RD}next(A)=(-5)+(-1)+N$$

The running disparity of the N-bit data string to be processed is N. The cumulative value RDnext(A) described above is a value obtained by adding the running disparity calculated at the current time point to the running disparity calculated up to the previous time point.

In a case where all the N-bit data strings to be processed in the time Tc are "1" and all the data are inverted, all the N-bit data strings are "0", and it is a graph in which the cumulative value RD falls straight with (−5) as a start point, as in a graph L3 indicated by a dotted line in FIG. 5. In this case, since the data is inverted, the flag is "1". The flag of "1" is set to "1" when the cumulative value RD is calculated, and this value is also included in the cumulative value RDnext (R).

The cumulative value RDnext(R) is the following value.

Cumulative value RDnext=(−5)+1+(−$N$)

The running disparity of the N-bit data string when the N-bit data string to be processed has been inverted is −N. The cumulative value RDnext(R) described above is a value obtained by subtracting the running disparity calculated at the current time point from the running disparity calculated up to the previous time point.

Ideally, the running disparity is 0 (RD=0). The running disparity is 0 in a state in which the numbers of appearances of "0" and "1" as data are the same and DC balance is achieved.

In order to control the running disparity to be a value close to 0, the encoder 11 is configured to compare the cumulative value RD in a case where the data is inverted with the cumulative value RD in a case where the data is not to be inverted, and employ the cumulative value RD closer to RD=0.

That is, in this case, the absolute value of the cumulative value RDnext(A) is compared with the absolute value of the cumulative value RDnext(R), and the value closer to 0 is employed. In the example depicted in FIG. 5, since the cumulative value RDnext(A) is closer to RD=0 than the cumulative value RDnext(R), the cumulative value RDnext(A) is employed. Since the cumulative value RDnext(A) is a case where the data is not to be inverted, "0" is set as the flag in this case.

The bit check unit 34 (FIG. 3) of the encoder 11 executes a process at the time Tc. That is, the bit check unit 34 calculates the cumulative value RD of the input N-bit data string. For example, the bit check unit 34 executes a process of creating the graph L2 of FIG. 5.

The RD check unit 35 (FIG. 3) of the encoder 11 executes a process at the time Tp. As depicted in FIG. 3, a data string including the flag output from the addition unit 33 is input to the RD check unit 35. The data string output from the addition unit 33 is an inverted data string or a non-inverted data string. That is, a data string to be transmitted to the decoder 12 side is input to the RD check unit 35.

The RD check unit 35 calculates the cumulative value RD of the input data string in the same manner as the bit check unit 34. For example, the RD check unit 35 executes a process of creating the graph L1 of FIG. 5.

As described with reference to FIG. 5, the flag determination unit 37 (FIG. 3) compares the cumulative value RDnext(A) with the cumulative value RDnext(R), determines the cumulative value closer to 0, and generates a flag corresponding to the cumulative value. For example, the flag determination unit 37 makes a determination on the basis of a determination table depicted in FIG. 6 and generates the flag.

Referring to the determination table of FIG. 6, the determination table is a table in which the cumulative value RD in the time Tc (current time point) (hereinafter described as a cumulative value RDc), the cumulative value in the time Tp (past) (hereinafter described as a cumulative value RDp), and the flag are associated.

The determination table of FIG. 6 is a table for determining whether or not to invert the data at the time Tc (current time point). Thus, the cumulative value RDp is a cumulative value including the flag at the time point in the time Tp (past), in other words, at the time point when switching from the time Tp to the time Tc. The cumulative value RDc is a cumulative value when the time Tc ends, and is a value not including a flag.

The cumulative value RDc is classified into a case where the cumulative value RDc is positive (cumulative value RDc>0), a case where the cumulative value RDc is zero (cumulative value RDc=0), and a case where the cumulative value RDc is negative (cumulative value RDc<0). That is, whether the cumulative value RDc supplied from the bit check unit 34 is positive, 0, or negative is set as one factor of flag setting.

Furthermore, referring to the determination table of FIG. 6, the cumulative value RDp is also classified into a case where the cumulative value RDp is positive (cumulative value RDp>0), a case where the cumulative value RDp is zero (cumulative value RDp=0), and a case where the cumulative value RDp is negative (cumulative value RDp<0). That is, whether the cumulative value RDp supplied from the RD check unit 35 is positive, 0, or negative is set as one factor of flag setting.

In a case where the cumulative value RDc>0 and the cumulative value RDp>0, the flag is set to "1". That is, in this case, the data is to be inverted. In a case where the cumulative value RDc>0 and the cumulative value RDp=0, the flag is set to "1". That is, in this case, the data is to be inverted. In a case where the cumulative value RDc>0 and the cumulative value RDp<0, the flag is set to "0". That is, in this case, the data is not to be inverted.

Note that, in a case where the cumulative value RDc>0 and the cumulative value RDp=0, the flag may be set to "0" and set so that the data is non to be inverted.

A case where the cumulative value RDc>0 will be described with reference to A of FIG. 7. Also in FIG. 7, as in FIG. 6, the description will be continued assuming that the cumulative value RDp is a cumulative value including the flag of the time Tp, and the cumulative value RDc is a value not including the flag of the time Tc.

In A of FIG. 7, a graph in a case where the cumulative value RDc>0 and the cumulative value RDp>0 is represented as a graph L11, a graph in a case where the cumulative value RDc>0 and the cumulative value RDp=0 is represented as a graph L12, and a graph in a case where the cumulative value RDc>0 and the cumulative value RDp<0 is represented as a graph L13. Note that the cumulative value RDp and the cumulative value RDc are two points, and a straight line passing through the two points (connecting the two points) is described as a graph.

In a case where the cumulative value RDc>0, the graphs L11 to L13 starting from the cumulative value RDp are increasing graphs (right upward graphs). That is, referring to the graph L11, in a case where the cumulative value RDp>0 is set as a start point, since the cumulative value RDc>0, the value is larger than the cumulative value RDp, and the graph proceeds in a direction away from 0. Thus, in such a case, in order to bring the cumulative value RD close to 0, the flag determination unit 37 determines to invert the data and sets "1" as the flag. It can be seen that, when the data is inverted, the graph of L11 becomes a graph going down to the right and approaches 0.

Referring to the graph L12, in a case where the cumulative value RDp=0 is set as a start point, since the cumulative value RDc>0, the value is larger than the cumulative value RDp (=0), and the graph proceeds in a direction away from 0. Thus, in such a case, in order to bring the cumulative value RD close to 0, the flag determination unit 37 determines to invert the data and sets "1" as the flag. Alternatively, in order to bring the cumulative value RD close to 0, the flag determination unit 37 may determine not to invert the data, and set "0" as the flag. In a case where the cumulative value RDp=0, the distance from 0 is the same regardless of whether the cumulative value RDp is inverted or not, and thus it may be set to determine to invert or may be set to determine not to invert the data.

In a case where the cumulative value RDc>0, that is, in a case where the cumulative value RD of the data string being processed is plus, the data string being processed is a data string including many "1". Since the value of the flag is also included in the cumulative value RD, in a case where the data string being processed is a data string including many "1", the cumulative value RD can be brought close to 0 by setting "0" as the flag. In consideration of such a situation, in a case where the cumulative value RDp=0 and the cumulative value RDc>0, "0" may be set as the flag.

Referring to the graph L13, in a case where the cumulative value RDp<0 is set as a start point, since the cumulative value is RDc>0, the value is larger than the cumulative value RDp, and the graph proceeds in a direction approaching 0 (direction from the negative region to the positive region). Thus, in such a case, in order to bring the cumulative value RD close to 0, the flag determination unit 37 determines not to invert the data and sets "0" as the flag.

The description returns to the description with reference to FIG. 6. In a case where the cumulative value RDc=0 and the cumulative value RDp>0, the flag is set to "0". That is, in this case, the data is not to be inverted. In a case where the cumulative value RDc=0 and the cumulative value RDp=0, the flag is set to "0". That is, in this case, the data is not to be inverted. In a case where the cumulative value RDc=0 and the cumulative value RDp<0, the flag is set to "1". That is, in this case, the data is not to be inverted.

Note that, in a case where the cumulative value RDc=0 and the cumulative value RDp=0, the flag may be set to "1" and the data may be set to be inverted.

A case where the cumulative value RDc=0 will be described with reference to B of FIG. 7. In B of FIG. 7, a graph in a case where the cumulative value RDc=0 and the cumulative value RDp>0 is represented as a graph L21, a graph in a case where the cumulative value RDc=0 and the cumulative value RDp=0 is represented as a graph L22, and a graph in a case where the cumulative value RDc=0 and the cumulative value RDp<0 is represented as a graph L23.

In a case where the cumulative value RDc=0, the graphs L21 to L23 starting from the cumulative value RDp are graphs in which the value does not change. That is, referring to the graph L21, in a case where the cumulative value RDp>0 is set as the start point, since the cumulative value RDc=0, the value remains to be the cumulative value RDp, and the distance from 0 is constant in the graph. Thus, in such a case, since the distance from 0 does not change regardless of whether or not the data is inverted, the flag determination unit 37 may determine not to invert the data and set "0" as the flag, or may determine to invert the data and set "1" as the flag.

Since "0" is set as the flag, "−1" is used as a value when the cumulative value RD is calculated, and thus, in a case where the cumulative value RDp>0, the value approaches 0 by −1. Here, the description will be continued assuming that "0" is set as the flag.

Referring to the graph L22, in a case where the cumulative value RDp=0 is set as a start point, since the cumulative value RDc=0, the cumulative value RDp (=0) is maintained in the graph. Thus, in such a case, since the data may or may not be inverted since the state is good, the flag determination unit 37 may determine to invert the data and set "1" as the flag, or may determine not to invert the data and set "0" as the flag.

Referring to the graph L23, in a case where the cumulative value RDp<0 is set as a start point, since the cumulative value RDc=0, the value remains to be the cumulative value RDp, and the distance from 0 is constant in the graph. Thus, in such a case, since the distance from 0 does not change regardless of whether or not the data is inverted, the flag determination unit 37 may determine not to invert the data and set "0" as the flag, or may determine to invert the data and set "1" as the flag.

Since "1" is set as the flag, "1" is used as a value when the cumulative value RD is calculated, and thus, in a case where the cumulative value RDp<0, the value approaches 0 by 1. Here, the description will be continued assuming that "1" is set as the flag.

The description returns to the description with reference to FIG. 6. In a case where the cumulative value RDc<0 and the cumulative value RDp> is 0, the flag is set to "0". That is, in this case, the data is not to be inverted. In a case where the cumulative value RDc<0 and the cumulative value RDp=0, the flag is set to "0". That is, in this case, the data is not to be inverted. In a case where the cumulative value RDc<0 and the cumulative value RDp<0, the flag is set to "1". That is, in this case, the data is to be inverted.

Note that, in a case where the cumulative value RDc<0 and the cumulative value RDp=0, the flag may be set to "1" and the data may be set to be inverted.

A case where the cumulative value RDc<0 will be described with reference to C of FIG. 7. In C of FIG. 7, a graph in a case where the cumulative value RDc<0 and the cumulative value RDp>0 is represented as a graph L31, a graph in a case where the cumulative value RDc<0 and the cumulative value RDp=0 is represented as a graph L32, and a graph in a case where the cumulative value RDc<0 and the cumulative value RDp<0 is represented as a graph L33.

In a case where the cumulative value RDc<0, the graphs L31 to L33 starting from the cumulative value RDp are decreasing graphs (right downward graphs). That is, referring to the graph L31, in a case where the cumulative value RDp>0 is set as the start point, since the cumulative value RDc<0, the value is smaller than the cumulative value RDp, and the graph proceeds in a direction approaching 0. Thus, in such a case, in order to bring the cumulative value RD close to 0, the flag determination unit 37 determines not to invert the data and sets "0" as the flag.

Referring to the graph L32, in a case where the cumulative value RDp=0 is set as a start point, since the cumulative value RDc<0, the value is smaller than the cumulative value RDp (=0), and the graph proceeds in a direction away from 0. Thus, in such a case, in order to bring the cumulative value RD close to 0, the flag determination unit 37 may determine not to invert the data and set "0" as the flag, or may determine to invert the data and set "1" as the flag. In a case where the cumulative value RDp=0, the distance from 0 is the same regardless of whether the cumulative value RDp is inverted or not, and thus it may be set to determine to invert or may be set to determine not to invert the data.

In a case where the cumulative value RDc<0, that is, in a case where the cumulative value RD of the data string being processed is negative, the data string being processed is a data string including many "0". Since the value of the flag is also included in the cumulative value RD, in a case where the data string being processed is a data string including many "0", the cumulative value RD can be brought close to 0 by setting "1" as the flag. In consideration of such a situation, in a case where the cumulative value RDp=0 and the cumulative value RDc<0, "1" may be set as the flag.

Referring to the graph L33, in a case where the cumulative value RDp<0 is set as a start point, since the cumulative value RDc<0, the value is smaller than the cumulative value RDp, and the graph proceeds in a direction away from 0. Thus, in such a case, in order to bring the cumulative value RD close to 0, the flag determination unit 37 determines to invert the data and sets "1" as the flag. It can be seen that, when the data is inverted, the graph of L33 becomes a graph rising to the right and approaches 0.

In this manner, the flag determination unit 37 sets the flag from the past cumulative value RD and the cumulative value RD being currently processed.

In this manner, the running disparity (RD) is monitored, and the data is inverted as necessary so that the cumulative value RD approaches 0, and thus control can be performed so as to be DC free. Furthermore, by controlling what is called a run length in which 0 is continuous or 1 is continuous as a data string, more preferable encoding and decoding can be performed.

<Control of Run Length>

The encoder 11 is configured to monitor the run length (RL) by the bit check unit 34 and the RL check unit 36, and set a flag according to the run length (changed). Here, the control of the run length will be described.

Figure 8:
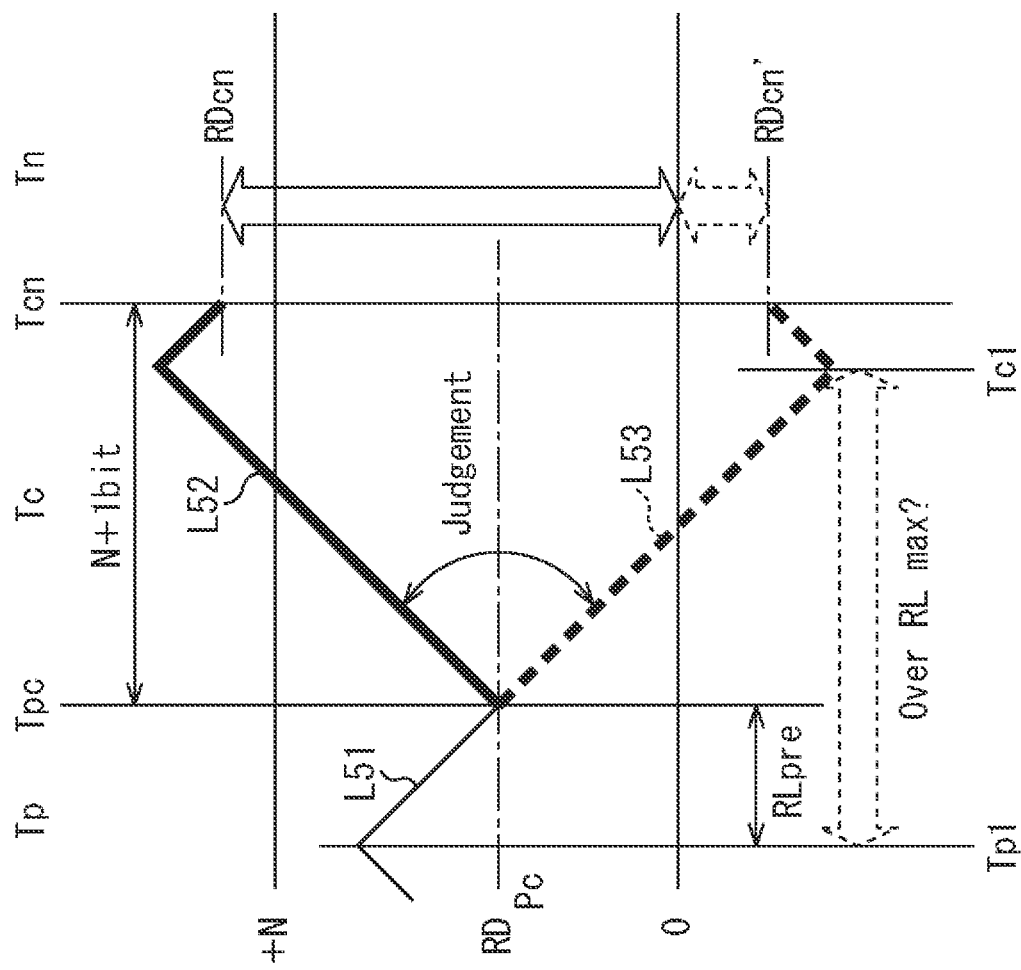
FIG. 8 is a diagram for describing control of a run length.

The graph depicted in FIG. 8 is a diagram for describing the control of the run length. Also in the graph depicted in FIG. 8, similarly to the graph depicted in FIG. 5, the time Tc represents the current (processing) time, the time Tp represents time before the time Tc, and the time Tn represents time after the time Tc.

It is assumed a case where the cumulative value RD at the time Tpc of switching from the time Tp to the time Tc is a cumulative value RDpc, and in the example depicted in FIG. 8, it is a value of the cumulative value RDpc>0. Furthermore, it is assumed a case where the cumulative value RD at the time Tp changes as in a graph L51 depicted in FIG. 8.

As depicted in a graph L52 of FIG. 8, since 1 is continuous as data, the cumulative value RD of the data string processed at the time Tc rises from the cumulative value RDpc, temporarily falls near the end of the time Tc, and finally becomes the cumulative value RDcn at time Tcn of switching from the time Tc to the time Tn.

A graph in a case where the data string processed at the time Tc is inverted is depicted as a graph L53. Since the graph L53 is a graph obtained by inverting the graph L52, 0 continues as data, the value falls from the cumulative value RDpc, temporarily rises near the end of the time Tc, and finally becomes the cumulative value RDcn' at the time Tcn of switching from the time Tc to the time Tn.

In a case where the cumulative value RD changes as depicted in FIG. 8, the cumulative value RDcn' when the data has been inverted is closer to the cumulative value RD=0 than the cumulative value RDcn when the data is not to be inverted. Thus, in a case where the running disparity RD is considered, it is determined that the data at the time Tc is inverted, and "1" is set as the flag. In other words, referring to FIG. 6 again, in a case of the data string from the graph L51 to the graph L52 depicted in FIG. 8, since RDc>0 which corresponds to RDp>0, it can be read from the table depicted in FIG. 6 that the flag is set to "1".

Here, the run length is considered. As described above, as a result of considering the running disparity RD, in a case where the data is inverted, the cumulative value RD becomes the graph L51 from the graph L53 depicted in FIG. 8. By the inversion of the data string, the graph L51 to the graph L53 have a section where the data falls straight. That is, there is a section in which 0 continues.

Referring to FIG. 8, 0 is continuous from a predetermined time (time Tp1) of the time Tp to the time Tpc. Furthermore, by inverting the data string of the time Tc, 0 continues from the time Tpc to a predetermined time (referred to as time Tc1) of the time Tc. That is, in this case, the data from the time Tp1 to the time Tc1 is 0. Moreover, in other words, data of several bits from the time Tp1 to the time Tc1 is continuous with 0.

By inverting the data in this manner, the run length may be deteriorated. For example, a maximum value of the run length is set in advance (referred to as a maximum value RLmax), and in a case where the run length is equal to or larger than (or larger than) the maximum value RLmax, the determination to invert the data in order to control the running disparity RD is reversed, and is changed to a determination not to invert the data.

In the example depicted in FIG. 8, in a case where the bit depth (run length RL) in which 0 continues from the time Tp1 to the time Tc1 is equal to or more than the maximum value RLmax, it is changed to a determination not to invert the data, and consequently, the cumulative value RD (data string) changing from the graph L51 to the graph L52 is obtained.

Thus, since the graph L51 is changed to the graph L52, deterioration of the run length, in which continuation of 0 is interrupted, is prevented at the time Tpc. In this manner, whether or not to invert data is once determined by the running disparity RD, and in a case where the data is processed according to the determination result, it is determined whether or not the run length RL is not deteriorated, and in a case where the run length RL is deteriorated, the determination by the running disparity RD is changed.

Referring again to FIG. 8. In the above description, the graph L52 has been described as a graph of the cumulative value RD of the data string currently processed. Next, a case where the graph L53 is a graph of the cumulative value RD of the data string currently processed will be described.

In a case where the graph L53 is a graph of the cumulative value RD when the data is not to be inverted, the cumulative value RD at the time Tcn when the data is not to be inverted is the cumulative value RDcn'. Furthermore, since the graph of the cumulative value RD when the data has been inverted is the graph L52, the cumulative value RD at the time Tcn when the data has been inverted is the cumulative value RDcn.

When the cumulative value RDcn' is compared with the cumulative value RDcn, a value close to the cumulative value RD=0 is the cumulative value RDcn'. Thus, in a case where the running disparity RD is considered, it is determined that the data at the time Tc is not to be inverted, and "0" is set as the flag. In other words, referring to FIG. 6 again, in a case of the data string from the graph L51 to the graph L53 depicted in FIG. 8, since RDc<0 which corresponds to RDp>0, it can be read from the table depicted in FIG. 6 that the flag is set to "0".

In a case where the data string is non-inverted, in the graph L51 to the graph L53, there is a section where the data string falls straight. That is, there is a section in which 0 continues. As in the above case, 0 is continuous from the time Tp1 to the time Tpc. Furthermore, since the data string at the time Tc is not inverted, 0 is continuous from the time Tpc to the time Tc1. That is, in this case, the data from the time Tp1 to the time Tc1 is 0. Moreover, in other words, data of several bits from the time Tp1 to the time Tc1 is continuous with 0.

Even in a case where the data is not to be inverted in this manner, the run length may be deteriorated. Also in such a case, the maximum value RLmax of the run length is set in advance, and in a case where the run length is equal to or larger than (or larger than) the maximum value RLmax, the determination not to invert the data in order to control the running disparity RD is reversed, and is changed to a determination to invert the data.

In the example depicted in FIG. 8, in a case where the bit depth (run length RL) in which 0 continues from the time Tp1 to the time Tc1 is equal to or more than the maximum value RLmax, it is changed to a determination to invert the data, and consequently, the cumulative value RD (data string) changes from the graph L51 to the graph L52.

Thus, since the graph L51 is changed to the graph L52, the continuation of 0 is interrupted at the time Tpc, and the deterioration of the run length is prevented. In this manner, whether or not to invert data is once determined by the running disparity RD, and in a case where the data is processed according to the determination result, it is determined whether or not the run length RL is not deteriorated, and in a case where the run length RL is deteriorated, the determination by the running disparity RD is changed.

In such control, since the run length RL is prioritized, the running disparity RD may be deteriorated. How much priority is given to the run length RL, in other words, the value of the maximum value RLmax can be set depending on the system. For example, in a case where the decoding capability of the decoder 12 is high, for example, in a case where decoding can be performed even if the run length RL is large, the value of the maximum value RLmax can be increased, and the priority of the run length RL can be lowered.

Here, a case where 0 is continuous has been described as an example, but a case where 1 is continuous is also processed similarly.

<Processing of Encoder>

Processing of the encoder 11 will be described with reference to a flowchart of FIG. 9.

In step S11, the encoder 11 divides the input data into N bits, and executes the processing in and after step S12 for each N bits. Here, the case of N bits will be described as an example, but the processing is similarly performed in the case of division into M bits.

In step S12, the bit check unit 34 calculates the cumulative value RD of the N-bit data string being processed.

In step S13, the flag determination unit 37 performs determination by the running disparity RD. This determination is performed as described with reference to FIGS. 5 to 7, and thus a detailed description thereof will be omitted.

In step S14, it is determined whether or not a determination result in step S13 is a determination to invert the data string. In a case where it is determined in step S14 that the determination result is to invert the data string, the processing proceeds to step S15.

In step S15, the flag is set to 1. In step S16, the data string is inverted by setting the flag to 1, and the processing proceeds to step S18.

On the other hand, in a case where it is determined in step S14 that the determination result is not to invert the data string, the processing proceeds to step S17. In step S17, the flag is set to 1, and the processing proceeds to step S18.

In step S18, determination by the run length RL is performed. This determination is performed as described with reference to FIG. 8, and thus a detailed description thereof will be omitted.

In step S19, it is determined whether or not a determination result in step S18 is to change the flag (the determination by the running disparity RD is reversed). That is, after the determination by the running disparity is performed, the determination by the run length is performed again, and the determination is maintained by the running disparity or a different determination result is output.

In a case where it is determined in step S18 that the determination result is to change the flag, the processing proceeds to step S20. In step S20, the flag is changed. For example, in a case where the flag is set to 1, the flag is changed to 0, and in a case where the flag is set to 0, the flag is changed to 1. In step S21, the data string is inverted by changing the flag, and the processing proceeds to step S22.

On the other hand, in a case where it is determined in step S18 that the determination result is that the flag is not changed, the processing proceeds to step S22.

In step S22, the running disparity RD and the run length RL in the data string of one block including the set flag are calculated. The running disparity RD and the run length RL calculated in step S22 are used as the running disparity RD and the run length RL at the time Tp described above.

In step S23, the data string (one block) including the flag is output from the encoder 11 as output data (coded data).

As described above, the encoder 11 executes an encoding process. Note that, while the example in which the input data is processed for every N-bit data has been described with the flowchart depicted in FIG. 9, as depicted in B of FIG. 2, in a case where encoding is performed with different bit depths of N bits and M bits, processing performed with N bits in FIG. 9 can be appropriately executed with M bits.

<Processing of Decoder>

Figure 10:
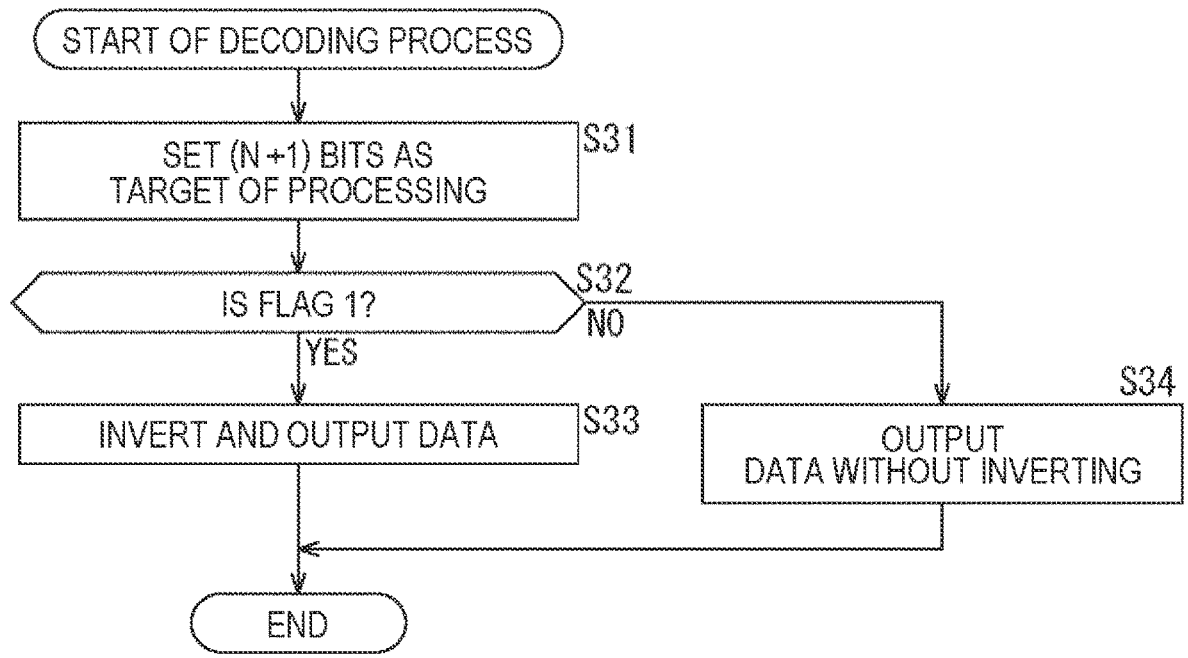
FIG. 10 is a flowchart for describing a decoding process.

Processing of the decoder 12 will be described with reference to a flowchart of FIG. 10.

In step S31, the decoder 12 sets (N+1) bits of the input coded data as a target of processing. Note that, as in B of FIG. 2, a case where the number of pieces of data of one block is (N+1) bits and a case where the number of pieces of data of one block is (M+1) bits are mixed, it is sufficient if processing is performed with (N+1) bits or (M+1) bits.

In step S32, the flag determination unit 43 refers to a one-bit flag included in one block of (N+1) bits, and determines whether or not the flag is 1, that is, whether or not the data is inverted.

In a case where it is determined in step S32 that the flag is 1, the processing proceeds to step S33. In step S33, the selection unit 42 selects inverted data input via the inversion unit 41 and outputs the data as a decoding result.

On the other hand, in a case where it is determined in step S32 that the flag is not 1, in other words, in a case where it is determined that the flag is 0 and the data is not inverted, the processing proceeds to step S34. In step S34, the selection unit 42 selects data input without passing through the inversion unit 41 and outputs the data as a decoding result.

In this manner, the decoder 12 executes a decoding process corresponding to the encoding process performed by the encoder 11.

<Error Detection in Decoder>

As described above, the encoder 11 performs control such that the running disparity RD approaches 0. By using this, an error can be detected on the decoder 12 side.

Even if the running disparity RD is controlled to be small on the encoder 11 side, for example, if an error occurs on a transmission line between the encoder 11 and the decoder 12, the running disparity RD of the data received on the decoder 12 side may increase. Data received by the decoder 12 side is decoded, the running disparity RD of the decoded data is calculated, and in a case where the calculated value increases (tends to increase), it can be determined that the received data includes an error.

Figure 11:
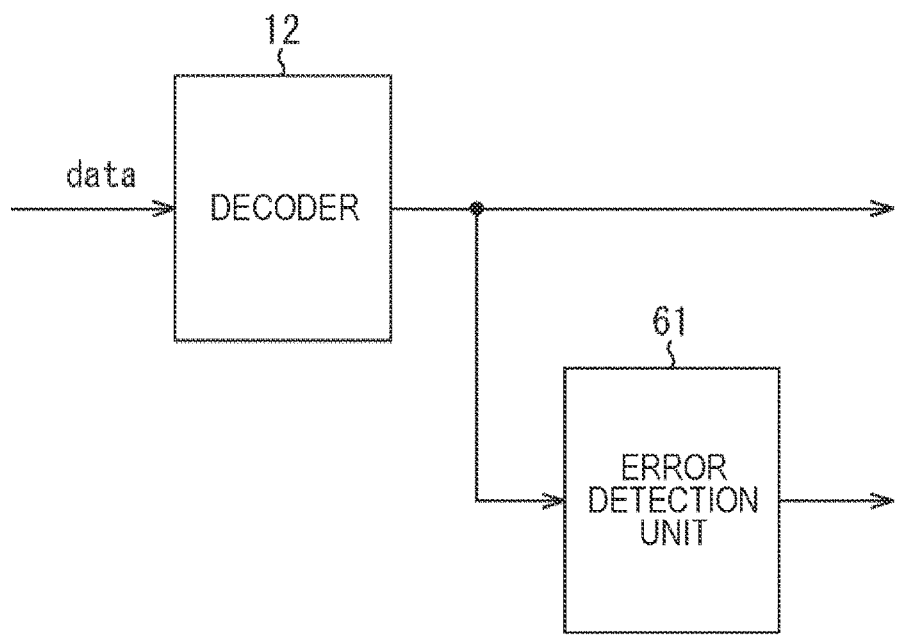
FIG. 11 is a diagram for describing a configuration of the decoder that performs error detection.

As depicted in FIG. 11, a configuration can be employed in which an output from the decoder 12 is input, the running disparity RD is calculated, and an error detection unit 61 that detects an error is provided on the decoder 12 side. An internal configuration of the decoder 12 depicted in FIG. 11 is similar to the configuration of the decoder 12 depicted in FIG. 4. Decoded data is output from the decoder 12.

The error detection unit 61 calculates the running disparity RD of data after decoding supplied from the decoder 12. In a case where the calculated running disparity RD is large, it is determined that an error has occurred, and information indicating that there is a possibility of an error is supplied to an upper layer.

The upper layer is a layer that receives the data output from the decoder 12 and performs predetermined processing. In a case where acquiring information indicating that there is a possibility of an error from the error detection unit 61, such an upper layer processes the supplied data on the assumption that there is a possibility of an error. For example, a process in which an error correction process is enhanced or a process in which data having a possibility of an error is discarded is performed.

While the error detection unit 61 determines that an error has occurred when the running disparity RD increases, for example, a predetermined threshold may be set in advance, and the error detection unit 61 may determine that an error has occurred in a case where the running disparity RD increases to be equal to or larger than the threshold. Furthermore, it is possible to compare the running disparity RD of the data being processed with the running disparity RD of the data processed before the data, and determine that an error has occurred when the difference is equal to or more than a predetermined threshold.

In this manner, the side performing decoding can also determine whether or not there is a possibility that an error is included in received data by monitoring the running disparity RD. Furthermore, it is possible to improve reliability of the received data decoded by the decoder 12 by enabling error detection on the decoding side and enabling to respond when an error occurs.

<Regarding Improvement of Flag Reliability>

As described above, the encoder 11 side is configured to invert or non-invert data, and the decoder 12 side can determine whether or not the data has been inverted by adding the flag. If an error occurs and the flag is changed when data is supplied from the encoder 11 to the decoder 12, the decoder 12 side becomes unable to correctly decode the data.

Accordingly, a mechanism for enabling the decoder 12 side to determine whether or not an error has occurred in the flag will be described.

Figure 12:
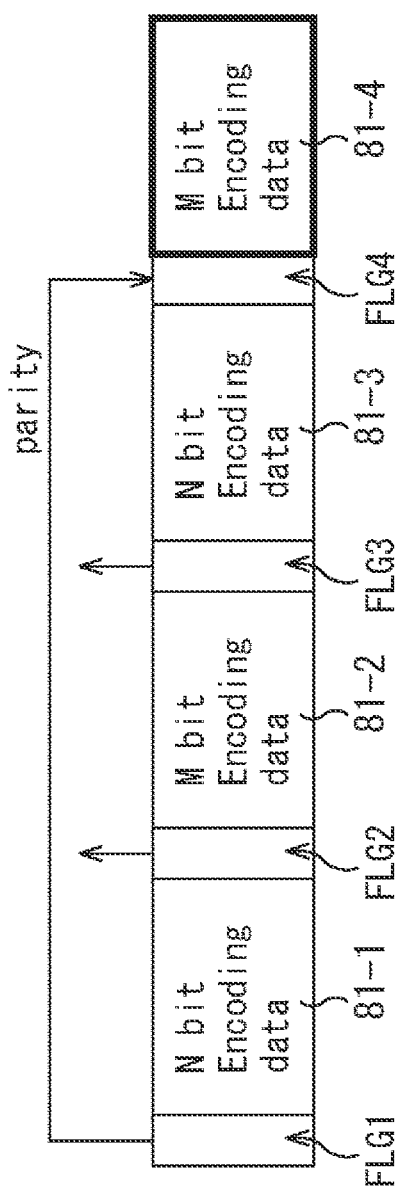
FIG. 12 is a diagram for describing setting of the flag when the error detection is performed.

In the description with reference to FIGS. 12 and 13, a case where data to be encoded is divided into an N-bit block and an M-bit block and processed as depicted in B of FIG. 2 will be described as an example. Referring to FIG. 12, the flag of an N-bit block 81-1 is FLG1, the flag of an M-bit block 81-2 is FLG2, and the flag of an N-bit block 81-3 is FLG3.

The flag of an M-bit block 81-4 is FLG4, but this FLG4 is not used as the flag indicating whether or not data of the block 81-4 is inverted. Furthermore, the data of the block 81-4 is a block on which the inversion process is not performed. In other words, the data of the block 81-4 is not a target of control of the running disparity RD or the run length RL, and is data not to be inverted.

FLG4 is a calculation result (parity) of exclusive OR (EXOR) of FLG1, FLG2, and FLG3. Unlike FLG1, FLG2, and FLG3, FLG4 is added to block 81-4 as a parity of these flags.

FLG4=FLG1 xor FLG2 xor FLG3

The reception side calculates the exclusive OR of FLG1 to FLG4, and determines that there is no error in a case where the value is 0 or determines that there is an error in a case where the value is 1.

If FLG1 xor FLG2 xor FLG3 xor FLG4=0, absence of error is determined

If FLG1 xor FLG2 xor FLG3 xor FLG4=1, presence of error is determined

In this manner, the decoder 12 (reception side) can determine whether all of FLG1, FLG2, FLG3, and FLG4 are correct or any of FLG1, FLG2, FLG3, and FLG4 is incorrect. In a case where it is determined that the flag includes an error, information indicating that there is a possibility of error is supplied to a layer higher than the decoder 12. In a case of receiving supply of information as to whether or not there is an error output from the decoder 12, the upper layer processes the supplied data on the assumption that there is a possibility of an error. For example, a process in which an error correction process is enhanced or a process in which data having a possibility of an error is discarded is performed.

The example depicted in FIG. 12 is an example in which a flag (FLG4) as one parity is included for every four blocks 81. How many blocks to include the parity may be set depending on the system, or the state of a transmission line may be monitored and appropriately changed depending on the state of the transmission line.

In a case where the number of parities is increased, there is a possibility that also in the blocks in which the running disparity RD is not controlled (blocks corresponding to the block 81-4 in the example depicted in FIG. 12), in other words, in the blocks in which data is determined to be inverted in order to prevent the running disparity RD from deteriorating, blocks processed not to be inverted increases.

In a case where the parity is set to be small, the number of uncertain flags increases when an error occurs. In a case where the flag is uncertain, the data in the block to which such a flag is added is also uncertain, and there is a possibility that the amount of data handled as an error increases.

In consideration of such a situation, the number of blocks into which parity is to be inserted may be set.

In a case where encoding is performed separately for an N bit block and an M bit block, a total of two blocks of one block of N bits and one block of M bits is set as one processing unit, and the flag of the last block of the number processing unit is set as a parity for each number processing unit. The example depicted in FIG. 12 is a case where there are two processing units. Furthermore, as depicted in A of FIG. 2, in a case where encoding is performed only in an N-bit block, at least two blocks or more are set as one processing unit, and the flag of the last block of the processing unit is set as a parity.

When the number of blocks into which the parity is to be inserted is set, the number of blocks is set in consideration of the processing unit.

Note that, in the example depicted in FIG. 12, as depicted in B of FIG. 2, the case where data to be encoded is divided into an N-bit block and an M-bit block and processed has been described as an example, but as depicted in A of FIG. 2, the present embodiment can also be applied to a case where data to be encoded is divided into N-bit blocks and processed.

Figure 13:
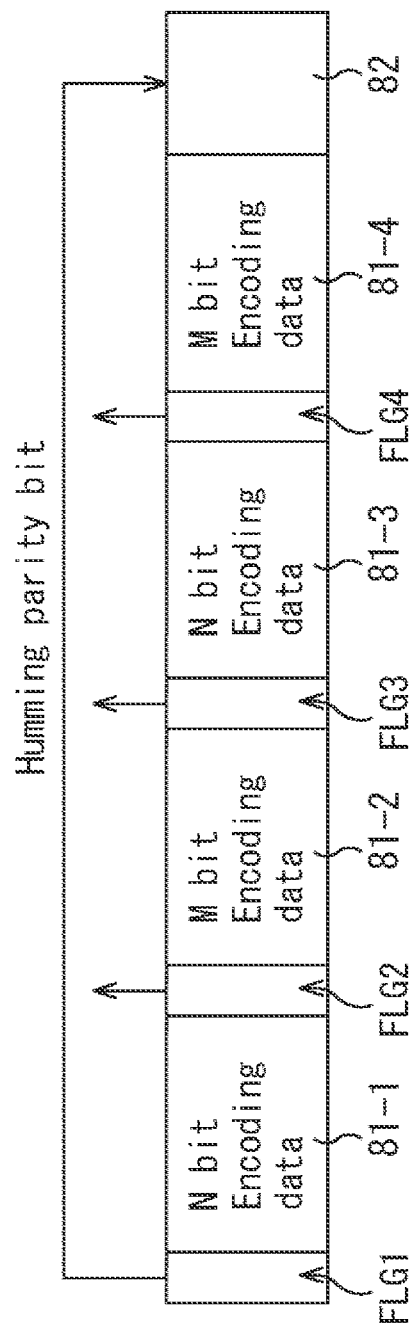
FIG. 13 is a diagram for describing setting of the flag when the error detection is performed.

FIG. 13 is a diagram depicting another configuration of data for determining whether or not there is an error in the flag. FIG. 13 also depicts an example in which data for error detection is inserted for each of the four blocks 81-1 to 81-4 as in the case depicted in FIG. 12.

In the example depicted in FIG. 13, the flag of the N-bit block 81-1 is FLG1, the flag of the M-bit block 81-2 is FLG2, the flag of the N-bit block 81-3 is FLG3, and the flag of the M-bit block 81-4 is FLG4.

The blocks 81-1 to 81-4 are sequentially encoded, and after FLG4 is added, a humming coding process is performed on FLG1 to FLG4 to calculate parity bits (humming results). This calculated parity bit 82 is added after block 81-4 and transmitted.

As depicted in FIG. 13, in a case where a parity bit 82 is added to each of the four blocks 81-1 to 81-4, a three-bit parity bit 82 is generated and added to the four bits of FLG1, FLG2, FLG3, and FLG4. At this time, as the humming code, a (7, 4, 3) humming code can be used.

The humming code mentioned here is an example, and other humming codes can also be applied. For example, a (8, 4, 4) humming code in which the four-bit parity bits 82 are generated can be applied to the four bits of FLG1, FLG2, FLG3, and FLG4, and for example, the humming code can be calculated on the basis of the following expressions.

$$P[3]=F[0]\hat{}F[1]\hat{}F[2]\hat{}F[3]\hat{}P[2]\hat{}P[1]\hat{}P[0]$$

$$P[2]=F[1]\hat{}F[2]\hat{}F[3]$$

$$P[1]=F[0]\hat{}F[2]\hat{}F[3]$$

$$P[0]=F[0]\hat{}F[1]\hat{}F[3]$$

The reception side (decoder 12) can detect whether or not there is an error in FLG1, FLG2, FLG3, and FLG4 by performing humming decoding after receiving the parity bits 82 from the blocks 81-1 to 81-4. In this case, an error of any one bit (one flag) of FLG1, FLG2, FLG3, and FLG4 can be detected and corrected by performing humming decoding.

Here, the case where the humming code and decoding are used has been described as an example, but an error correction code and decoding other than the humming code and decoding can also be applied. Furthermore, here, the case where encoding is performed separately for an N-bit block and an M-bit block has been described as an example, but the present embodiment can also be applied to a case where encoding is performed separately for only an N-bit block.

In a case where encoding is performed separately for an N bit block and an M bit block, a total of two blocks of one block of N bits and one block of M bits is set as one processing unit, and a parity bit 82 is added after the last block of the processing unit for every two or more processing units (four or more blocks). The example depicted in FIG. 12 is a case where there are two processing units. Furthermore, as depicted in A of FIG. 2, in a case where encoding is performed only in an N-bit block, at least two blocks or more are set as one processing unit, and parity bits 82 are added after the last block of the processing unit.

In a case where a large number of parity bits 82 by the humming code are input, resistance to an error can be enhanced. However, since the parity bits 82 are required to be three bits in the above example, the transmission efficiency may deteriorate as the parity bits are inserted. In consideration of such a situation, the number of blocks (the number of processing units) in which the parity bits 82 are inserted can be set depending on the system.

Note that, in the example depicted in FIG. 13, as depicted in B of FIG. 2, the case where data to be encoded is divided into an N-bit block and an M-bit block and processed has been described as an example, but as depicted in A of FIG. 2, the present embodiment can also be applied to a case where data to be encoded is divided into N-bit blocks and processed.

Furthermore, the N bits can be, for example, 32 bits. In a case where N=32 bits and every four blocks are processed as depicted in FIG. 13, a 128-bit data string is processed. In a case where a flag of one bit is added every four blocks to the 128-bit data string and the parity bits 82 are four bits, the data string becomes a 136-bit data string. That is, in this case, the 128-bit data string is converted into 136-bit data.

In this manner, the 128b/136b encoding method can also be applied to the present technology.

In this manner, it is possible to improve reliability for encoding and decoding by enabling the reception side to determine whether or not there is an error in the flag.

<Other System Configuration Examples>

Figure 14:
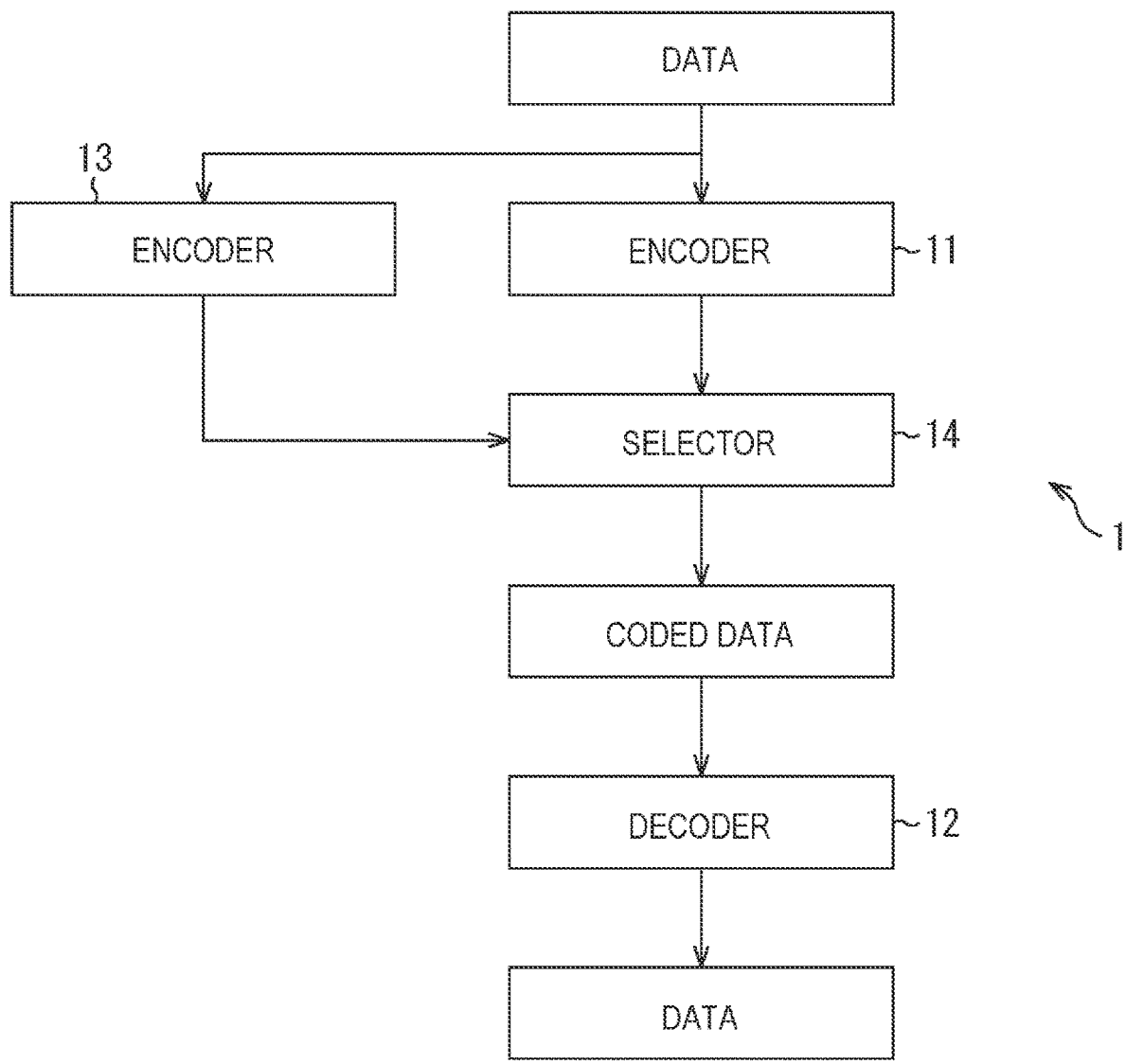
FIG. 14 is a diagram depicting a configuration of another embodiment of the data processing system to which the present technology is applied.

FIG. 14 is a diagram depicting another configuration example of the data processing system. The data processing system 1 depicted in FIG. 14 is different from the data processing system 1 depicted in FIG. 1 in that an encoder 13 and a selector 14 are added, and other parts are similar.

The data processing system 1 depicted in FIG. 14 includes the encoder 11 that performs encoding (hereinafter described as inversion encoding as appropriate) for inverting the data described above and the encoder 13 that performs encoding other than the inversion encoding. Furthermore, the selector 14 that selects whether to transmit the data string encoded by the encoder 11 or transmit the data string encoded by the encoder 13 is provided.

The encoder 13 performs encoding by applying, for example, an encoding method such as the 8b/10b encoding method, the 64b/66b encoding method, or the 64b/67b encoding method. Note that, although only one encoder 13 is depicted in FIG. 14, a plurality of encoders may be provided corresponding to these encoding methods.

The selector 14 switches and outputs the output from the encoder 11 or the output from the encoder 13. The selector 14 switches the output by a control signal supplied from an external circuit. Furthermore, the control signal may be a signal indicating an encoding method selected (set) by the user.

Note that, with the data processing system 1 depicted in FIG. 14, the example in which the selector 14 is provided at the position where coded data from the encoder 11 or the encoder 13 is selected has been described, in other words, the example in which the selector 14 is provided at the subsequent stage of the encoder 11 and the encoder 13 has been depicted, but a configuration can be employed in which the selector 14 is provided at the preceding stage of the encoder 11 and the encoder 13. That is, the selector 14 may be provided as a selection unit that selects the encoder 11 or the encoder 13 as the supply destination of input data.

Furthermore, a configuration may be employed in which the selector 14 is provided at each of a preceding stage and a subsequent stage of the encoder 11 and the encoder 13. The selector 14 provided at the preceding stage of the encoder 11 and the encoder 13 supply the input data to the encoder 11 or the encoder 13 on the basis of a control signal from the outside.

The selector 14 provided at the subsequent stage of the encoder 11 and the encoder 13 functions as the selector 14 that selects an output from the encoder 11 or the encoder 13 set as a supply destination of the input data.

In addition, a configuration can be employed in which power is not supplied to the encoder 11 or the encoder 13 that does not perform encoding, and power consumption is suppressed.

Furthermore, the encoder 11 and the decoder 12 may be provided with an adjustment unit that adds or deletes data according to an effective data amount of the input data. The added data may be, for example, a Pad Code. Note that the Pad Code is a group of symbols inserted into payload data in order to fill a difference between a pixel data band and a PHY transmission band in a case where the system depicted in FIG. 14 is applied to the SLVS-EC standard described later, for example, and can be used as data to which such data is added.

With such a configuration, it is possible to perform encoding by an encoding method corresponding to a decoding method supported by a side receiving supply of coded data, and generate and supply the coded data.

In the data processing system 1 depicted in FIG. 14, only one decoder is depicted on the decoder 12 side, but similarly to the encoder side, a configuration can be employed that includes a plurality of decoders 12, such as a decoder 12 corresponding to the encoding method of the encoder 11 and a decoder 12 corresponding to the encoding method of the encoder 13. Furthermore, a configuration can be employed that includes a selector that supplies coded data to one decoder 12 among the plurality of decoders 12 or a selector that selects decoded data from one decoder 12 among the plurality of decoders 12.

In a case where the decoding side also includes the plurality of decoders 12 and the plurality of selectors as described above, the control signal for the selector may be input from an external circuit or may be input according to setting by the user. Furthermore, when encoding is performed on the encoding side, an identifier indicating the encoding method may be added to the coded data, and the identifier may be supplied to the selector.

<SLVS-EC Standard>

The above-described encoding and decoding, in other words, the system depicted in FIG. 1 can be applied to a portion that performs encoding and decoding in the Scalable Low Voltage Signaling-Embedded Clock (SLVS-EC) standard described below. Accordingly, the SLVS-EC standard will be described below.

The SLVS-EC standard is a standard of an interface of an image sensor. A transmission method of the SLVS-EC standard is a method in which data is transmitted in a form having a clock superimposed on the transmitting side, and the clock is reproduced on the receiving side to demodulate and decode the data.

<Configuration Example of Transmission System>

Figure 15:
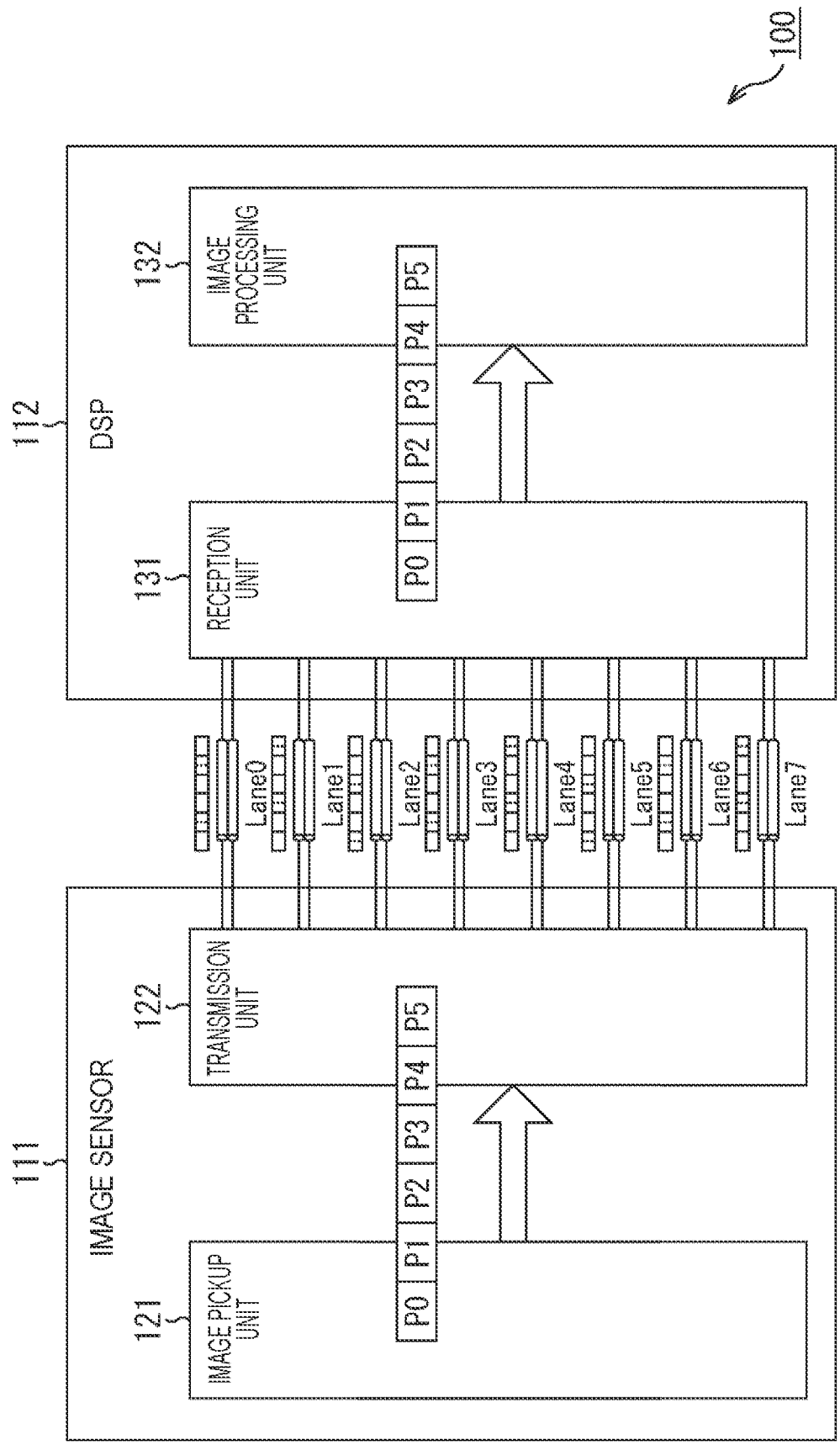
FIG. 15 is a diagram depicting a configuration example of a transmission system.

FIG. 15 is a diagram depicting a configuration example of a transmission system. The transmission system 100 in FIG. 15 includes an image sensor 111 and a DSP 112. The image sensor 111 and the DSP 112 are configured by different large scale integrated circuits (LSIs), and are provided in the same imaging device having an imaging function, such as a digital camera or a mobile phone. The image sensor 111 is provided with an image pickup unit 121 and one transmission unit 122, and the DSP 112 is provided with one reception unit 131 and one image processing unit 132.

The image pickup unit 121 of the image sensor 111 includes an imaging element such as a complementary metal oxide semiconductor (CMOS), and performs photoelectric conversion of light received via a lens. Furthermore, the image pickup unit 121 performs A/D conversion and the like of a signal obtained by the photoelectric conversion, and outputs pixel data constituting an image of one frame to the transmission unit 122 in order for every piece of data of one pixel.

The transmission unit 122 assigns data of each pixel supplied from the image pickup unit 121 to a plurality of transmission lines in the order of supply from the image pickup unit 121, for example, and transmits the data to the DSP 112 in parallel via the plurality of transmission lines. In the example of FIG. 15, pixel data is transmitted using eight transmission lines. Transmission lines between the image sensor 111 and the DSP 112 may be wired transmission lines or wireless transmission lines. Hereinafter, a transmission line between the image sensor 111 and the DSP 112 is appropriately referred to as a Lane.

The reception unit 131 of the DSP 112 receives the pixel data transmitted from the transmission unit 122 via eight lanes, and outputs data of each pixel to the image processing unit 132 in order.

The image processing unit 132 generates an image of one frame on the basis of the pixel data supplied from the reception unit 131, and performs various image processing using the generated image. The image data transmitted from the image sensor 111 to the DSP 112 is RAW data, and the image processing unit 132 performs various processes such as compression of the image data, display of the image, and recording of the image data on a recording medium.

<Frame Format>

Figure 16:
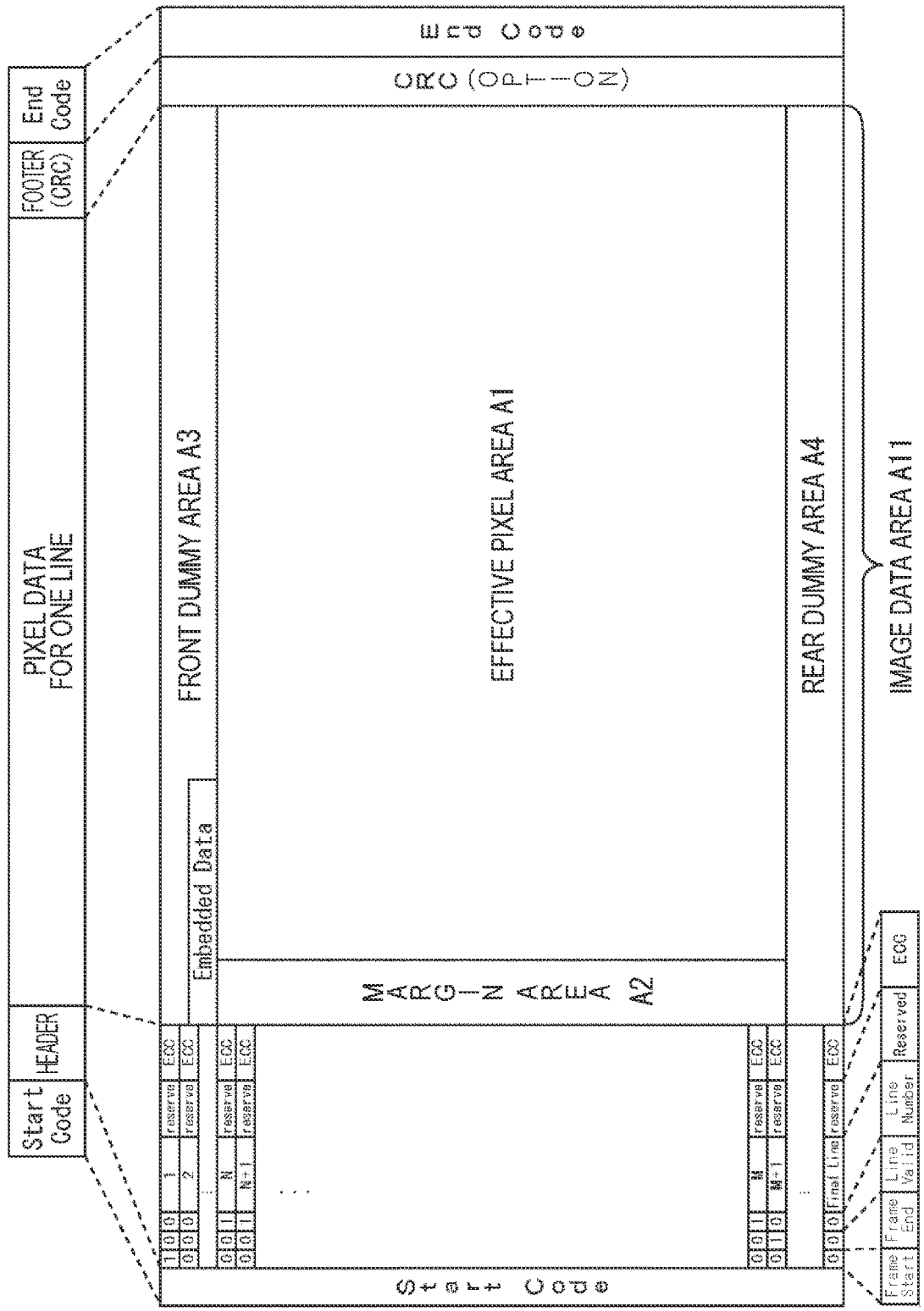
FIG. 16 is a diagram depicting an example of a frame format.

FIG. 16 is a diagram depicting an example of a format used for transmitting image data of one frame between the image sensor 111 and the DSP 112.

An effective pixel area A1 is an area of effective pixels of an image of one frame captured by the image pickup unit 121. On the left side of the effective pixel area A1, a margin area A2 is set in which the number of pixels in a vertical direction is the same as the number of pixels in the vertical direction of the effective pixel area A1.

On an upper side of the effective pixel area A1, a front dummy area A3 is set in which the number of pixels in a horizontal direction is the same as the number of pixels in the horizontal direction of the entire effective pixel area A1 and margin area A2. In the example of FIG. 16, Embedded Data is inserted in the front dummy area A3. The Embedded Data includes information regarding set values related to imaging by the image pickup unit 121, such as shutter speed, aperture value, and gain. The Embedded Data may be inserted in a rear dummy area A4.

The rear dummy area A4 is set below the effective pixel area A1 in which the number of pixels in the horizontal direction is the same as the number of pixels in the horizontal direction of the entire effective pixel area A1 and margin area A2.

An image data area A11 includes the effective pixel area A1, the margin area A2, the front dummy area A3, and the rear dummy area A4.

A header is added before each line constituting the image data area A11, and a Start Code is added before the header.

Furthermore, a footer is optionally added after each line constituting the image data area A11, and a control code as described later such as End Code is added after the footer. In a case where the footer is not added, a control code such as End Code is added after each line constituting the image data area A11.

Every time an image of one frame captured by the image pickup unit 121 is transmitted from the image sensor 111 to the DSP 112, the entire data in the format depicted in FIG. 16 is transmitted as transmission data.

An upper band in FIG. 16 depicts the structure of a packet used for transmitting transmission data depicted on a lower side. Assuming that an array of pixels in the horizontal direction is a line, data of pixels constituting one line of the image data area A11 is stored in a payload of the packet. Transmission of the entire image data of one frame is performed using the number of packets equal to or larger than the number of pixels in the vertical direction of the image data area A11.

One packet is formed by adding the header and the footer to the payload in which pixel data for one line is stored. As described in detail later, the header includes additional information of the pixel data stored in the payload, such as Frame Start, Frame End, Line Valid, Line Number, and ECC. At least the Start Code and the End Code that are control codes are added to each packet.

Thus, by employing the format in which the pixel data constituting an image of one frame is transmitted for every line, additional information such as the header and control codes such as the Start Code and the End Code can be transmitted during a blanking period of every line.
<Configurations of Transmission Unit 122 and Reception Unit 131>

Figure 17:
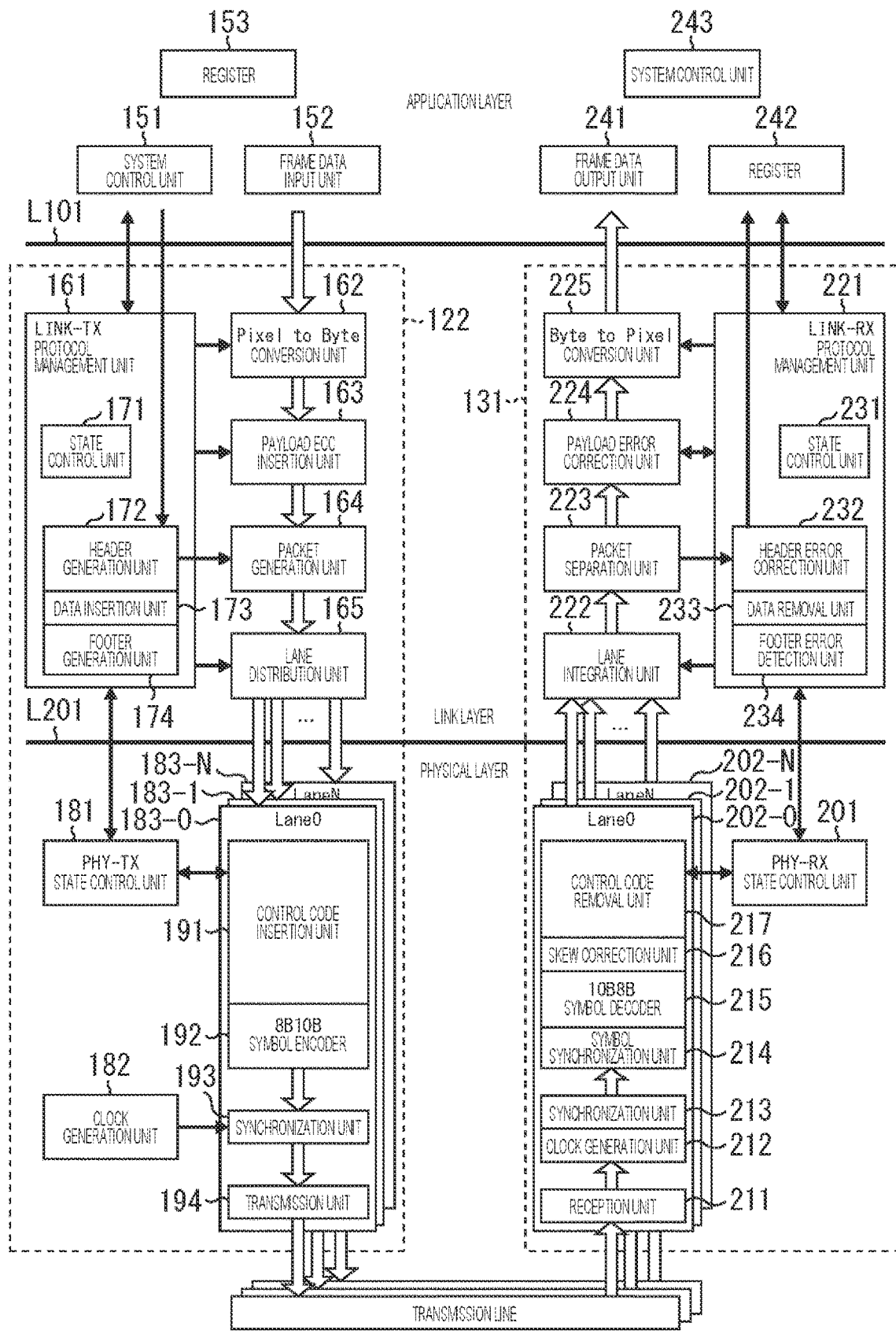
FIG. 17 is a diagram depicting a configuration example of a transmission unit and a reception unit.

FIG. 17 is a diagram depicting configuration examples of the transmission unit 122 and the reception unit 131.

A configuration indicated by enclosing with a dashed line on the left side of FIG. 17 is a configuration of the transmission unit 122, and a configuration indicated by enclosing with a dashed line on the right side is a configuration of the reception unit 131. The transmission unit 122 and the reception unit 131 each have a configuration of a link layer and a configuration of a physical layer. A configuration depicted above a solid line L201 is a configuration of the link layer, and a configuration depicted below the solid line L201 is a configuration of the physical layer.

Note that a configuration depicted above a solid line L101 is a configuration of an application layer. A system control unit 151, a frame data input unit 152, and a register 153 are implemented in the image pickup unit 121. The system control unit 151 communicates with a LINK-TX protocol management unit 161 of the transmission unit 122 and controls transmission of image data by providing information regarding the frame format and the like. The frame data input unit 152 captures an image in response to an instruction or the like from the user, and supplies data of each pixel constituting the image obtained by image-capturing to a Pixel to Byte conversion unit 162 of the transmission unit 122. The register 153 stores information such as the bit depth and the number of Lanes for Pixel to Byte conversion. A transmission process of image data is performed according to the information stored in the register 153.

Furthermore, a frame data output unit 241, a register 242, and a system control unit 243 in the configuration of the application layer are implemented in the image processing unit 132. The frame data output unit 241 generates and outputs an image of one frame on the basis of the pixel data of each line supplied from the reception unit 131. Various processes are performed using the image output from the frame data output unit 241. The register 242 stores various set values related to reception of image data, such as the bit depth and the number of Lanes for Byte to Pixel conversion. A reception process of image data is performed according to information stored in the register 242. The system control unit 243 communicates with a LINK-RX protocol management unit 221 and controls a sequence such as a mode change.
<Configuration of Link Layer of Transmission Unit 122>

First, the configuration of the link layer of the transmission unit 122 will be described.

The transmission unit 122 is provided with the LINK-TX protocol management unit 161, a Pixel to Byte conversion unit 162, a payload ECC insertion unit 163, a packet generation unit 164, and a lane distribution unit 165 as a configuration of the link layer. The LINK-TX protocol management unit 161 includes a state control unit 171, a header generation unit 172, a data insertion unit 173, and a footer generation unit 174.

The state control unit 171 of the LINK-TX protocol management unit 161 manages the state of the link layer of the transmission unit 122.

The header generation unit 172 generates the header to be added to the payload in which pixel data for one line is stored, and outputs the header to the packet generation unit 164.

Figure 18:
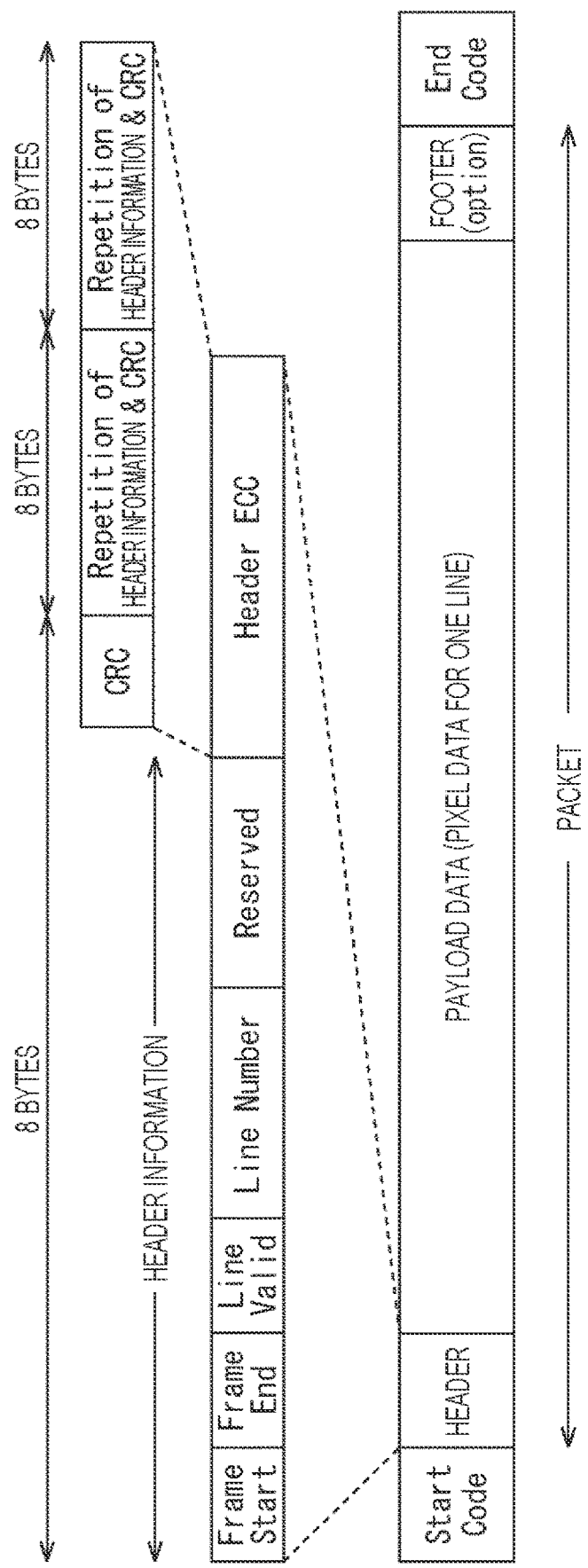
FIG. 18 is a diagram depicting a header structure.

FIG. 18 is a diagram depicting a structure of the header generated by the header generation unit 172.

As described above, one entire packet includes the header and the payload data that is pixel data for one line. The footer may be added to the packet. The header includes header information and Header ECC.

The header information includes Frame Start, Frame End, Line Valid, Line Number, and Reserved. The content and information amount of each piece of information are depicted in FIG. 19.

The Frame Start is one-bit information indicating the beginning of a frame. A value of 1 is set to the Frame Start of the header of a packet used for transmission of pixel data of the first line in the image data area A11 of FIG. 16, and a value of 0 is set to the Frame Start of the header of a packet used for transmission of pixel data of another line.

The Frame End is one-bit information indicating the end of the frame. A value of 1 is set to Frame End of the header of a packet including pixel data of an end line of the effective pixel area A1 in the payload, and a value of 0 is set to Frame End of the header of the packet used for transmission of pixel data of another line.

The Frame Start and Frame End are frame information which is information regarding the frame.

The Line Valid is one-bit information representing whether or not a line of pixel data stored in the payload is a line of effective pixels. A value of 1 is set to the Line Valid of the header of a packet used for transmission of pixel data of a line in the effective pixel area A1, and a value of 0 is set to the Line Valid of the header of a packet used for transmission of pixel data of another line.

The Line Number is 13-bit information representing the line number of a line formed by pixel data stored in the payload.

The Line Valid and Line Number are line information that is information regarding the line.

The Reserved is a 32-bit area for expansion. The total amount of data in the header information is six bytes.

As depicted in FIG. 18, the Header ECC arranged following the header information includes a Cyclic Redundancy Check (CRC) code, which is a 2-byte error detection code calculated on the basis of the six-byte header information. Furthermore, the Header ECC includes two pieces of the same information as the eight-byte information which is a set of the header information and the CRC code following the CRC code.

That is, the header of one packet includes three sets of the same header information and CRC code. The total amount of data in the entire header is 24 bytes in total combining eight bytes for a first set of header information and CRC code, eight bytes for a second set of header information and CRC code, and eight bytes for a third set of header information and CRC code.

FIG. 20 is a diagram depicting an example of an eight-byte bit array that constitutes one set of header information and CRC code.

A byte H7, which is a first one byte of the eight bytes constituting the header, includes one bit each of the Frame Start, the Frame End, and the Line Valid, and the first to fifth bits among 13 bits of the Line Number, in order from the first bit. Furthermore, a byte H6, which is a second one byte, includes the sixth to 13th bits among the 13 bits of the Line Number.

A byte H5, which is a third one byte, to a byte H2, which is a sixth one-byte, are Reserved. A byte H1, which is a seventh one byte, and a byte H0, which is an eighth one byte, include each bit of the CRC code.

Returning to the description of FIG. 17, the header generation unit 172 generates header information according to control by the system control unit 151. For example, the system control unit 151 supplies information representing a line number of pixel data output by the frame data input unit 152 and information representing the beginning and end of a frame.

Furthermore, the header generation unit 172 applies the header information to a generation polynomial to calculate the CRC code. The generation polynomial of the CRC code to be added to the header information is expressed by, for example, following Equation (1).

[Expression 1]

$$CRC16 = X^{16} + X^{15} + X^2 + 1 \quad (1)$$

The header generation unit 172 generates a set of header information and a CRC code by adding the CRC code to the header information, and generates the header by repeatedly arranging three sets of the same header information and CRC code. The header generation unit 172 outputs the generated header to the packet generation unit 164.

The data insertion unit 173 generates data used for stuffing and outputs the data to the Pixel to Byte conversion unit 162 and the lane distribution unit 165. Payload stuffing data, which is stuffing data supplied to the Pixel to Byte conversion unit 162, is added to pixel data after the Pixel to Byte conversion and is used for adjusting the data amount of pixel data stored in the payload. Furthermore, lane stuffing data, which is stuffing data supplied to the lane distribution unit 165, is added to data after lane assignment and used for adjusting the amount of data between lanes.

The footer generation unit 174 calculates a 32-bit CRC code by appropriately applying payload data to the generation polynomial according to control by the system control unit 151, and outputs the CRC code obtained by calculation as a footer to the packet generation unit 164. The CRC code generation polynomial added as a footer is expressed by, for example, following Equation (2).

[Expression 2]

$$CRC32 = X^{32} + X^{31} + X^4 + X^3 + X + 1 \quad (2)$$

The Pixel to Byte conversion unit 162 acquires pixel data supplied from the frame data input unit 152, and performs Pixel to Byte conversion that converts the data of each pixel into data in one-byte units. For example, the pixel value (RGB) of each pixel of the image captured by the image pickup unit 121 is represented by the bit depth of any one of eight bits, 10 bits, 12 bits, 14 bits, and 16 bits.

Figure 21:
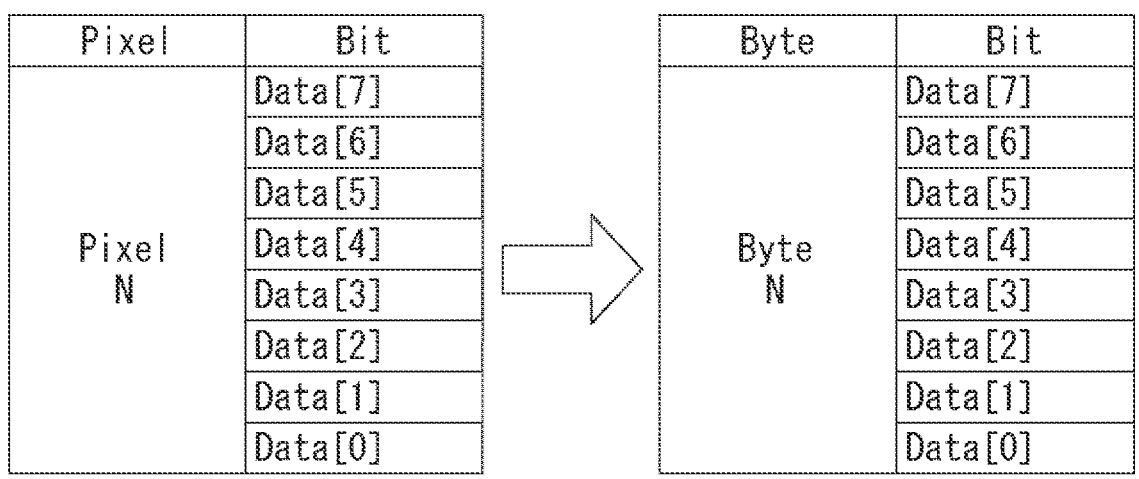
FIG. 21 is a diagram depicting an example of Pixel to Byte conversion in a case where a pixel value of each pixel is represented by eight bits.

FIG. 21 is a diagram depicting an example of the Pixel to Byte conversion in a case where the pixel value of each pixel is represented by eight bits.

Data[0] represents LSB, and Data[7] with the largest number represents MSB. As depicted by a white arrow, in this case, eight bits of Data[7] to [0] representing a pixel value of pixel N are converted into a Byte N including Data[7] to [0]. In a case where the pixel value of each pixel is represented by eight bits, the number of pieces of data in byte units after the Pixel to Byte conversion is the same as the number of pixels.

Figure 22:
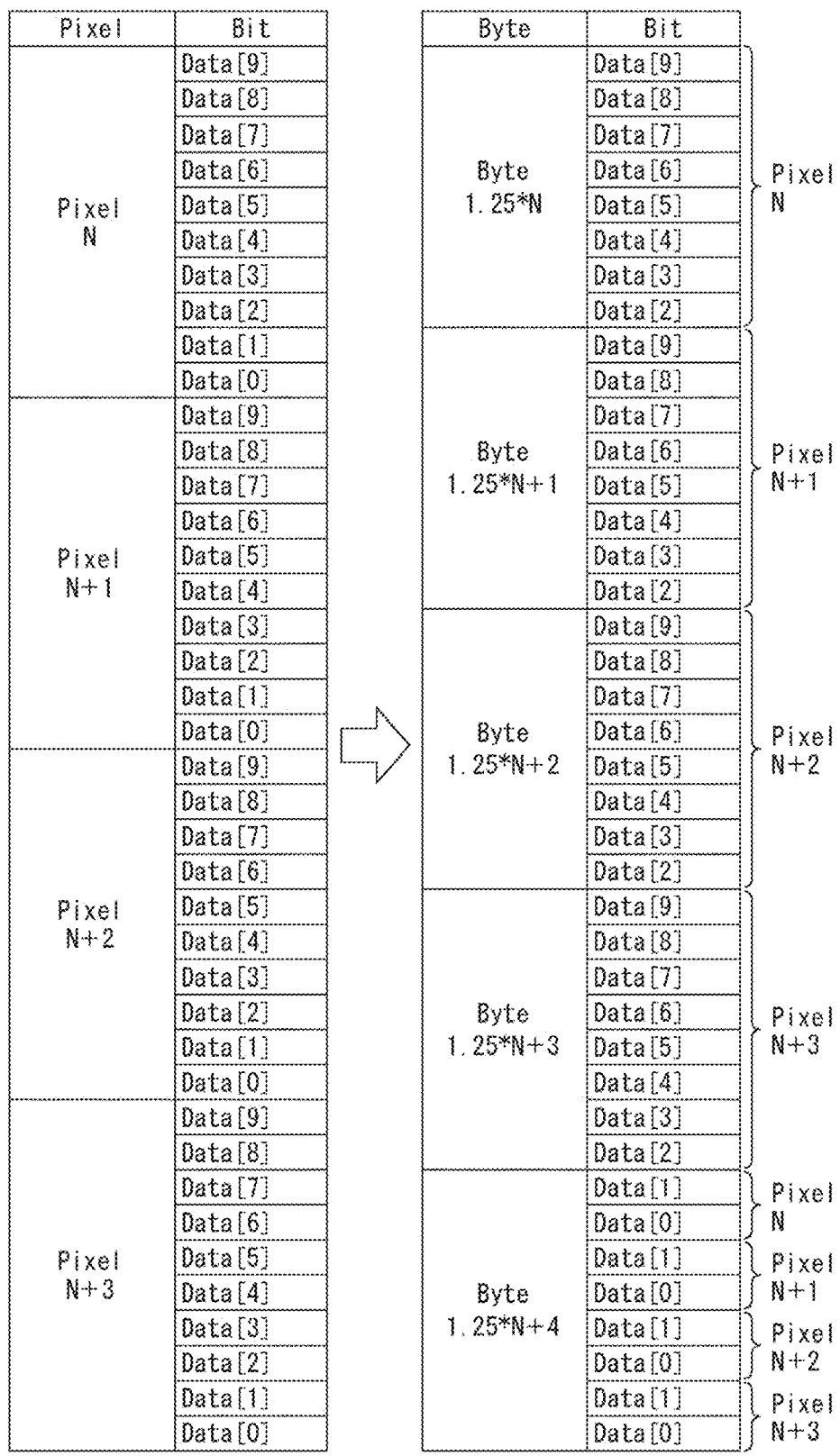
FIG. 22 is a diagram depicting an example of the Pixel to Byte conversion in a case where the pixel value of each pixel is represented by 10 bits.

FIG. 22 is a diagram depicting an example of the Pixel to Byte conversion in a case where the pixel value of each pixel is represented by 10 bits.

In this case, 10 bits of Data[9] to [0] representing a pixel value of pixel N are converted into Byte 1.25*N including Data[9] to [2].

For pixels N+1 to N+3, similarly, 10 bits of Data[9] to [0] representing respective pixel values are converted into Byte 1.25*N+1 to Byte 1.25*N+3 including Data[9] to [2]. Furthermore, Data[1] and Data[0], which are respective lower bits of pixels N to N+3, are collected and converted into Byte 1.25*N+4. In a case where the pixel value of each pixel is represented by 10 bits, the number of pieces of data in byte units after the Pixel to Byte conversion is 1.25 times the number of pixels.

Figure 23:
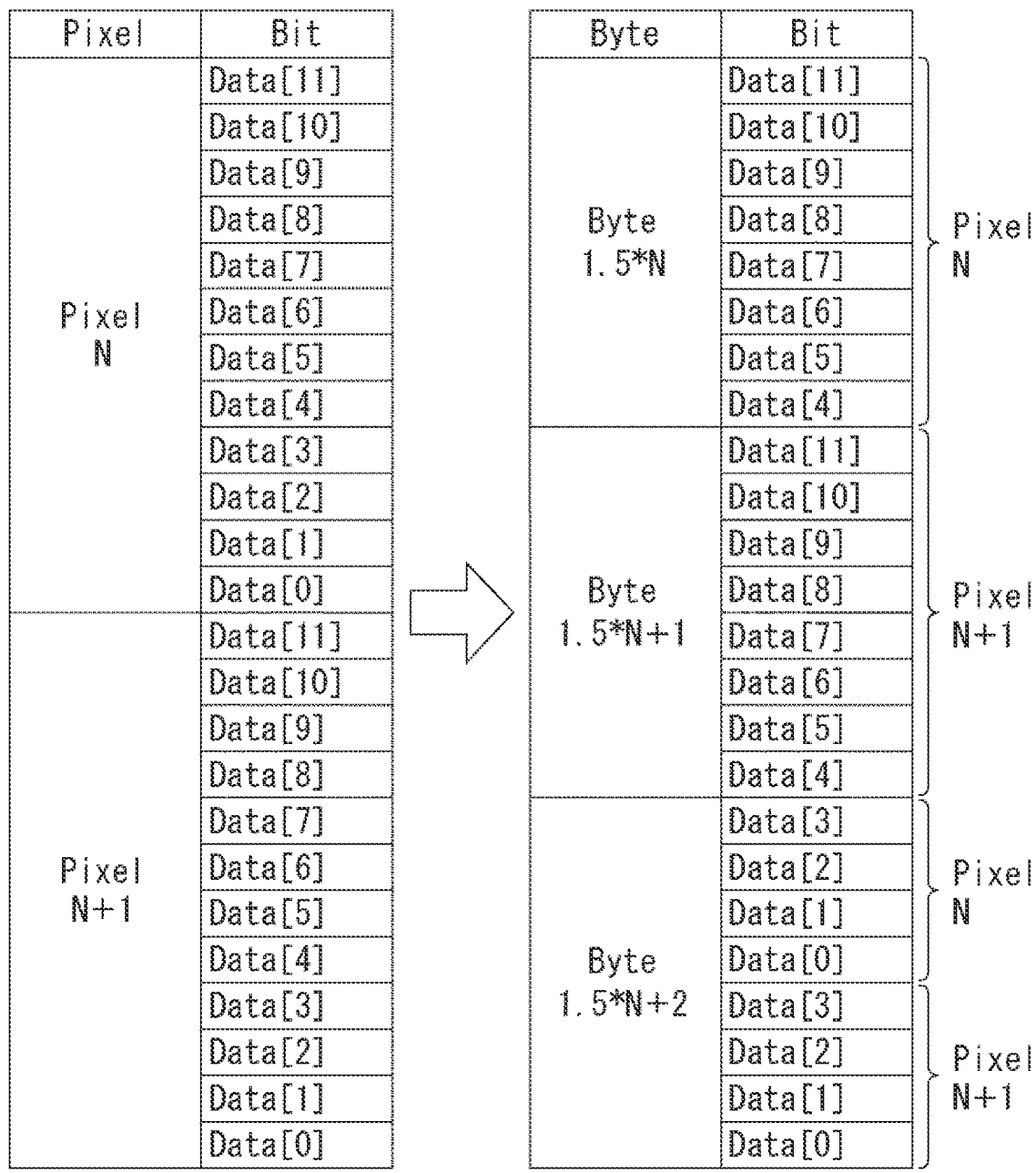
FIG. 23 is a diagram depicting an example of the Pixel to Byte conversion in a case where the pixel value of each pixel is represented by 12 bits.

FIG. 23 is a diagram depicting an example of the Pixel to Byte conversion in a case where the pixel value of each pixel is represented by 12 bits.

In this case, 12 bits of Data[11] to [0] representing a pixel value of pixel N are converted into Byte 1.5*N including Data[11] to [4].

For a pixel N+1, similarly, 12 bits of Data[11] to [0] representing a pixel value of pixel N+1 are converted into Byte 1.5*N+1 including Data[11] to [4]. Furthermore, Data [3] to [0], which are respective lower bits of pixel N and pixel N+1, are collected and converted into Byte 1.5*N+2. In a case where the pixel value of each pixel is represented by 12 bits, the number of pieces of data in byte units after the Pixel to Byte conversion is 1.5 times the number of pixels.

Figure 24:
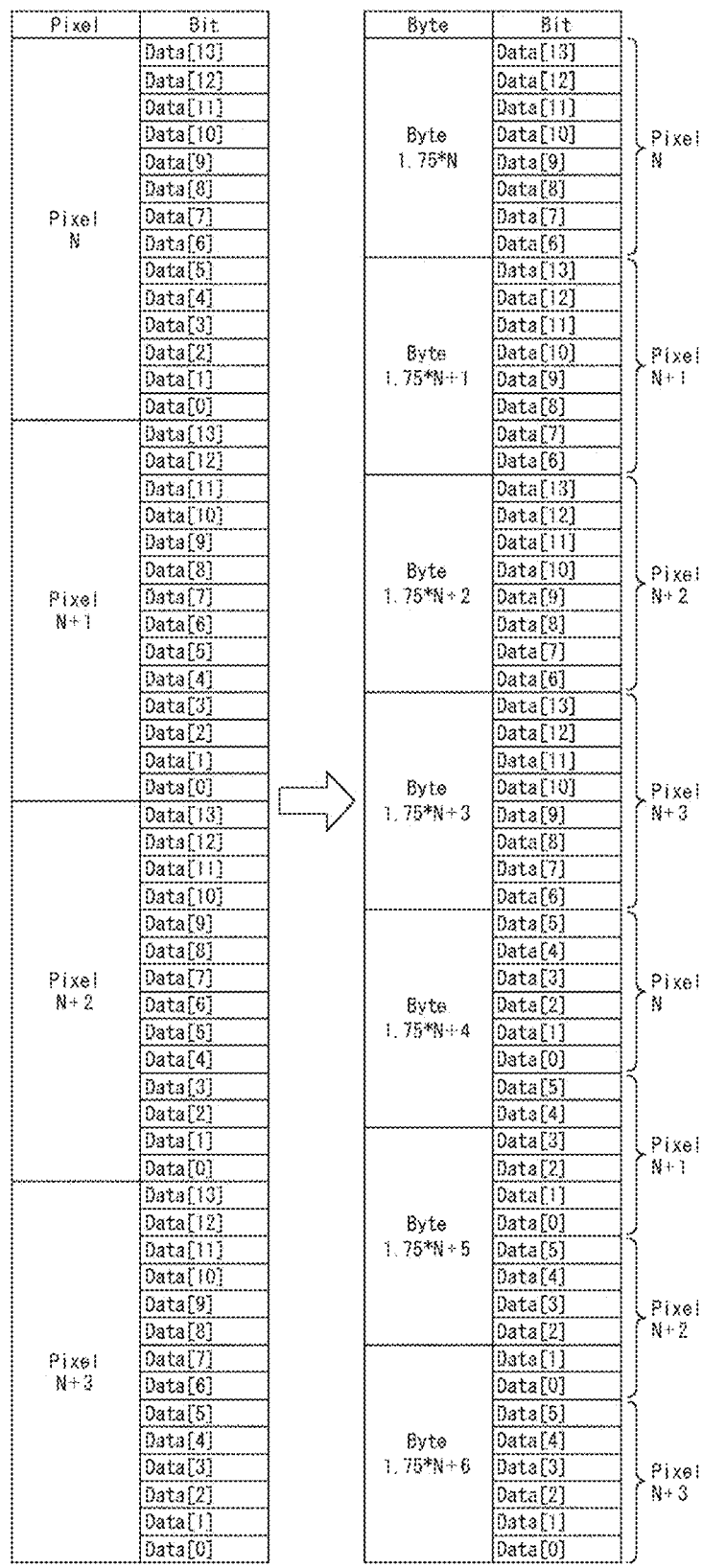
FIG. 24 is a diagram depicting an example of the Pixel to Byte conversion in a case where the pixel value of each pixel is represented by 14 bits.

FIG. 24 is a diagram depicting an example of the Pixel to Byte conversion in a case where the pixel value of each pixel is represented by 14 bits.

In this case, 14 bits of Data[13] to [0] representing a pixel value of pixel N are converted into Byte 1.75*N including Data[13] to [6].

For pixels N+1 to N+3, similarly, 14 bits of Data[13] to [0] representing respective pixel values are converted into Byte 1.75*N+1 to Byte 1.75*N+3 including Data[13] to [6]. Furthermore, the remaining bits of the bits of pixels N to N+3 are collected in order from the lower bit, and for example, Data[5] to [0], which are bits of pixel N, and Data[5] and [4], which are bits of pixel N+1, are converted into Byte 1.75*N+4.

Similarly, Data[3] to [0], which are bits of pixel N+1, and Data[5] to [2], which are bits of pixel N+2, are converted into Byte 1.75*N+5, and Data[1] and [0], which are bits of pixel N+2, and Data[5] to [0], which are bits of pixel N+3, are converted into Byte 1.75*N+6. In a case where the pixel value of each pixel is represented by 14 bits, the number of pieces of data in byte units after the Pixel to Byte conversion is 1.75 times the number of pixels.

Figure 25:
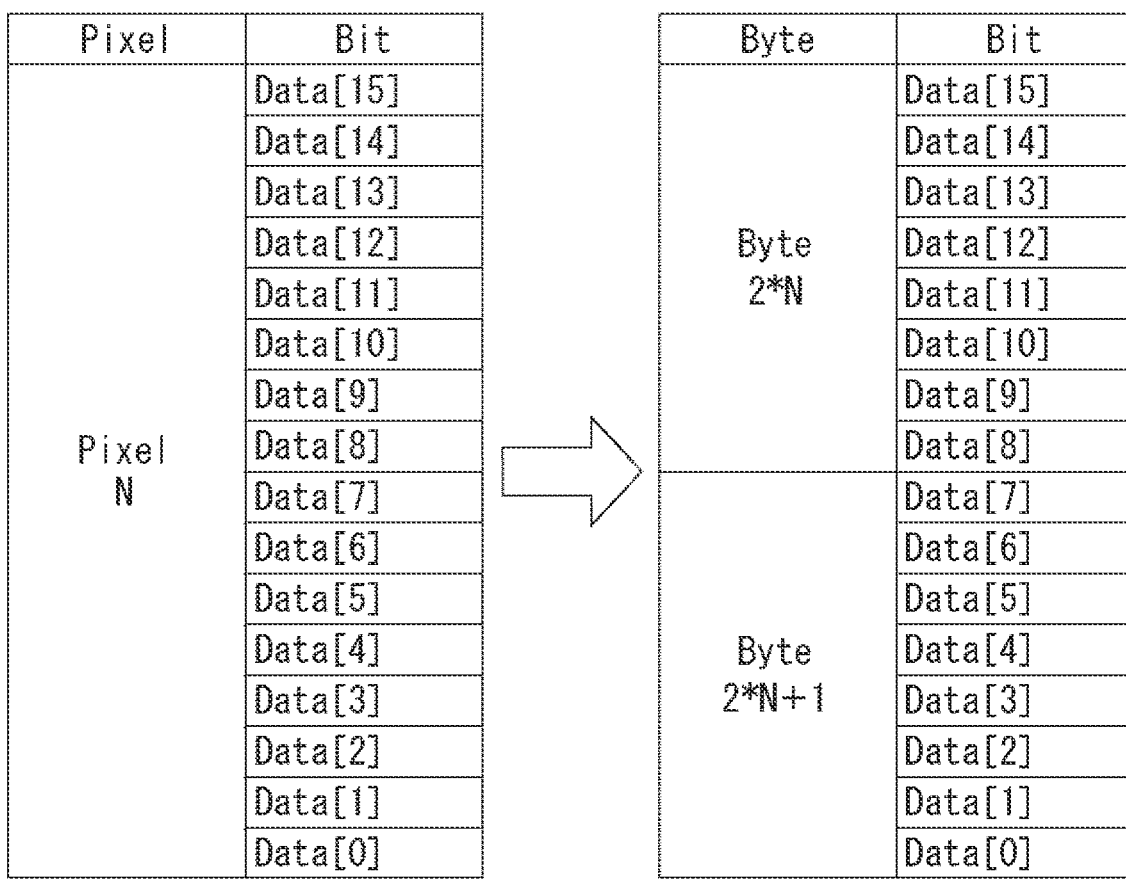
FIG. 25 is a diagram depicting an example of the Pixel to Byte conversion in a case where the pixel value of each pixel is represented by 16 bits.

FIG. 25 is a diagram depicting an example of the Pixel to Byte conversion in a case where the pixel value of each pixel is represented by 16 bits.

In this case, 16 bits of Data[15] to [0] representing a pixel value of pixel N are converted into Byte 2*N including Data[15] to [8] and Byte 2*N+1 including Data[7] to [0]. In a case where the pixel value of each pixel is represented by 16 bits, the number of pieces of data in byte units after the Pixel to Byte conversion is twice the number of pixels.

The Pixel to Byte conversion unit 162 of FIG. 17 performs such Pixel to Byte conversion for each pixel in order from, for example, the leftmost pixel of the line. Furthermore, the Pixel to Byte conversion unit 162 generates payload data by adding the payload stuffing data supplied from the data insertion unit 173 to the pixel data in byte units obtained by the Pixel to Byte conversion, and outputs the payload data to the payload ECC insertion unit 163.

Figure 26:
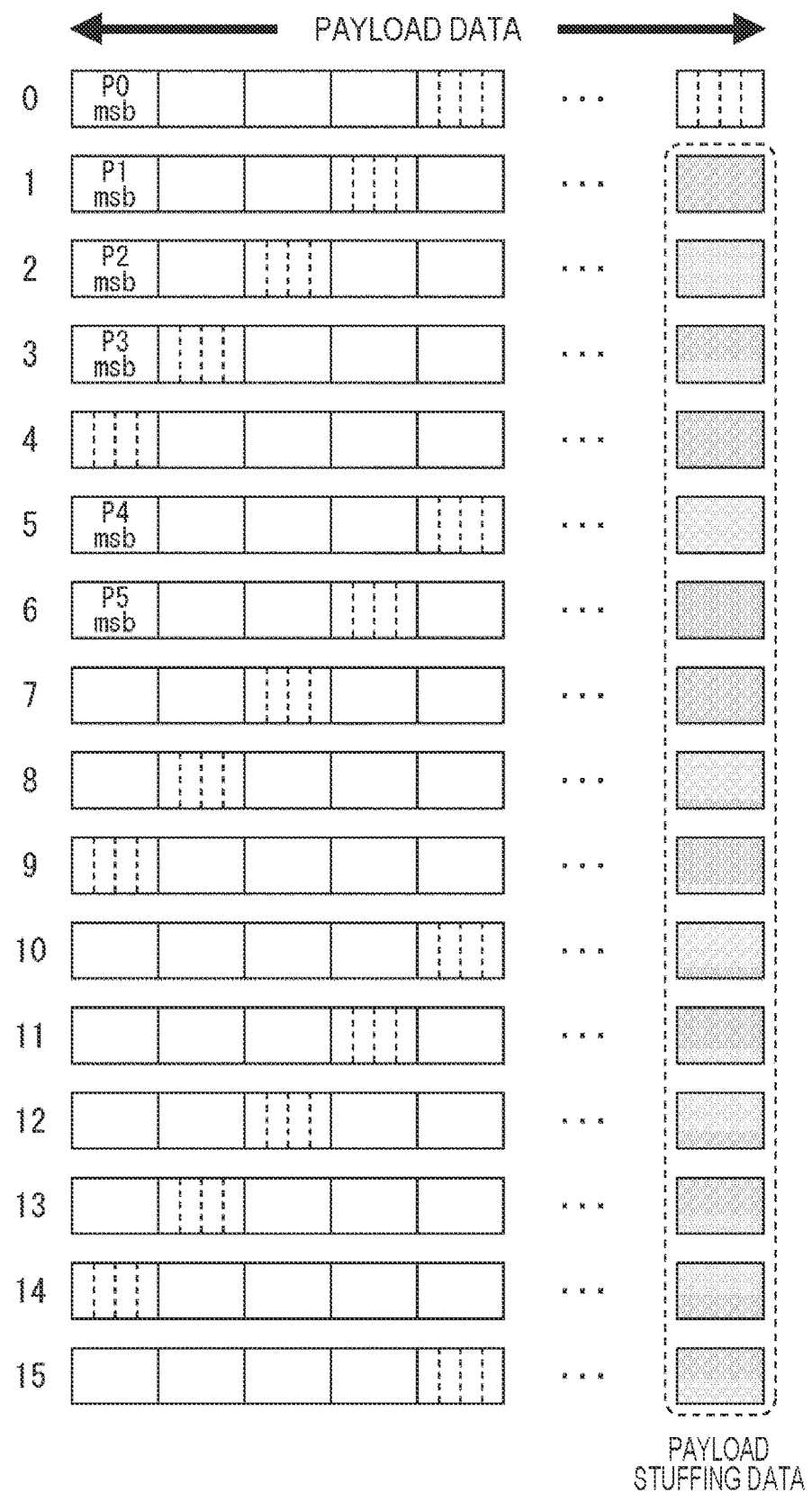
FIG. 26 is a diagram depicting an example of payload data.

FIG. 26 is a diagram depicting an example of the payload data.

FIG. 26 depicts the payload data including pixel data obtained by the Pixel to Byte conversion in a case where the pixel value of each pixel is represented by 10 bits. One uncolored block represents pixel data in byte units after the Pixel to Byte conversion. Furthermore, one colored block represents the payload stuffing data generated by the data insertion unit 173.

The pixel data after the Pixel to Byte conversion is grouped into a predetermined number of groups in the order obtained by the conversion. In the example of FIG. 26, each pixel data is grouped into 16 groups of groups 0 to 15, pixel data including MSB of pixel P0 is assigned to the group 0, and pixel data including MSB of pixel P1 is assigned to the group 1. Furthermore, pixel data including MSB of pixel P2 is assigned to the group 2, pixel data including MSB of pixel P3 is assigned to the group 3, and pixel data including LSB of pixels P0 to P3 is assigned to the group 4.

Pixel data including MSB of pixel P4 and pixel data thereafter are also assigned to respective groups of the group 5 and thereafter in order. When a certain pixel data is assigned to the group 15, pixel data thereafter is sequentially assigned to respective groups of the group 0 and thereafter. Note that among the blocks representing pixel data, blocks with three dashed lines added inside represent pixel data in byte units generated so as to include LSBs of pixels N to N+3 during the Pixel to Byte conversion.

In the link layer of the transmission unit 122, after grouping is performed in this manner, processing is performed in parallel for the pixel data at the same position in each group at every period defined by a clock signal. That is, in a case where pixel data is assigned to 16 groups as depicted in FIG. 26, processing of pixel data proceeds so that 16 pieces of pixel data arranged in each column are processed within the same period.

As described above, the payload of one packet includes one line of pixel data. The entire pixel data depicted in FIG. 26 is pixel data constituting one line. Here, the processing of pixel data in the effective pixel area A1 of FIG. 16 is described, but the pixel data in other areas such as the margin area A2 is also processed together with the pixel data in the effective pixel area A1.

After the pixel data for one line is grouped, the payload stuffing data is added so that respective data lengths of the groups are the same. The payload stuffing data is one byte of data.

In the example of FIG. 26, the payload stuffing data is not added to the pixel data of the group 0, and as indicated by enclosing with a dashed line, one payload stuffing data is added at the end of each piece of pixel data of the groups 1 to 15. The data length (Byte) of the payload data including pixel data and stuffing data is expressed by following Equation (3).

[Expression 3]

$$PayloadLength = LineLength \times \frac{BitPix}{8} + PayloadStuffing \quad (3)$$

LineLength in Equation (3) represents the number of pixels of a line, and BitPix represents the bit depth representing the pixel value of one pixel. PayloadStuffing represents the number of pieces of payload stuffing data.

In a case where pixel data is assigned to 16 groups as depicted in FIG. 26, the number of pieces of payload stuffing data is expressed by following Equation (4). % in Equation (4) represents a remainder.

[Expression 4]

$$PayloadStuffing = 16 - \left(\left(LineLength \times \frac{BitPix}{8}\right) \% 16\right) \quad (4)$$

Figure 27:
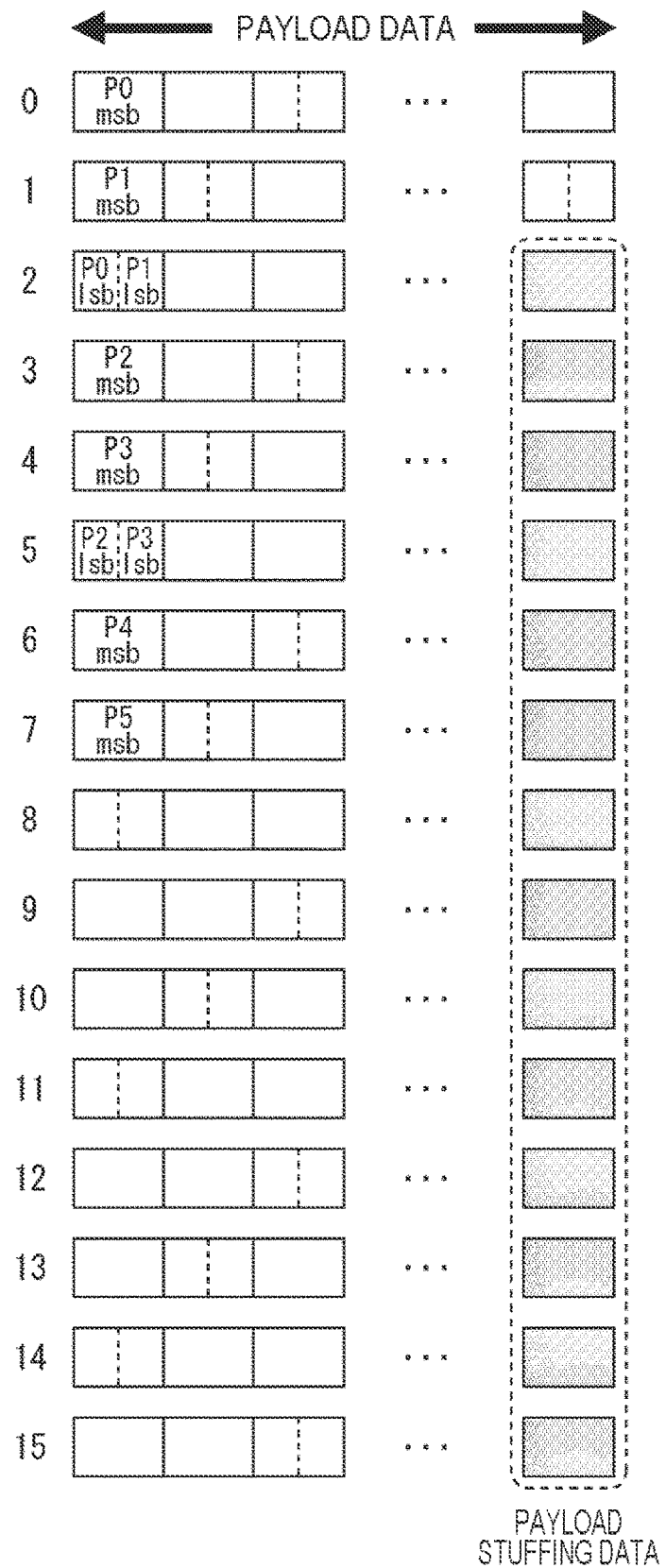
FIG. 27 is a diagram depicting another example of the payload data.

FIG. 27 is a diagram depicting another example of the payload data.

FIG. 27 depicts the payload data including pixel data obtained by the Pixel to Byte conversion in a case where the pixel value of each pixel is represented by 12 bits.

In the example of FIG. 27, pixel data including MSB of pixel P0 is assigned to a group 0, pixel data including MSB of pixel P1 is assigned to a group 1, pixel data including LSBs of pixel P0 and pixel P1 is assigned to a group 2. Pixel data including MSB of pixel P2 and pixel data thereafter are also assigned to respective groups of a group 3 and thereafter in order. Note that among the blocks representing pixel data, blocks with one dashed line added inside represent pixel data in byte units generated so as to include LSBs of pixel N and pixel N+1 during the Pixel to Byte conversion.

In the example of FIG. 27, payload stuffing data is not added to the pixel data of the group 0 and the group 1, and payload stuffing data is added one by one at the end of each pixel data of groups 2 to 15.

Payload data having such a configuration is supplied from the Pixel to Byte conversion unit 162 to the payload ECC insertion unit 163.

The payload ECC insertion unit 163 calculates an error correction code used for error correction of payload data on the basis of the payload data supplied from the Pixel to Byte conversion unit 162, and a parity that is the error correction code obtained by the calculation is inserted in the payload data. As the error correction code, for example, a Reed-Solomon code is used. Note that the insertion of the error correction code is an option, and for example, it is possible to only perform either of the insertion of the parity by the payload ECC insertion unit 163 and the addition of a footer by the footer generation unit 174.

Figure 28:
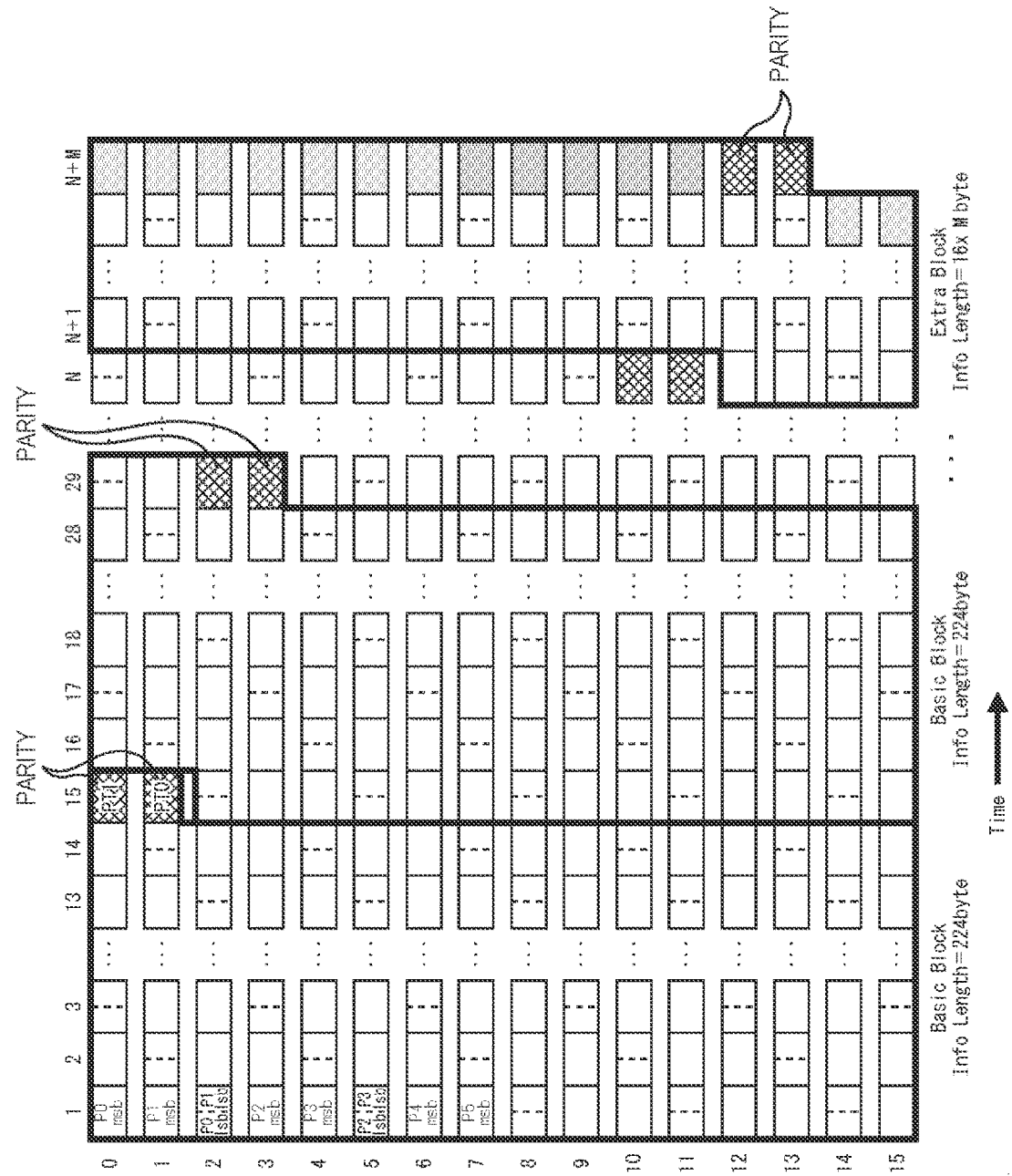
FIG. 28 is a diagram depicting an example of the payload data in which a parity is inserted.

FIG. 28 is a diagram depicting an example of payload data in which the parity is inserted.

The payload data depicted in FIG. 28 is the payload data including the pixel data obtained by the Pixel to Byte conversion in a case where the pixel value of each pixel is represented by 12 bits, which is described with reference to FIG. 27. The shaded blocks represent the parity.

In the example of FIG. 28, 14 pixels are selected in order from first pixel data of each group of groups 0 to 15, and a two-byte parity is obtained on the basis of the selected 224 pieces (224 bytes) of pixel data. The two-byte parity is inserted as 15th data in groups 0 and 1 following the 224 pieces of pixel data used in the calculation, and a first Basic Block includes the 224 pieces of pixel data and a two-byte parity.

Thus, in the payload ECC insertion unit 163, basically, the two-byte parity is generated on the basis of the 224 pieces of pixel data, and inserted following the 224 pieces of pixel data.

Furthermore, in the example of FIG. 28, 224 pieces of pixel data following the first Basic Block are selected in order from each group, and a two-byte parity is obtained on the basis of the selected 224 pieces of pixel data. The two-byte parity is inserted as 29th data in the groups 2 and 3 following the 224 pieces of pixel data used in the calculation, and a second Basic Block includes the 224 pieces of pixel data and the two-byte parity.

In a case where 16×M, which is the number of pieces of pixel data and payload stuffing data following a certain Basic Block, is less than 224, then the two-byte parity is obtained on the basis of the remaining 16×M blocks (pixel data and payload stuffing data). Furthermore, the obtained two-byte parity is inserted following the payload stuffing data, and an Extra Block includes 16×M blocks and the two-byte parity.

The payload ECC insertion unit 163 outputs the payload data with a parity inserted to the packet generation unit 164. In a case where the parity is not inserted, the payload data supplied from the Pixel to Byte conversion unit 162 to the payload ECC insertion unit 163 is output to the packet generation unit 164 as it is.

The packet generation unit 164 generates a packet by adding the header generated by the header generation unit 172 to the payload data supplied from the payload ECC insertion unit 163. In a case where a footer is generated by the footer generation unit 174, the packet generation unit 164 also adds the footer to the payload data.

Figure 29:
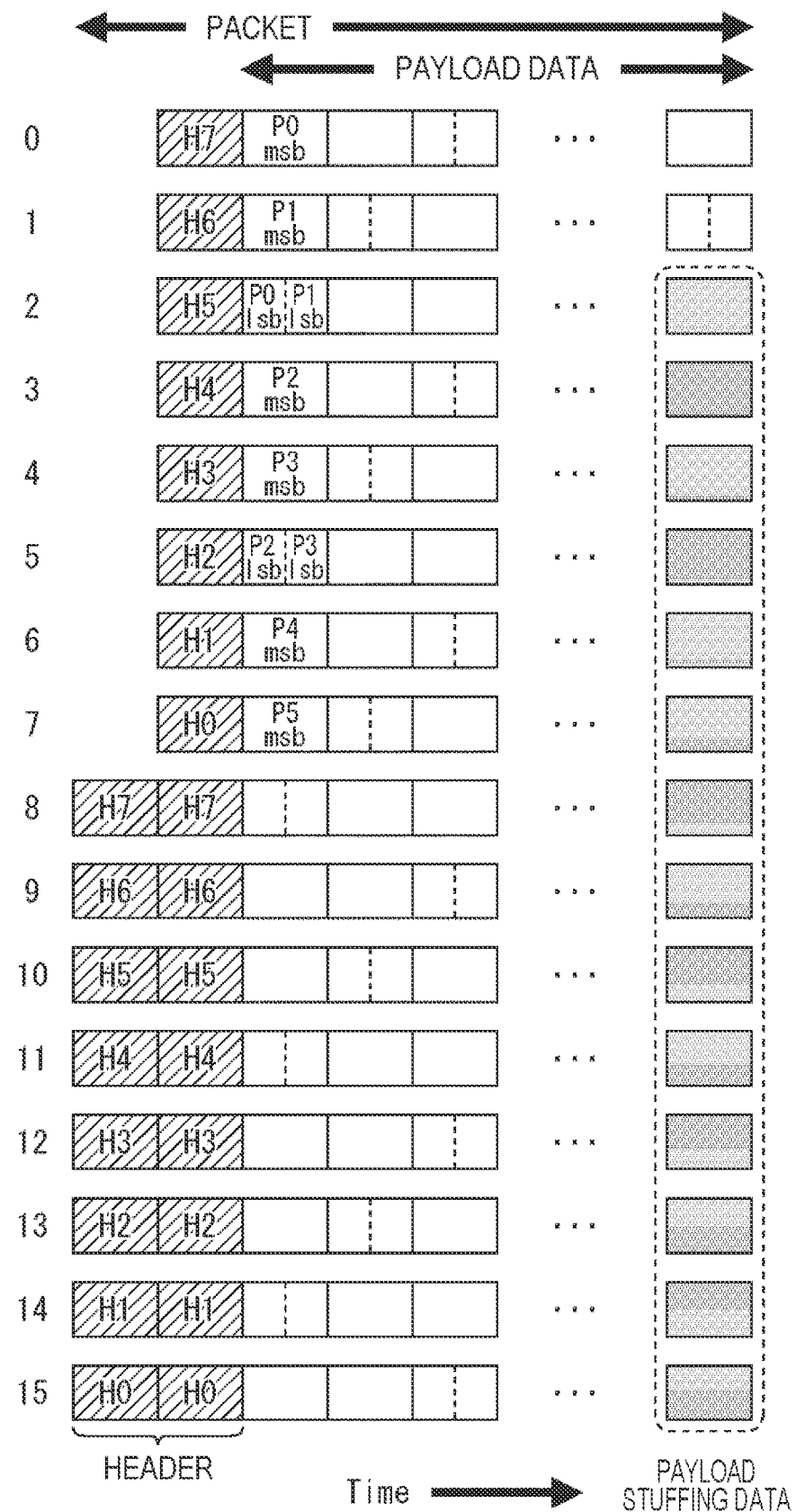
FIG. 29 is a diagram depicting a state where a header is added to the payload data.

FIG. 29 is a diagram depicting a state where a header is added to the payload data.

Twenty-four blocks indicated by characters H7 to H0 represent the header information or the header data in byte units, which is the CRC code of the header information. As described with reference to FIG. 18, the header of one packet includes three sets of header information and CRC code.

For example, header data H7 to H2 are header information (six bytes), and header data H1 and H0 are CRC codes (two bytes).

In the example of FIG. 29, one piece of header data H7 is added to the payload data of group 0, and one piece of header data H6 is added to the payload data of group 1. One piece of header data H5 is added to the payload data of group 2, and one piece of header data H4 is added to the payload data of group 3. One piece of header data H3 is added to the payload data of group 4, and one piece of header data H2 is added to the payload data of group 5. One piece of header data H1 is added to the payload data of group 6, and one piece of header data H0 is added to the payload data of group 7.

Furthermore, in the example of FIG. 29, two pieces of header data H7 are added to the payload data of group 8, and two pieces of header data H6 are added to the payload data of group 9. Two pieces of header data H5 are added to the payload data of group 10, and two pieces of header data H4 are added to the payload data of group 11. Two pieces of header data H3 are added to the payload data of group 12, and two pieces of header data H2 are added to the payload data of group 13. Two pieces of header data H1 are added to the payload data of group 14, and two pieces of header data H0 are added to the payload data of group 15.

Figure 30:
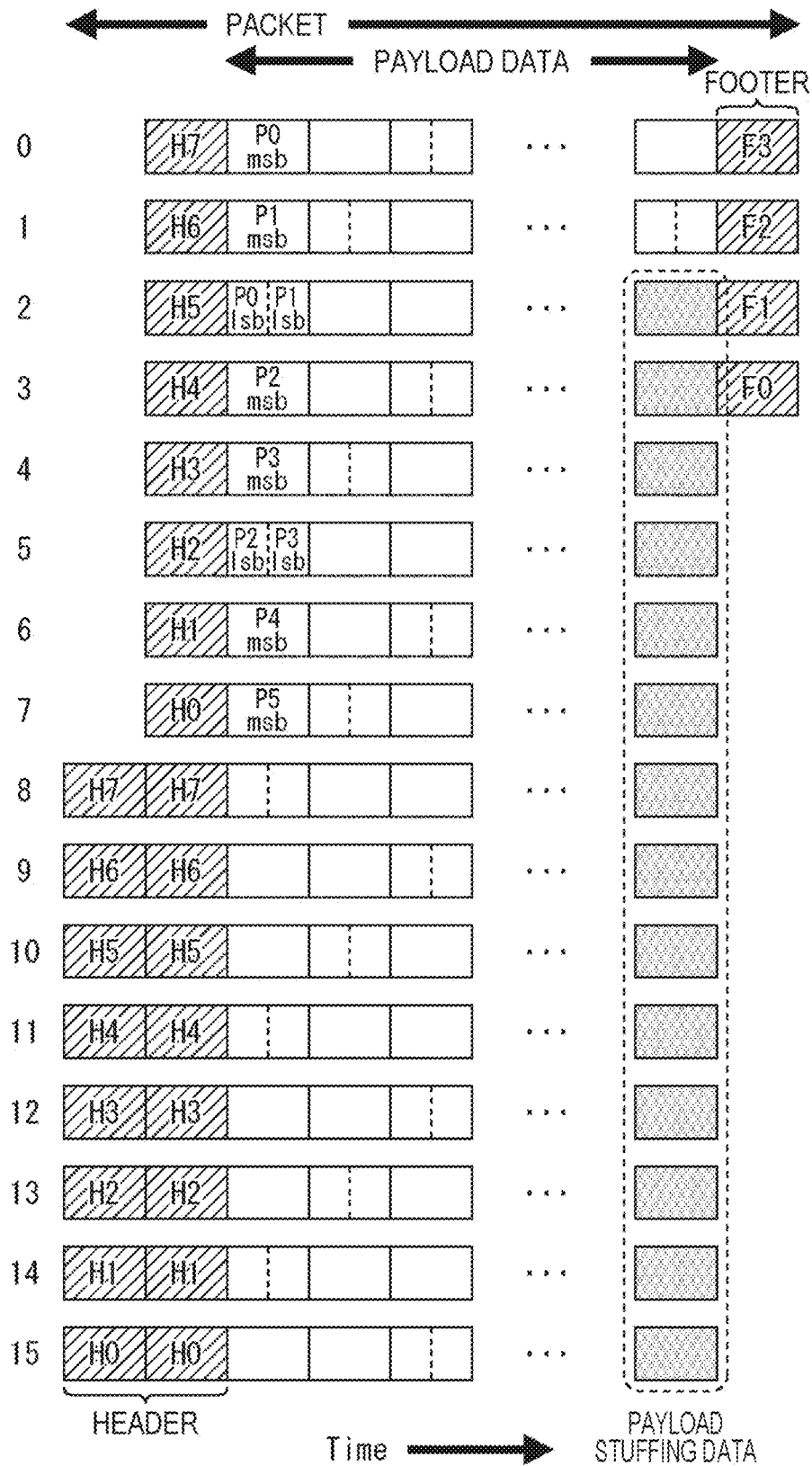
FIG. 30 is a diagram depicting a state where the header and a footer are added to the payload data.

FIG. 30 is a diagram depicting a state where the header and a footer are added to the payload data.

Four blocks indicated by characters F3 to F0 represent footer data, which is a four-byte CRC code generated as a footer. In the example of FIG. 30, pieces of footer data F3 to F0 are added to the respective payload data of the groups 0 to 3.

Figure 31:
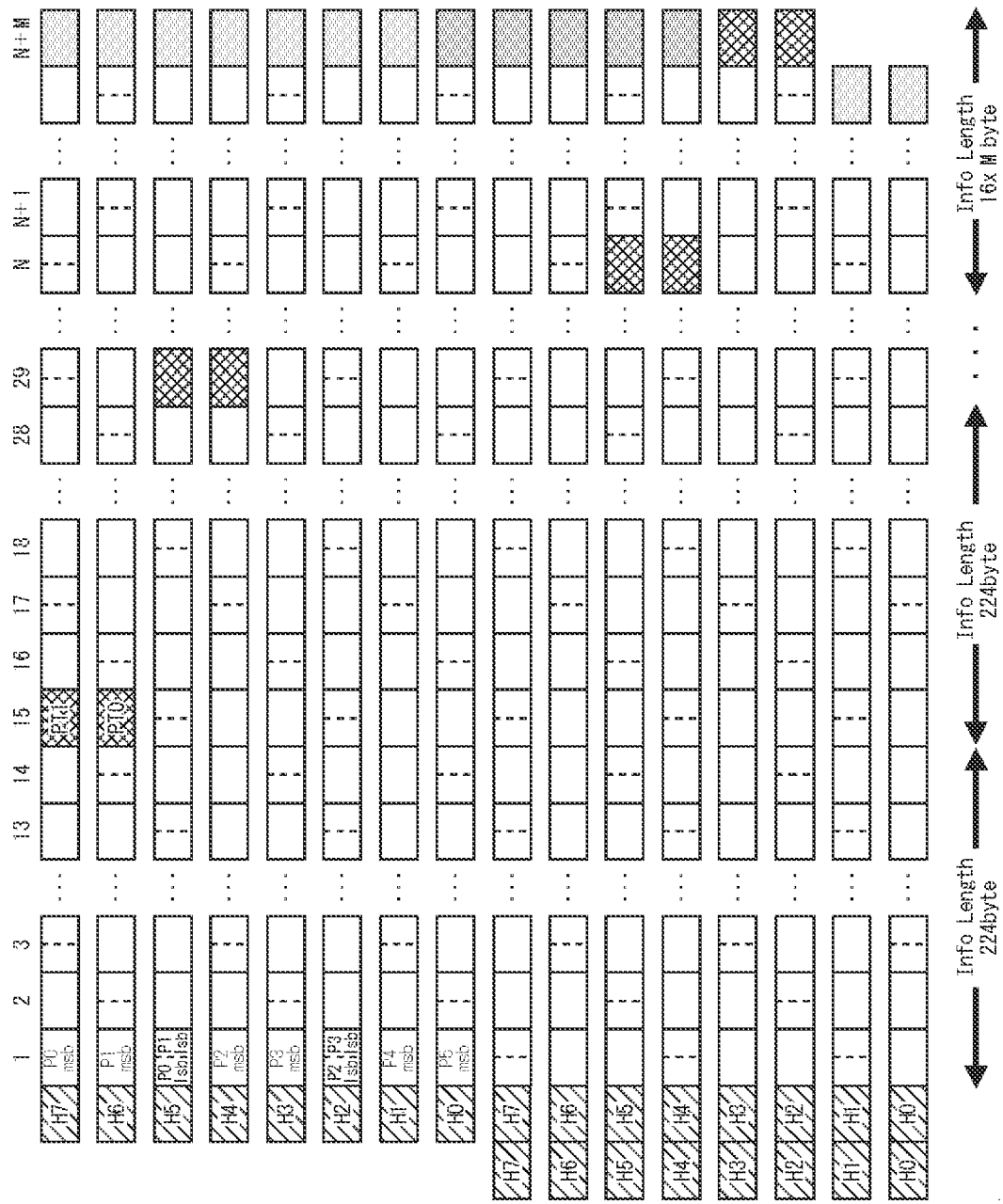
FIG. 31 is a diagram depicting a state in which the header is added to the payload data in which the parity is inserted.

FIG. 31 is a diagram depicting a state in which the header is added to the payload data in which the parity is inserted.

In the example of FIG. 31, pieces of header data H7 to H0 are added to the payload data of FIG. 28 in which a parity is inserted, as in the cases of FIGS. 29 and 30.

The packet generation unit 164 outputs packet data, which is data constituting one packet generated in this manner, to the lane distribution unit 165. The lane distribution unit 165 is supplied with packet data including header data and payload data, packet data including the header data, the payload data, and footer data, or packet data including the header data and the payload data in which a parity is inserted. The packet structure of FIG. 18 is a logical one, and in the link layer and the physical layer, data of a packet having the structure of FIG. 18 is processed in byte units.

The lane distribution unit 165 assigns the packet data supplied from the packet generation unit 164 to each lane used for data transmission in Lanes 0 to 7 in order from the first data.

FIG. 32 is a diagram depicting an example of assignment of the packet data.

Here, an assignment of packet data (FIG. 30) including header data, payload data, and footer data will be described. An example of assignment of packet data in a case where data transmission is performed using eight lanes of Lanes 0 to 7 is depicted ahead of white arrow #1.

In this case, each piece of header data constituting the header data H7 to H0 repeated three times is assigned to the Lanes 0 to 7 in order from the first header data. When a certain piece of header data is assigned to the Lane 7, header data thereafter is assigned to respective lanes of the Lane 0 and thereafter in order. Three identical pieces of header data will be assigned to each lane of the Lanes 0 to 7.

Furthermore, the payload data is assigned to the Lanes 0 to 7 in order from the first payload data. When a certain piece of payload data is assigned to the Lane 7, payload data thereafter is assigned to respective lanes of the Lane 0 and thereafter in order.

Pieces of footer data F3 to F0 are assigned to each lane in order from the first footer data. In the example of FIG. 32, the last payload stuffing data constituting the payload data is assigned to the Lane 7, and pieces of footer data F3 to F0 are assigned to the Lanes 0 to 3 one by one.

Blocks depicted in black represent lane stuffing data generated by the data insertion unit 173. The lane stuffing data is assigned to the lane with a small number of pieces of data so that packet data for one packet is assigned to each lane and then a data length assigned to each lane is the same. The lane stuffing data is data of one byte. In the example of FIG. 32, the lane stuffing data is assigned one by one to the Lanes 4 to 7, which are lanes with a small number of data assignments.

The number of pieces of lane stuffing data in a case where the packet data includes header data, payload data, and footer data is represented by following Equation (5).

[Expression 5]

$$\text{LaneStuffing} = \text{LaneNum} - ((\text{PayloadLength} + \text{FooterLength}) \% \text{LaneNum}) \quad (5)$$

LaneNum in Equation (5) represents the number of lanes, and PayloadLength represents a payload data length (bytes). Furthermore, FooterLength represents a footer length (bytes).

Furthermore, the number of pieces of lane stuffing data in a case where the packet data includes header data and payload data with a parity inserted is represented by following Equation (6). ParityLength in Equation (6) represents the total number of bytes of the parity included in the payload.

[Expression 6]

$$\text{LaneStuffing} = \text{LaneNum} - ((\text{PayloadLength} + \text{ParityLength}) \% \text{LaneNum}) \quad (6)$$

An example of assignment of packet data in a case where data transmission is performed using the six lanes of the Lanes 0 to 5 is depicted ahead of white arrow #2.

In this case, each piece of header data constituting the header data H7 to H0 repeated three times is assigned to the Lanes 0 to 5 in order from the first header data. When a certain piece of header data is assigned to the Lane 5, header data thereafter is assigned to respective lanes of the Lane 0 and thereafter in order. Four pieces of header data will be assigned to each lane of the Lanes 0 to 5.

Furthermore, the payload data is assigned to the Lanes 0 to 5 in order from the first payload data. When a certain piece of payload data is assigned to the Lane 5, payload data thereafter is assigned to respective lanes of the Lane 0 and thereafter in order.

Pieces of footer data F3 to F0 are assigned to each lane in order from the first footer data. In the example of FIG. 32, the last payload stuffing data constituting the payload data is assigned to the Lane 1, and pieces of footer data F3 to F0 are assigned to the Lanes 2 to 5 one by one. Since the number of pieces of packet data of the Lanes 0 to 5 is the same, the lane stuffing data is not used in this case.

An example of packet data assignment in a case where data transmission is performed using four lanes of the Lanes 0 to 3 is depicted ahead of white arrow #3.

In this case, each piece of header data constituting the header data H7 to H0 repeated three times is assigned to the Lanes 0 to 3 in order from the first header data. When a certain piece of header data is assigned to the Lane 3, header data thereafter is assigned to respective lanes of the Lane 0 and thereafter in order. Six pieces of header data will be assigned to each lane of the Lanes 0 to 3.

Furthermore, the payload data is assigned to the Lanes 0 to 3 in order from the first payload data. When a certain piece of payload data is assigned to the Lane 3, payload data thereafter is assigned to respective lanes of the Lane 0 and thereafter in order.

Pieces of footer data F3 to F0 are assigned to each lane in order from the first footer data. In the example of FIG. 32, the last payload stuffing data constituting the payload data is assigned to the Lane 3, and pieces of footer data F3 to F0 are assigned to the Lanes 0 to 3 one by one. Since the number of pieces of packet data of the Lanes 0 to 3 is the same, the lane stuffing data is not used in this case.

The lane distribution unit 165 outputs the packet data assigned to each lane in this manner to the physical layer. Hereinafter, a case where data is transmitted using eight lanes of the Lanes 0 to 7 will be mainly described, but similar processing is performed even in a case where the number of lanes used for data transmission is another number.

<Configuration of Physical Layer of Transmission Unit 122>

Next, the configuration of the physical layer of the transmission unit 122 will be described.

The transmission unit 122 is provided with a PHY-TX state control unit 181, a clock generation unit 182, and signal processing units 183-0 to 183-N as a configuration of the physical layer. The signal processing unit 183-0 includes a control code insertion unit 191, an 8B10B symbol encoder 192, a synchronization unit 193, and a transmission unit 194.

The encoder 11 that performs encoding described with reference to FIGS. 1 to 13 can be used instead of the 8B10B symbol encoder 192. A case of the 8B10B symbol encoder 192 will be described first, and a case where the encoder 11 is used instead of the 8B10B symbol encoder 192 will be described with reference to FIG. 42 and subsequent drawings.

Packet data assigned to the Lane 0 output from the lane distribution unit 165 is input to the signal processing unit 183-0, and packet data assigned to the Lane 1 is input to the signal processing unit 183-1. Furthermore, the packet data assigned to the Lane N is input to the signal processing unit 183-N.

In this manner, the physical layer of the transmission unit 122 is provided with the same number of signal processing units 183-0 to 183-N as the number of lanes, and processes of packet data transmitted using respective lanes are performed in parallel in the signal processing units 183-0 to 183-N, respectively. A configuration of the signal processing unit 183-0 will be described, but the signal processing units 183-1 to 183-N also have similar configurations.

The PHY-TX state control unit 181 controls respective units of the signal processing units 183-0 to 183-N. For example, timing of each processing performed by the signal processing units 183-0 to 183-N is controlled by the PHY-TX state control unit 181.

The clock generation unit 182 generates a clock signal and outputs the clock signal to each synchronization unit 193 of the signal processing units 183-0 to 183-N.

The control code insertion unit 191 of the signal processing unit 183-0 adds a control code to packet data supplied from the lane distribution unit 165. The control code is a code represented by one symbol selected from a plurality of types of symbols prepared in advance or by a combination of the plurality of types of symbols. Each symbol inserted by the control code insertion unit 191 is eight-bit data. By performing 8B10B conversion in the circuit in the subsequent stage, one symbol inserted by the control code insertion unit 191 becomes 10-bit data. On the other hand, in the reception unit 131, 10B8B conversion is performed on the received data as described later, but each symbol before the 10B8B conversion included in the received data is 10-bit data, and each symbol after the 10B8B conversion becomes eight-bit data.

FIG. 33 is a diagram depicting an example of control codes added by the control code insertion unit 191.

The control codes include Idle Code, Start Code, End Code, Pad Code, Sync Code, Deskew Code, and Standby Code.

The Idle Code is a group of symbols that are repeatedly transmitted during a period other than the time when packet data is transmitted. The Idle Code is represented by D00.0 (00000000) of D Character that is an 8B10B Code.

The Start Code is a group of symbols indicating the start of a packet. As described above, the Start Code is added before the packet. The Start Code is represented by four symbols, K28.5, K27.7, K28.2, and K27.7, which are a combination of three types of K Characters. The value of each of K Characters is depicted in FIG. 34.

The End Code is a group of symbols indicating the end of a packet. As described above, the End Code is added after the packet. The End Code is represented by four symbols, K28.5, K29.7, K30.7, and K29.7, which are a combination of three types of K Characters.

The Pad Code is a group of symbols inserted in payload data to fill the difference between a pixel data band and a PHY transmission band. The pixel data band is a transmission rate of pixel data output from the image pickup unit 121 and input to the transmission unit 122, and the PHY transmission band is a transmission rate of pixel data transmitted from the transmission unit 122 and input to the reception unit 131. The Pad Code is represented by four symbols, K23.7, K28.4, K28.6, and K28.3, which are a combination of four types of K Characters.

Figure 35:
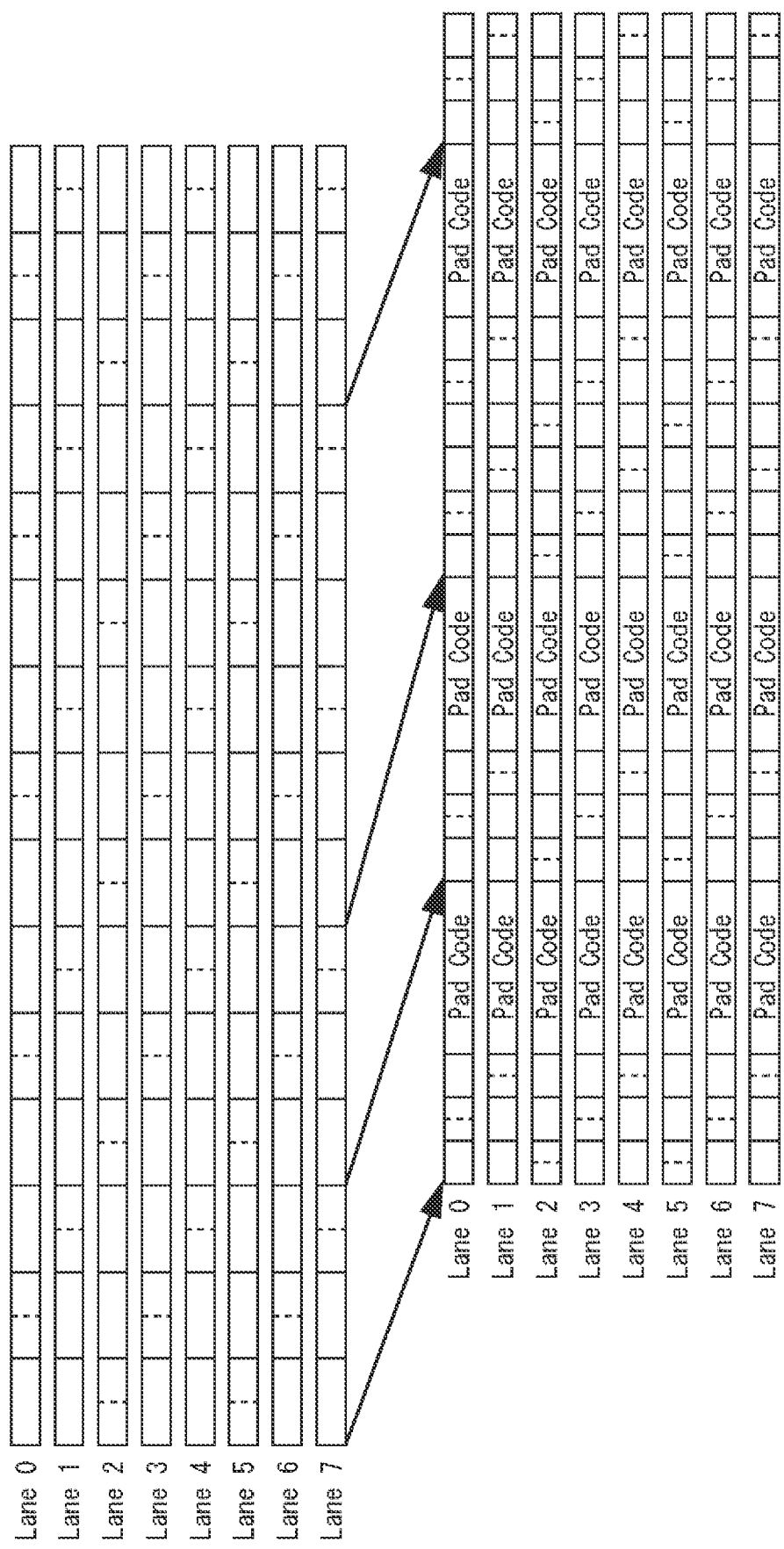
FIG. 35 is a diagram depicting an example of insertion of a Pad Code.

FIG. 35 is a diagram depicting an example of insertion of the Pad Code.

The upper part of FIG. 35 depicts payload data assigned to each lane before insertion of the Pad Code, and the lower part depicts the payload data after insertion of the Pad Code. In the example of FIG. 35, the Pad Code is inserted between the third pixel data and the fourth pixel data from the beginning, between the sixth pixel data and the seventh pixel data, and between the twelfth pixel data and the thirteenth pixel data. In this manner, the Pad Code is inserted at the same position in the payload data of each lane of the Lanes 0 to 7.

The Pad Code is inserted into the payload data assigned to the Lane 0 by the control code insertion unit 191 of the signal processing unit 183-0. Similarly, the Pad Code is inserted in the payload data assigned to the other lanes in the signal processing units 183-1 to 183-N at the same timing. The number of Pad Codes is determined on the basis of the difference between the pixel data band and the PHY transmission band, the frequency of the clock signal generated by the clock generation unit 182, and the like.

In this manner, the Pad Code is inserted to adjust the difference between the two bands in a case where the pixel data band is narrow and the PHY transmission band is wide. For example, by inserting the Pad Code, the difference between the pixel data band and the PHY transmission band is adjusted so as to be within a certain range.

Returning to the description of FIG. 33, the Sync Code is a group of symbols used to secure bit synchronization and symbol synchronization between the transmission unit 122 and the reception unit 131. The Sync Code is represented by two symbols, K28.5 and Any . Any  represents that any kind of symbol may be used. The Sync Code is repeatedly transmitted, for example, in the training mode before transmission of packet data is started between the transmission unit 122 and the reception unit 131.

The Deskew Code is a group of symbols used for correcting a Data Skew between lanes, that is, a deviation in reception timing of data received in each lane of the reception unit 131. The Deskew Code is represented by two symbols, K28.5 and Any **. The correction of the Data Skew between lanes using the Deskew Code will be described later.

The Standby Code is a group of symbols used to notify the reception unit 131 that output of the transmission unit 122 is in a state of High-Z (high impedance) or the like and data transmission is no longer performed. That is, the Standby Code is transmitted to the reception unit 131 when transmission of packet data is finished and the Standby state is reached. The Standby Code is represented by two symbols, K28.5 and Any **.

The control code insertion unit 191 outputs packet data to which such a control code is added to the 8B10B symbol encoder 192.

Figure 36:
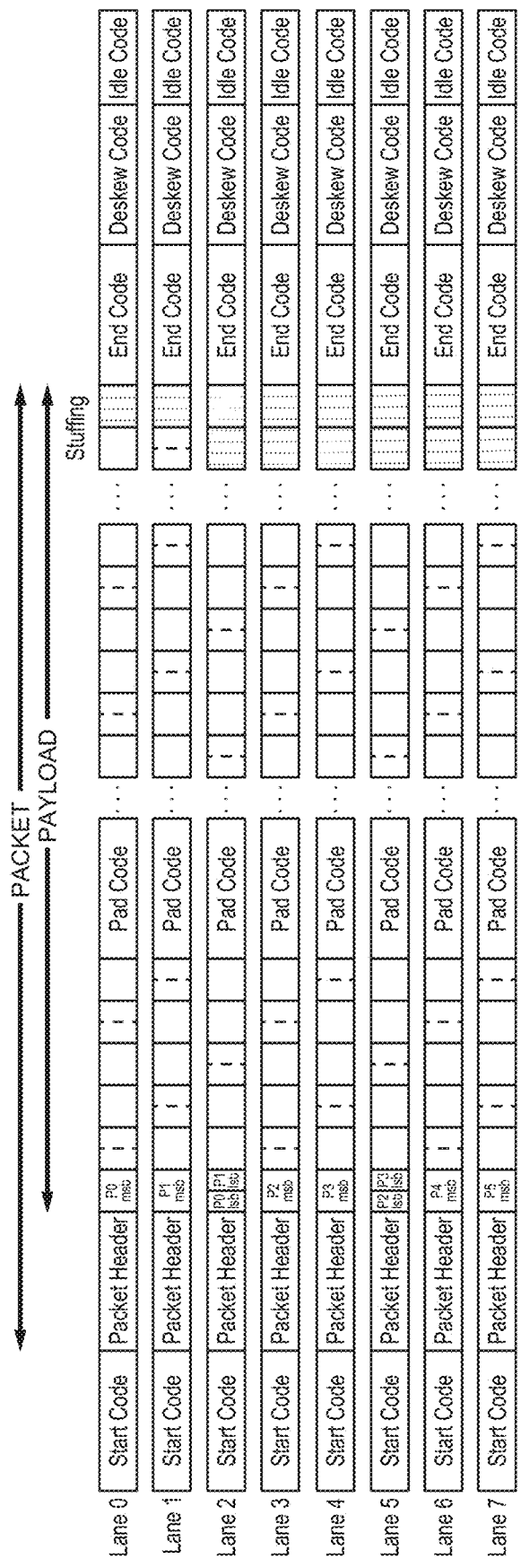
FIG. 36 is a diagram depicting an example of packet data after insertion of a control code.

FIG. 36 is a diagram depicting an example of packet data after insertion of the control code.

As depicted in FIG. 36, in each of the signal processing units 183-0 to 183-N, the Start Code is added before packet data, and the Pad Code is inserted in the payload data. The End Code is added after the packet data, and the Deskew Code is added after the End Code. In the example of FIG. 36, the Idle Code is added after the Deskew Code.

The 8B10B symbol encoder 192 performs 8B10B conversion on the packet data (packet data to which a control code is added) supplied from the control code insertion unit 191, and outputs the packet data converted into data in 10-bit units to the synchronization unit 193.

The synchronization unit 193 outputs each bit of the packet data supplied from the 8B10B symbol encoder 192 to the transmission unit 194 according to the clock signal generated by the clock generation unit 182. Note that the transmission unit 122 may not be provided with the synchronization unit 193. In this case, the packet data output from the 8B10B symbol encoder 192 is supplied to the transmission unit 194 as it is.

The transmission unit 194 transmits the packet data supplied from the synchronization unit 193 to the reception unit 131 via the transmission line constituting the Lane 0. In a case where data transmission is performed using eight lanes, the packet data is transmitted to the reception unit 131 also using the transmission lines constituting the Lanes 1 to 7.

<Configuration of Physical Layer of Reception Unit 131>

Next, the configuration of the physical layer of the reception unit 131 will be described.

The reception unit 131 is provided with a PHY-RX state control unit 201 and signal processing units 202-0 to 202-N as a configuration of the physical layer. The signal processing unit 202-0 includes a reception unit 211, a clock generation unit 212, a synchronization unit 213, a symbol synchronization unit 214, a 10B8B symbol decoder 215, a skew correction unit 216, and a control code removal unit 217.

The decoder 12 that performs decoding described with reference to FIGS. 1 to 13 can be used instead of the 10B8B symbol decoder 215. A case of the 10B8B symbol decoder 215 will be described first, and a case where the decoder 12 is used instead of the 10B8B symbol decoder 215 will be described with reference to FIG. 42 and subsequent drawings.

The packet data transmitted via the transmission line constituting the Lane 0 is input to the signal processing unit 202-0, and the packet data transmitted via the transmission line constituting the Lane 1 is input to the signal processing unit 202-1. Furthermore, the packet data transmitted via the transmission line constituting the Lane N is input to the signal processing unit 202-N.

In this manner, the physical layer of the reception unit 131 is provided with the same number of signal processing units 202-0 to 202-N as the number of lanes, and processes of packet data transmitted using respective lanes are performed in parallel in the signal processing units 202-0 to 202-N, respectively. A configuration of the signal processing unit 202-0 will be described, but the signal processing units 202-1 to 202-N also have similar configurations.

The reception unit 211 receives a signal representing the packet data transmitted from the transmission unit 122 via the transmission line constituting the Lane 0, and outputs the signal to the clock generation unit 212.

The clock generation unit 212 performs bit synchronization by detecting an edge of the signal supplied from the reception unit 211, and generates a clock signal on the basis of detection periods of edges. The clock generation unit 212 outputs the signal supplied from the reception unit 211 to the synchronization unit 213 together with the clock signal.

The synchronization unit 213 samples signals received by the reception unit 211 according to the clock signal generated by the clock generation unit 212, and outputs packet data obtained by the sampling to the symbol synchronization unit 214. The function of the clock data recovery (CDR) is achieved by the clock generation unit 212 and the synchronization unit 213.

The symbol synchronization unit 214 performs symbol synchronization by detecting a control code included in the packet data or by detecting a part of symbols included in the control code. For example, the symbol synchronization unit 214 detects the K28.5 symbols included in the Start Code, the End Code, and the Deskew Code, and performs symbol synchronization. The symbol synchronization unit 214 outputs packet data in 10-bit units representing each symbol to the 10B8B symbol decoder 215.

Furthermore, the symbol synchronization unit 214 performs symbol synchronization by detecting a boundary of symbols included in the Sync Code repeatedly transmitted from the transmission unit 122 in the training mode before transmission of the packet data is started.

The 10B8B symbol decoder 215 performs the 10B8B conversion on the packet data in 10-bit units supplied from the symbol synchronization unit 214, and outputs the packet data converted into data in eight-bit units to the skew correction unit 216.

The skew correction unit 216 detects the Deskew Code from the packet data supplied from the 10B8B symbol decoder 215. Information of detection timing of the Deskew Code by the skew correction unit 216 is supplied to the PHY-RX state control unit 201.

Furthermore, the skew correction unit 216 corrects the Data Skew between lanes by matching the timing of the Deskew Code with a timing represented by information supplied from the PHY-RX state control unit 201. Information representing the latest timing among the Deskew Code timings detected in each of the signal processing units 202-0 to 202-N is supplied from the PHY-RX state control unit 201.

Figure 37:
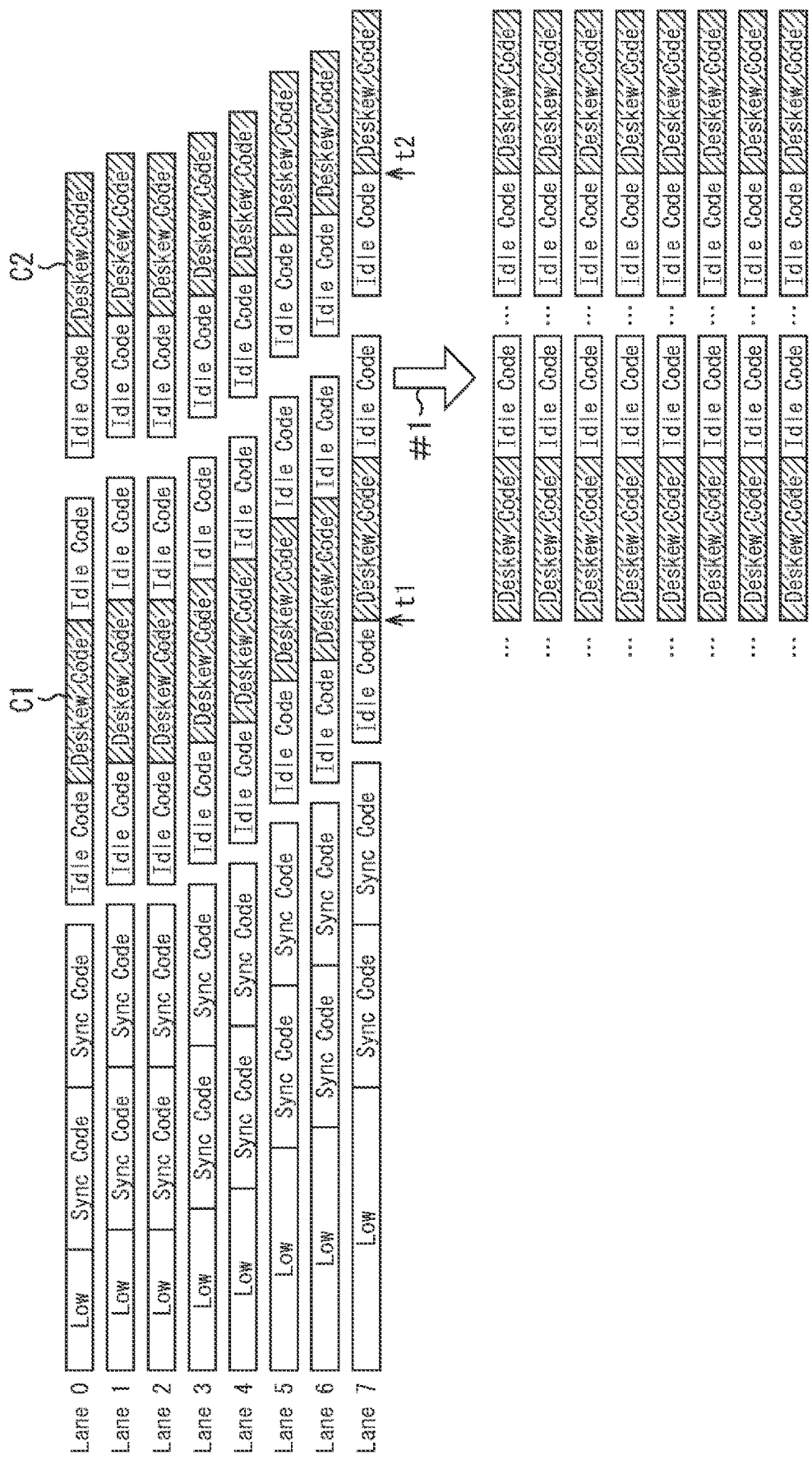
FIG. 37 is a diagram depicting an example of correcting a Data Skew.

FIG. 37 is a diagram depicting an example of correction of the Data Skew between lanes using the Deskew Code.

In the example of FIG. 37, Sync Code, Sync Code, ..., Idle Code, Deskew Code, Idle Code, ..., Idle Code, Deskew Code are transmitted in respective lanes of the Lanes 0 to 7, and respective control codes are received by the reception unit 131. It is a state where reception timing of the same control code is different for every lane, and the Data Skew between lanes is generated.

In this case, the skew correction unit 216 detects the first Deskew Code, Deskew Code C1, and corrects the first timing of the Deskew Code C1 to match time t1 represented by the information supplied from the PHY-RX state control unit 201. The PHY-RX state control unit 201 supplies information of the time t1 when the Deskew Code C1 is detected in the Lane 7, which is the latest timing among the timings when the Deskew Code C1 is detected in each lane of the Lanes 0 to 7.

Furthermore, the skew correction unit 216 detects the second Deskew Code, Deskew Code C2, and corrects the first timing of the Deskew Code C2 to match time t2 represented by the information supplied from the PHY-RX state control unit 201. The PHY-RX state control unit 201 supplies information of the time t2 when the Deskew Code C2 is detected in the Lane 7, which is the latest timing among the timings when the Deskew Code C2 is detected in each lane of the Lanes 0 to 7.

By performing similar processing in each of the signal processing units 202-1 to 202-N, the Data Skew between lanes is corrected as indicated ahead of arrow #1 in FIG. 37.

The skew correction unit 216 outputs packet data corrected by the Data Skew to the control code removal unit 217.

The control code removal unit 217 removes the control code added to the packet data, and outputs data between the Start Code and the End Code to the link layer as packet data.

The PHY-RX state control unit 201 controls each unit of the signal processing units 202-0 to 202-N to perform correction of the Data Skew between lanes, or the like. Furthermore, in a case where the control code is lost due to a transmission error in a predetermined lane, the PHY-RX state control unit 201 adds a control code transmitted in another lane in place of the lost control code, thereby performing error correction for the control code.

<Configuration of Link Layer of Reception Unit 131>

Next, the configuration of the link layer of the reception unit 131 will be described.

The reception unit 131 is provided with a LINK-RX protocol management unit 221, a lane integration unit 222, a packet separation unit 223, a payload error correction unit 224, and a Byte to Pixel conversion unit 225 as the configuration of the link layer. The LINK-RX protocol management unit 221 includes a state control unit 231, a header error correction unit 232, a data removal unit 233, and a footer error detection unit 234.

The lane integration unit 222 integrates packet data supplied from the signal processing units 202-0 to 202-N of the physical layer by rearranging the packet data in a reverse order of the distribution order to each lane by the lane distribution unit 165 of the transmission unit 122.

For example, in a case where the packet data is distributed by the lane distribution unit 165 as indicated ahead of arrow #1 in FIG. 32, the packet data in each lane is integrated to acquire the packet data on the left side in FIG. 32. When the packet data of each lane is integrated, the lane stuffing data is removed by the lane integration unit 222 according to control of the data removal unit 233. The lane integration unit 222 outputs the integrated packet data to the packet separation unit 223.

The packet separation unit 223 separates the packet data for one packet integrated by the lane integration unit 222 into packet data constituting header data and packet data constituting payload data. The packet separation unit 223 outputs the header data to the header error correction unit 232 and outputs the payload data to the payload error correction unit 224.

Furthermore, in a case where the packet includes a footer, the packet separation unit 223 separates the data for one packet into packet data constituting header data, packet data constituting payload data, and packet data constituting footer data. The packet separation unit 223 outputs the header data to the header error correction unit 232 and outputs the payload data to the payload error correction unit 224. Furthermore, the packet separation unit 223 outputs the footer data to the footer error detection unit 234.

In a case where a parity is inserted in the payload data supplied from the packet separation unit 223, the payload error correction unit 224 detects an error in the payload data by performing an error correction operation on the basis of the parity, and corrects the detected error. For example, in a case where the parity is inserted as depicted in FIG. 28, the payload error correction unit 224 uses the two parities inserted at the end of the first Basic Block and performs error correction for 224 pieces of pixel data located before the parity.

The payload error correction unit 224 outputs the pixel data after error correction obtained by performing error correction for each Basic Block and Extra Block to the Byte to Pixel conversion unit 225. In a case where the parity is not inserted in the payload data supplied from the packet separation unit 223, the payload data supplied from the packet separation unit 223 is output to the Byte to Pixel conversion unit 225 as it is.

The Byte to Pixel conversion unit 225 removes payload stuffing data included in the payload data supplied from the payload error correction unit 224 according to control of the data removal unit 233.

Furthermore, the Byte to Pixel conversion unit 225 performs the Byte to Pixel conversion that converts the data of each pixel in byte units obtained by removing the payload stuffing data into pixel data in eight-bit, 10-bit, 12-bit, 14-bit, or 16-bit units. In the Byte to Pixel conversion unit 225, conversion opposite to the Pixel to Byte conversion by the Pixel to Byte conversion unit 162 of the transmission unit 122 described with reference to FIGS. 21 to 25 is performed.

The Byte to Pixel conversion unit 225 outputs pixel data in eight-bit, 10-bit, 12-bit, 14-bit, or 16-bit units obtained by the Byte to Pixel conversion to the frame data output unit 241. In the frame data output unit 241, for example, each line of effective pixels specified by the Line Valid of the header information is generated on the basis of the pixel data obtained by the Byte to Pixel conversion unit 225, and each line is arranged according to the Line Number of the header information, thereby generating an image of one frame.

The state control unit 231 of the LINK-RX protocol management unit 221 manages the state of the link layer of the reception unit 131.

The header error correction unit 232 acquires three sets of header information and CRC code on the basis of the header data supplied from the packet separation unit 223. The header error correction unit 232 performs, for each set of the header information and the CRC code, an error detection operation that is an operation for detecting an error in the header information by using the CRC code of the same set as the header information.

Furthermore, the header error correction unit 232 estimates correct header information on the basis of at least one of an error detection result of the header information of each set or a comparison result of data obtained by the error detection operation, and outputs header information estimated to be correct and a decoding result. The data obtained by the error detection operation is a value obtained by applying a CRC generation polynomial to the header information. Furthermore, the decoding result is information representing success or failure of decoding.

The three sets of header information and CRC code are set as a set 1, a set 2, and a set 3, respectively. In this case, the header error correction unit 232 acquires whether or not there is an error in the header information of the set 1 (error detection result) by the error detection operation for the set 1, and data 1 obtained by the error detection operation. Furthermore, the header error correction unit 232 acquires whether or not there is an error in the header information of the set 2 by the error detection operation for the set 2, and data 2 obtained by the error detection operation. The header error correction unit 232 acquires whether or not there is an error in the header information of the set 3 by the error detection operation for the set 3, and data 3 obtained by the error detection operation.

Furthermore, the header error correction unit 232 determines whether or not the data 1 and the data 2 match, whether or not the data 2 and the data 3 match, and whether or not the data 3 and the data 1 match.

For example, in a case where no errors are detected by all error detection operations for the set 1, the set 2, and the set 3 and all comparison results of data obtained by the error detection operation match, the header error correction unit 232 selects information representing successful decoding as a decoding result. Furthermore, the header error correction unit 232 estimates that all the header information is correct, and selects one of the header information of the set 1, the header information of the set 2, and the header information of the set 3 as output information.

On the other hand, in a case where no errors are detected only by the error detection operation for the set 1, the header error correction unit 232 selects information representing success of decoding as a decoding result and estimates that the header information of the set 1 is correct, and selects the header information of the set 1 as output information.

Furthermore, in a case where no errors are detected only by the error detection operation for the set 2, the header error correction unit 232 selects information representing success of decoding as a decoding result and estimates that the header information of the set 2 is correct, and selects the header information of the set 2 as output information.

In a case where no errors are detected only by the error detection operation for the set 3, the header error correction unit 232 selects information representing success of decoding as a decoding result and estimates that the header information of the set 3 is correct, and selects the header information of the set 3 as output information.

The header error correction unit 232 outputs the decoding result and the output information selected as described above to the register 242 to have them stored. In this manner, the error correction of the header information by the header error correction unit 232 is performed by detecting the header information without an error from a plurality of pieces of header information by using the CRC code and outputting the detected header information.

The data removal unit 233 controls the lane integration unit 222 to remove the lane stuffing data, and controls the Byte to Pixel conversion unit 225 to remove the payload stuffing data.

The footer error detection unit 234 acquires a CRC code stored in the footer on the basis of the footer data supplied from the packet separation unit 223. The footer error detection unit 234 performs an error detection operation using the acquired CRC code and detects an error in the payload data. The footer error detection unit 234 outputs an error detection result to have it stored in the register 242.

<Operation of Image Sensor 111 and DSP 112>

Next, a series of processes of the transmission unit 122 and the reception unit 131 having the configurations as above will be described.

Figure 38:
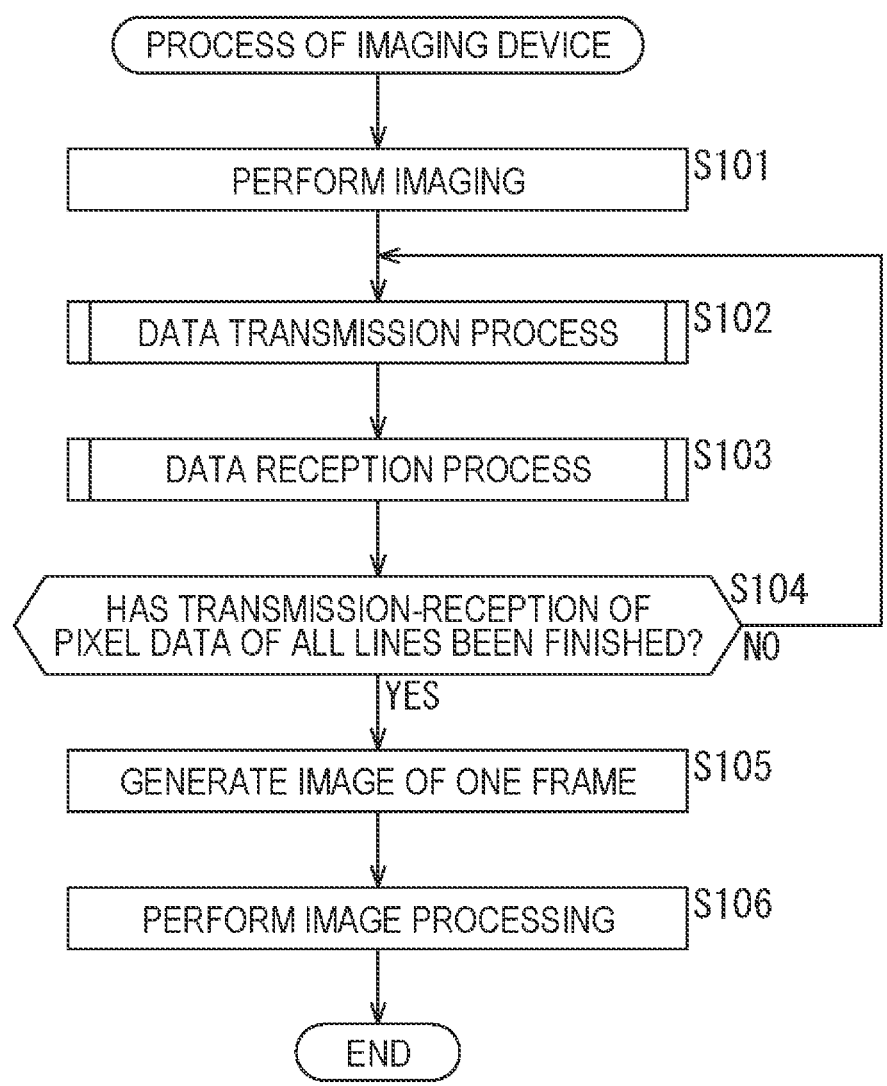
FIG. 38 is a flowchart describing a process of an imaging device.

First, operation of an imaging device having the transmission system 100 will be described with reference to a flowchart of FIG. 38. The process of FIG. 38 is started when an instruction to start imaging is given, for example, by pressing a shutter button provided on the imaging device, or the like.

In step S101, the image pickup unit 121 of the image sensor 111 performs imaging. The frame data input unit 152 (FIG. 17) of the image pickup unit 121 outputs pixel data constituting an image of one frame obtained by image-capturing in order for every piece of data of one pixel.

In step S102, a data transmission process is performed by the transmission unit 122. The data transmission process generates a packet in which pixel data for one line is stored in a payload, and packet data constituting the packet is transmitted to the reception unit 131. The data transmission process will be described later with reference to a flowchart of FIG. 39.

In step S103, a data reception process is performed by the reception unit 131. By the data reception process, the packet data transmitted from the transmission unit 122 is received, and the pixel data stored in the payload is output to the image processing unit 132. The data reception process will be described later with reference to a flowchart of FIG. 40.

The data transmission process performed by the transmission unit 122 in step S102 and the data reception process performed by the reception unit 131 in step S103 are alternately performed for one line of pixel data. That is, when one line of pixel data has been transmitted by the data transmission process, the data reception process is performed, and when one line of pixel data has been received by the data reception process, the data transmission process for the next one line of pixel data is performed. The data transmission process by the transmission unit 122 and the data reception process by the reception unit 131 may be performed temporally in parallel as appropriate. In step S104, the frame data output unit 241 of the image processing unit 132 determines whether or not the transmission-reception of pixel data of all the lines constituting the image of one frame has been finished and, in a case where it is determined that the transmission-reception has not been finished, repeats the processes of step S102 and thereafter.

In a case where it is determined in step S104 that the transmission-reception of pixel data of all lines constituting the image of one frame has been finished, in step S105, the frame data output unit 241 of the image processing unit 132 generates an image of one frame on the basis of the pixel data supplied from the reception unit 131.

In step S106, the image processing unit 132 performs image processing using the image of one frame and finishes the processing.

Next, the data transmission process performed in step S102 of FIG. 38 will be described with reference to a flowchart of FIG. 39.

In step S111, the header generation unit 172 generates header information including Frame Start, Frame End, Line Valid, Line Number, and Reserved.

In step S112, the header generation unit 172 applies the header information to the generation polynomial to calculate the CRC code.

In step S113, the header generation unit 172 generates a set of header information and CRC code by adding a CRC code to the header information, and generates the header by repeatedly arranging three sets of the same header information and CRC code.

In step S114, the Pixel to Byte conversion unit 162 acquires pixel data supplied from the frame data input unit 152 and performs the Pixel to Byte conversion. The Pixel to Byte conversion unit 162 outputs the payload data generated by grouping the pixel data in byte units obtained by the Pixel to Byte conversion, adding the payload stuffing data, and the like. A parity is inserted into the payload data by the payload ECC insertion unit 163 as appropriate.

In step S115, the packet generation unit 164 generates a packet on the basis of the payload data including pixel data for one line and the header generated by the header generation unit 172, and outputs the packet data constituting one packet.

In step S116, the lane distribution unit 165 assigns the packet data supplied from the packet generation unit 164 to a plurality of lanes used for data transmission.

In step S117, the control code insertion unit 191 adds the control code to the packet data supplied from the lane distribution unit 165.

In step S118, the 8B10B symbol encoder 192 performs 8B10B conversion of the packet data to which the control code is added, and outputs the packet data converted into data in 10-bit units.

In step S119, the synchronization unit 193 outputs the packet data supplied from the 8B10B symbol encoder 192 according to the clock signal generated by the clock generation unit 182, and causes the transmission unit 194 to transmit the packet data. The processes of steps S117 to S119 are performed in parallel by the signal processing units 183-0 to 183-N. When the transmission of pixel data for one line is finished, the processing returns to step S102 in FIG. 38 and the processes of step S102 and thereafter are performed.

Next, the data reception process performed in step S103 of FIG. 38 will be described with reference to a flowchart of FIG. 40.

In step S131, the reception unit 211 receives a signal representing the packet data transmitted from the transmission unit 122. The processes of steps S131 to S136 are performed in parallel by the signal processing units 202-0 to 202-N.

In step S132, the clock generation unit 212 performs bit synchronization by detecting an edge of the signal supplied from the reception unit 211. The synchronization unit 213 samples the signal received by the reception unit 211 and outputs packet data to the symbol synchronization unit 214.

In step S133, the symbol synchronization unit 214 performs symbol synchronization by detecting a control code included in the packet data, or the like.

In step S134, the 10B8B symbol decoder 215 performs the 10B8B conversion on the packet data after the symbol synchronization, and outputs packet data converted into data in eight-bit units.

In step S135, the skew correction unit 216 detects the Deskew Code, and as described above, corrects the Data Skew between lanes so as to align the timing of the Deskew Code with a timing represented by information supplied from the PHY-RX state control unit 201.

In step S136, the control code removal unit 217 removes the control code added to the packet data.

In step S137, the lane integration unit 222 integrates the packet data supplied from the signal processing units 202-0 to 202-N.

In step S138, the packet separation unit 223 separates the packet data integrated by the lane integration unit 222 into packet data constituting the header data and packet data constituting the payload data.

In step S139, the header error correction unit 232 performs an error detection operation using the CRC code for each set of the header information and the CRC code included in the header data separated by the packet separation unit 223. Furthermore, the header error correction unit 232 selects and outputs error-free header information on the basis of an error detection result of each set and a comparison result of data obtained by the error detection calculation.

In step S140, the Byte to Pixel conversion unit 225 performs Byte to Pixel conversion of the payload data and outputs pixel data in eight-bit, 10-bit, 12-bit, 14-bit, or 16-bit units. For the payload data to be converted by Byte to Pixel, error correction using a parity is appropriately performed by the payload error correction unit 224.

When the processing of pixel data for one line is finished, the processing returns to step S103 in FIG. 38 and the processes of step S103 and thereafter are performed.

Data transmission between the image sensor 111 and the DSP 112 is performed using a packet format in which one line of one frame corresponds to one packet as described above.

The packet format used for data transmission between the image sensor 111 and the DSP 112 can be said to be a format that minimizes transmission of header information and control codes indicating packet boundaries, such as Start Code and End Code, and makes it possible to prevent decrease in transmission efficiency. If a packet format is employed in which pixel data stored in the payload of one packet is less than one line, it is necessary to transmit more packets in order to transmit pixel data of the entire one frame, and transmission efficiency decreases by increases in the numbers of pieces of header information and control codes to be transmitted.

Furthermore, it is possible to suppress transmission latency by preventing decrease in transmission efficiency, and it is possible to achieve a high pixel/high frame rate interface that needs high-speed transmission of a large amount of image data.

By employing a packet format that is premised on increasing reliability and redundancy of transmission and performing error correction on the reception unit 131 side, it is possible to secure measures against transmission errors in header information. Since transmission of Frame/Line (V/H) synchronization information or the like is performed using header information, if the header information is lost due to a transmission error, it may cause a major problem in the system, but such a problem can be prevented.

Furthermore, it is also possible to suppress increase in mounting cost and power consumption for ensuring measures against transmission errors of header information. That is, the packet format used for data transmission between the image sensor 111 and the DSP 112 has a CRC code added so that the DSP 112 can detect the presence or absence of a transmission error in the header information. Furthermore, by transmitting three sets of header information and CRC code, it is possible to correct the header information to the correct header information in the DSP 112 in a case where a transmission error of the header information occurs.

If the error correction code is used as a measure against transmission errors of header information, it becomes necessary to prepare a circuit for calculating the error correction code in the transmission unit 122, and prepare a circuit for performing the error correction operation in the reception unit 131. Since it is the CRC code, which is an error detection code, which is added to the header information, the circuit scale and power consumption can be reduced as compared with the cases where a circuit for performing an operation related to error correction is prepared. Furthermore, since the reception unit 131 does not request the transmission unit 122 to retransmit the header information in a case where an error in the header information is detected, it is not necessary to prepare a transmission line in the reverse direction for the retransmitting request.

By increasing the redundancy and configuring the control code by combining multiple K Characters of the 8B10B code, the error probability of the control code can be reduced, and thus it becomes possible to secure measures against transmission errors for the control code with a relatively simple circuit.

Specifically, three types of K Characters are used in combination of four symbols for the Start Code, but if at least a symbol other than K28.5 can be detected, the Start Code can be specified by the reception unit 131, and it can be said that the resistance against transmission errors is high. The same applies to the End Code.

Furthermore, although four types of K Characters are used in combination for the Pad Code, by assigning more types of K Characters than other control codes, it is possible to improve error resistance compared to other control codes. That is, if one of the four types of symbols can be detected, the Pad Code can be specified by the reception unit 131. Since the Pad Code has a higher transmission frequency than the Start Code, the End Code, and the like, it is given a structure that can further improve error resistance.

Moreover, by transmitting the same control code to every lane at the same timing, even if a transmission error occurs in one lane and the control code is lost, the control code that has become an error can be reproduced using the control code of another lane.

Furthermore, since the number of K Characters is limited, each of the control codes is configured by combining minimum necessary K Characters. For example, for the Sync Code, the Deskew Code, and the Standby Code, which can relatively tolerate transmission errors by repeatedly transmitting, a data structure that does not require to assign an additional K Character is used.

Since the control code necessary for resynchronization is assigned to every packet (one line), resynchronization can be performed quickly in a case where the bit synchronization is lost due to disturbance such as static electricity or noise. Furthermore, the influence of transmission error due to loss of synchronization can be minimized.

Specifically, the bit synchronization can be performed by detecting a transition or edge of the bit data after the 8B10B conversion in the CDR implemented by the clock generation unit 212 and the synchronization unit 213. If the transmission unit 122 continues to send data, the bit synchronization can be achieved within the period assumed as a CDR lock time.

Furthermore, even in a case where the symbol synchronization is lost, resynchronization can be quickly performed by detecting a specific K Character (K28.5) in the symbol synchronization unit 214. Since K28.5 is used for each of the Start Code, the End Code, and the Deskew Code, it is possible to perform symbol synchronization at three locations during a transmission period of packet data for one packet.

Furthermore, it is also possible to perform synchronization between lanes by making it possible to correct the Data Skew between lanes using the Deskew Code.

In the link layer, by allowing respective pieces of packet data to be processed in parallel in groups such as 16 pieces each (in the case of the example of FIG. 26, in 16-byte units), as compared to a case where packet data is processed one by one in one clock cycle, the circuit scale and the amount of memory can be suppressed. In terms of mounting, between a case of processing the packet data one by one and a case of processing them collectively for every predetermined unit, the latter can reduce the circuit scale and the like. By reducing the circuit scale, it is also possible to reduce power consumption.

Furthermore, upon assigning lanes, error resistance can be improved by assigning continuous packet data to different lanes. Even in a case where an error occurs across a number of consecutive pieces of packet data that exceeds the error correction capability by parity in a certain lane, the position of the packet data in which the error has occurred will be distributed due to lane coupling performed in the reception unit 131, and it may be possible to correct error using the parity. The error correction capability by parity is determined by parity length.

Moreover, the circuit scale of the transmission unit 122 and the reception unit 131 can be reduced by performing ECC processing higher than lane distribution or lane integration with the side closer to the physical layer being the lower level. For example, in the transmission unit 122, in a case where an ECC parity is inserted into the payload after the packet data is assigned to each lane, it is necessary to prepare the payload ECC insertion unit 163 for every lane, and the circuit scale increases but such a thing can be prevented.

In the physical layer, parallel processing of packet data is performed by multiple circuits, but by sharing the PHY-TX state control unit 181 and clock generation unit 182, the circuit can be simplified as compared to cases where those circuits are prepared for every lane. Furthermore, by using a protocol that does not transmit a different control code for every lane, it is possible to simplify the circuit that processes the packet data of each lane.

<Switching Number of Lanes>

Transmission of the same control code in respective lanes at the same timing is performed not only during normal data transmission but also, for example, in a case of switching the number of lanes. Even in a case of switching the number of lanes, all states of active lanes (lanes used for data transmission) are the same.

Figure 41:
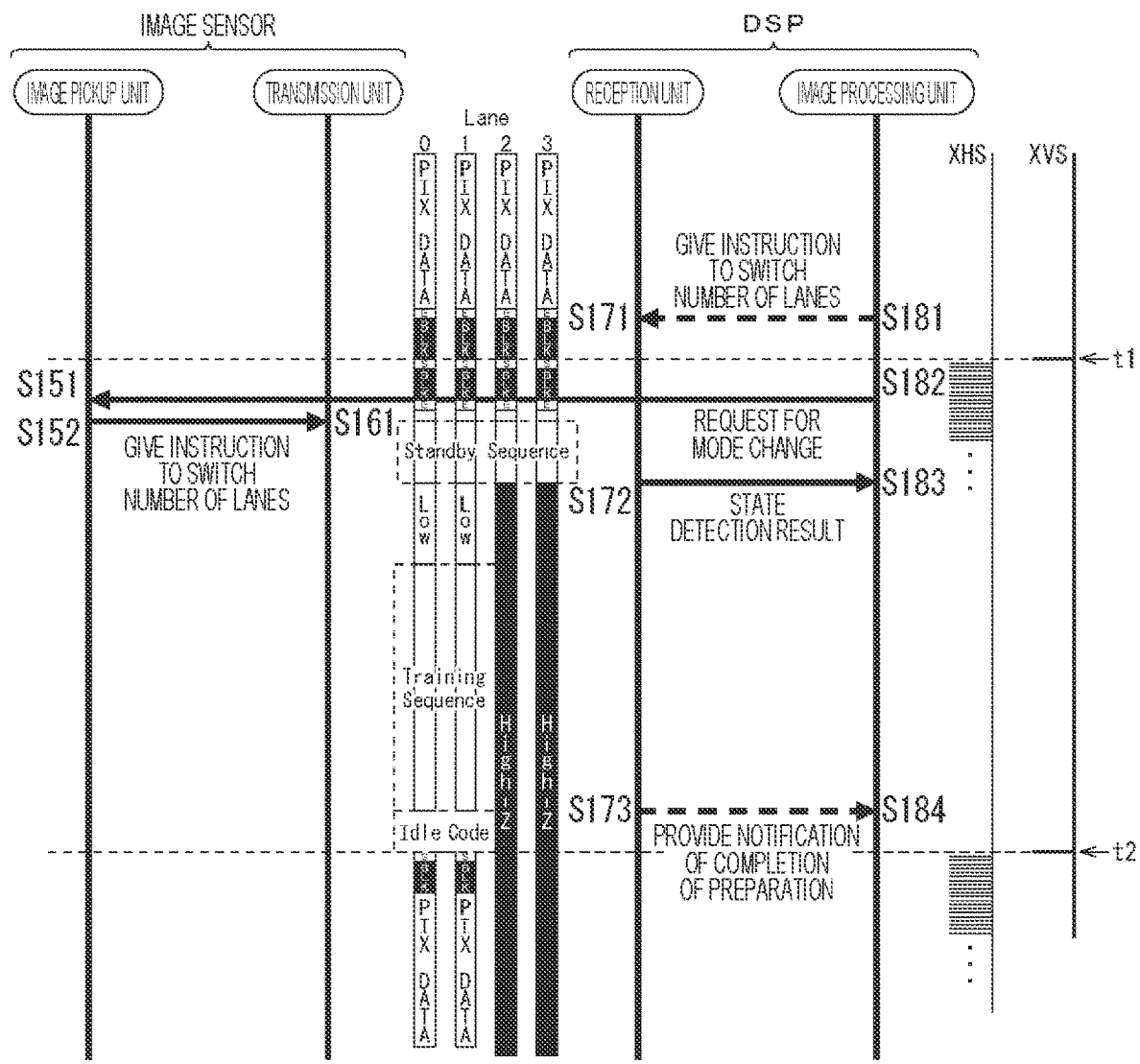
FIG. 41 is a diagram depicting a control sequence in a case of switching the number of lanes.

FIG. 41 is a diagram depicting a control sequence in a case of switching the number of lanes.

Timings of a vertical synchronization signal (XVS) and a horizontal synchronization signal (XHS) are depicted on the right side of FIG. 41. A case will be described in which the pixel data of each line that constitutes the image of one frame is transmitted according to the horizontal synchronization signal until time t1 when the vertical synchronization signal is detected, and the active lanes are changed from four lanes to two lanes at the timing of time t1. Until time t1, data transmission is performed using four lanes.

The state of each lane is depicted in a vertical direction in a substantially center of FIG. 41. "PIX DATA" represents that pixel data is being transmitted in the lane to which these characters are attached. "E", "BLK", and "S" following "PIX DATA" represent Frame End, blanking period, and Frame Start, respectively.

In a case where transmission of pixel data of the frame to be transmitted is finished in the one frame period up to the time t1, in step S181, the image processing unit 132 instructs the reception unit 131 to switch the number of lanes from four to two. The instruction by the image processing unit 132 is received by the reception unit 131 in step S171.

When time t1 is reached, in step S182, the image processing unit 132 requests the image pickup unit 121 of the image sensor 111 for a mode change. The request for mode change transmitted to the image pickup unit 121 also includes information indicating that the number of lanes is switched from four to two. Although not depicted in FIG. 1 and the like, a transmission line is provided between the image pickup unit 121 and the image processing unit 132 for the image processing unit 132 to transmit information on set values related to imaging such as shutter speed and gain to the image pickup unit 121. The request for mode change is also transmitted to the image pickup unit 121 via this transmission line.

In step S151, the image pickup unit 121 receives the request for mode change from the image processing unit 132 and, in step S152, instructs the transmission unit 122 to switch the number of lanes from four to two. The instruction from the image pickup unit 121 is received by the transmission unit 122 in step S161.

A Standby Sequence is performed between the transmission unit 122 and the reception unit 131, and the Standby Code is repeatedly transmitted from the transmission unit 122 to the reception unit 131 using the Lanes 0 to 3. When the Standby Sequence is finished, a state detection result is output from the reception unit 131 in step S172, and is received by the image processing unit 132 in step S183. Furthermore, the Lane 0 and Lane 1 that maintain the active state are in a Low state, and the Lane 2 and Lane 3 that finish the data transmission are in a High-Z state.

A Training Sequence is performed between the transmission unit 122 and the reception unit 131, and the Sync Code is repeatedly transmitted from the transmission unit 122 to the reception unit 131 using the Lane 0 and Lane 1. The bit synchronization is ensured in the reception unit 131, and the symbol synchronization is ensured by detecting the Sync Code.

When the Training Sequence is finished, in step S173, the reception unit 131 notifies the image processing unit 132 that the preparation has been completed. The notification by the reception unit 131 is received by the image processing unit 132 in step S184, and a series of control sequences in a case of switching the number of lanes ends.

In this manner, in the control sequence of switching the number of lanes, the Standby Code is transmitted at a time of Standby Sequence even in the Lanes 2 and 3 that finish the data transmission so that it is in the same state as the Lanes 0 and 1 used for data transmission continuously. For example, for the Lanes 2 and 3, it is conceivable to keep the state in High-Z as it is without transmitting the Standby Code, but the state will be different from the lane that is continuously used for data transmission, and the control will be complicated.

<Other Configurations of Transmission Unit 122 and Reception Unit 131>

Figure 42:
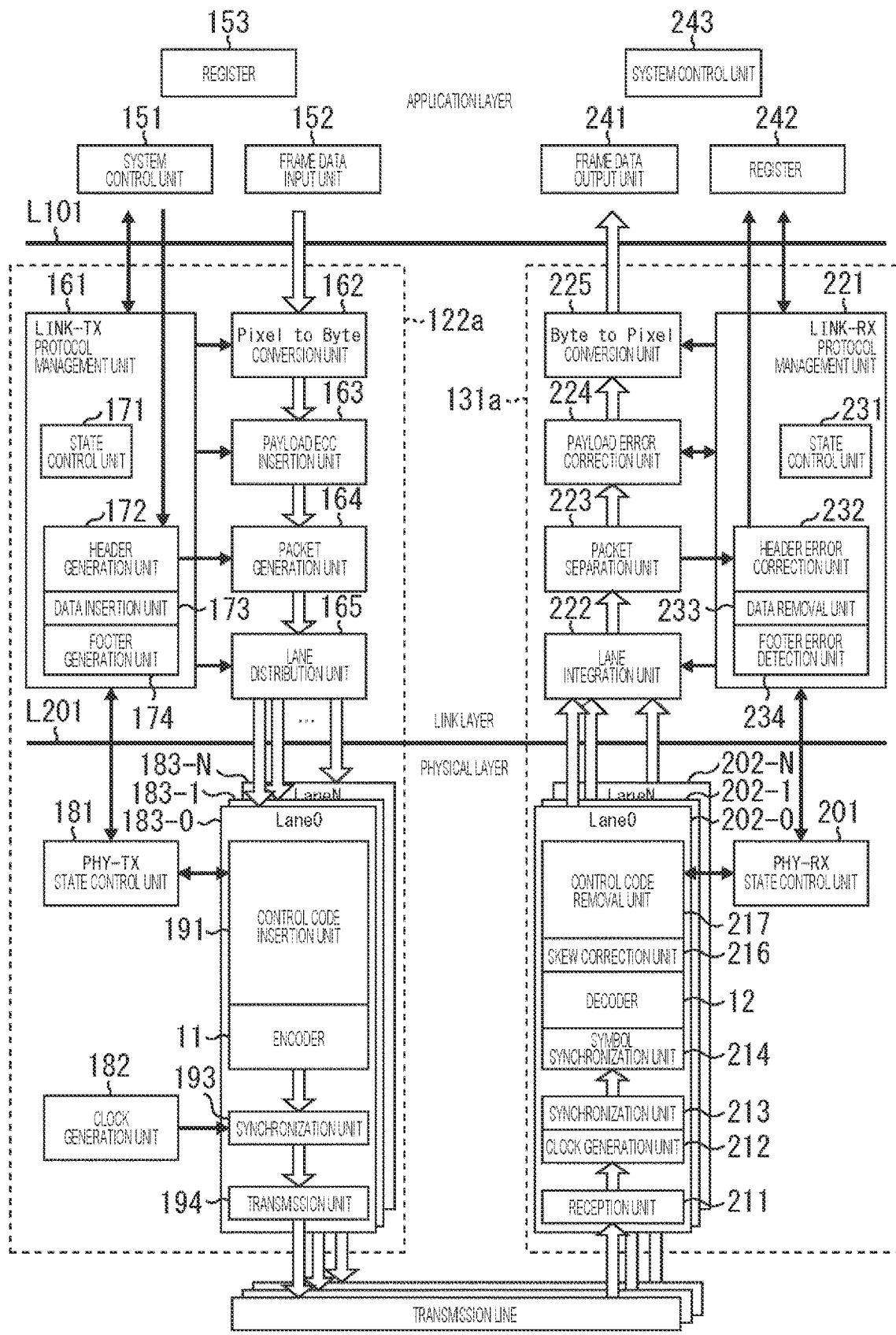
FIG. 42 is a diagram depicting another configuration example of the transmission system.

FIG. 42 is a diagram depicting other configuration examples of the transmission unit 122 and the reception unit 131. In order to distinguish from the transmission unit 122 depicted in FIG. 17, the transmission unit depicted in FIG. 42 is described as a transmission unit 122a. Similarly, in order to distinguish from the reception unit 131 depicted in FIG. 17, the transmission unit depicted in FIG. 42 is described as a reception unit 131a.

Comparing the transmission unit 122 depicted in FIG. 17 and the transmission unit 122a depicted in FIG. 42, there is a difference in that the 8B10B symbol encoder 192 of the transmission unit 122 is changed to the encoder 11, and other parts are similarly configured. Comparing the reception unit 131 depicted in FIG. 17 and the reception unit 131a depicted in FIG. 42, there is a difference in that the 10B8B symbol decoder 215 of the reception unit 131 is changed to the decoder 12, and other parts are similarly configured. Similar parts are denoted by the same reference numerals, and the description thereof will be omitted.

The encoder 11 and the decoder 12 described with reference to FIGS. 1 to 13 can be applied to the transmission system 100 that performs transmission and reception according to the SLVS-EC standard. Specifically, as depicted in FIG. 42, the encoder 11 can be applied to a portion that encodes data included in the signal processing unit 183 in the transmission unit 122a. Furthermore, as depicted in FIG. 42, the decoder 12 can be applied to a portion that decodes data included in the signal processing unit 202 in the reception unit 131a.

Even in a case where the encoder 11 and the decoder 12 are applied to the transmission system 100 that performs transmission and reception according to the SLVS-EC standard, encoding and decoding are performed as described with reference to FIGS. 1 to 13, and thus the description thereof will be omitted. Here, more specifically, processing of the encoder 11 and the decoder 12 when transmission and reception are performed according to the SLVS-EC standard will be described.

In a case where data is transmitted and received according to the SLVS-EC standard, as depicted in B of FIG. 2, the data is divided into one block of N-bits and one block of M-bits, and processing is performed using one block of N-bits and one block of M-bits as one processing unit. Furthermore, as described with reference to FIGS. 33 and 34, a control code is also input to the encoder 11 (8B10B symbol encoder 192 in FIG. 17) in addition to the data to be transmitted.

Since the control code is a code having a special role of controlling communication unlike data to be transmitted (hereinafter described as information transmission data as appropriate in order to distinguish from the control code), the control code is processed separately from the information transmission data when encoded by the encoder 11.

Figure 43:
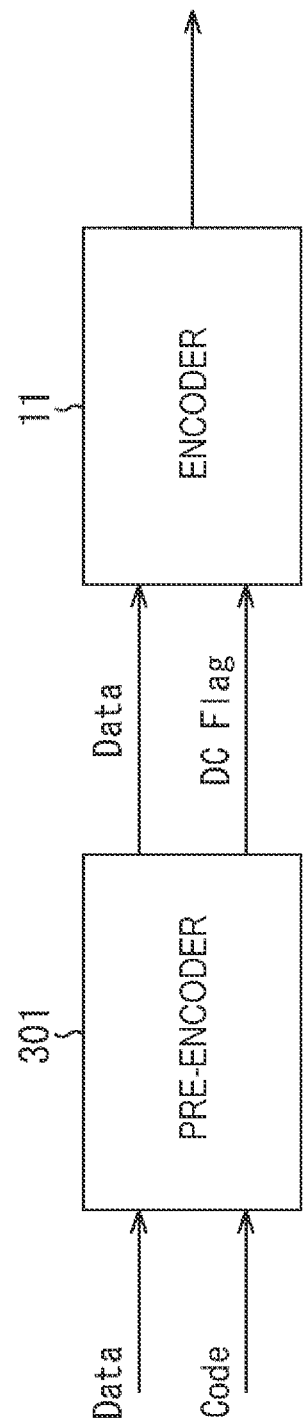
FIG. 43 is a diagram depicting a configuration example of an encoder including a pre-encoder.

As depicted in FIG. 43, a pre-encoder 301 that performs pre-encoding to distinguish the control code and the information transmission data or perform processing of dividing into N bits or M bits is added to a portion before the encoder 11. Note that, in FIG. 43, the pre-encoder 301 and the encoder 11 are illustrated as separate bodies, but the pre-encoder 301 may be included in a part of the encoder 11.

To the pre-encoder 301, the information transmission data (described as Data in the diagram) is supplied from the lane distribution unit 165 (FIG. 42), and a control code (described as Code in the diagram) is supplied from the control code insertion unit 191. The pre-encoder 301 divides (converts) the input information transmission data or control code into N bits or M bits, and supplies the N bits or the M bits to the encoder 11. Furthermore, the pre-encoder 301 supplies a flag (hereinafter described as a DC flag) indicating whether the supplied data is the information transmission data or the control code to the encoder 11.

Here, FIG. 33 is referred to again. For example, referring to the Start Code as the control code, the Start Code is represented by four symbols of K28.5, K27.7, K28.2, and K27.7, which are combinations of three types of K Characters. Since one symbol is eight bits, the Start Code is a 32-bit code. Similarly, other control codes include 32 bits.

The N bits and the M bits at the time of encoding can be set according to the bit depth of the control code. In a case where the control code is 32 bits, the N bits are set to 31 bits, and the M bits are set to 33 bits. In this case, the (N+M) bits are 64 bits. Furthermore, since the flag of one bit is added to the N bits, one block of N bits becomes 32 bits, and since the flag of one bit is added to the M bits, one block of M bits becomes 34 bits.

In the following description, a case where N=31 and M=33 will be described as an example, but the present technology can be applied to other bit depths. Furthermore, in the following description, the description will be continued using (N+M)=64 bits as one processing unit. Among the 64 bits of one processing unit, 32 bits of the first half input to the pre-encoder 301 are described as a first half block, and 32 bits of the second half are described as a second half block.

A data string converted into N bits (31 bits) by the pre-encoder 301 and output to the encoder 11 is described as a first block, and a data string converted into M bits (33 bits) and output to the encoder 11 is described as a second block.

Here, although the description will be continued on the assumption that the pre-encoder 301 divides the input data in one processing unit into the first block of N bits (31 bits) and then into the second block of M bits (33 bits), the data may be divided into the block of M bits first and then divided into the block of N bits.

To the pre-encoder 301, 64-bit data of the first half block and the second half block is supplied. Since the first half block and the second half block are information transmission data or a control code, there are the following four combinations.

Case 1: the first half block is information transmission data+the second half block is information transmission data Case 2: the first half block is information transmission data+the second half block is control code Case 3: the first half block is control code+the second half block is information transmission data Case 4: the first half block is control code+the second half block is control code Processing of the pre-encoder 301 and the encoder 11 will be described for each of Cases 1 to 4.

<Encoding in Case 1>

Figure 44:
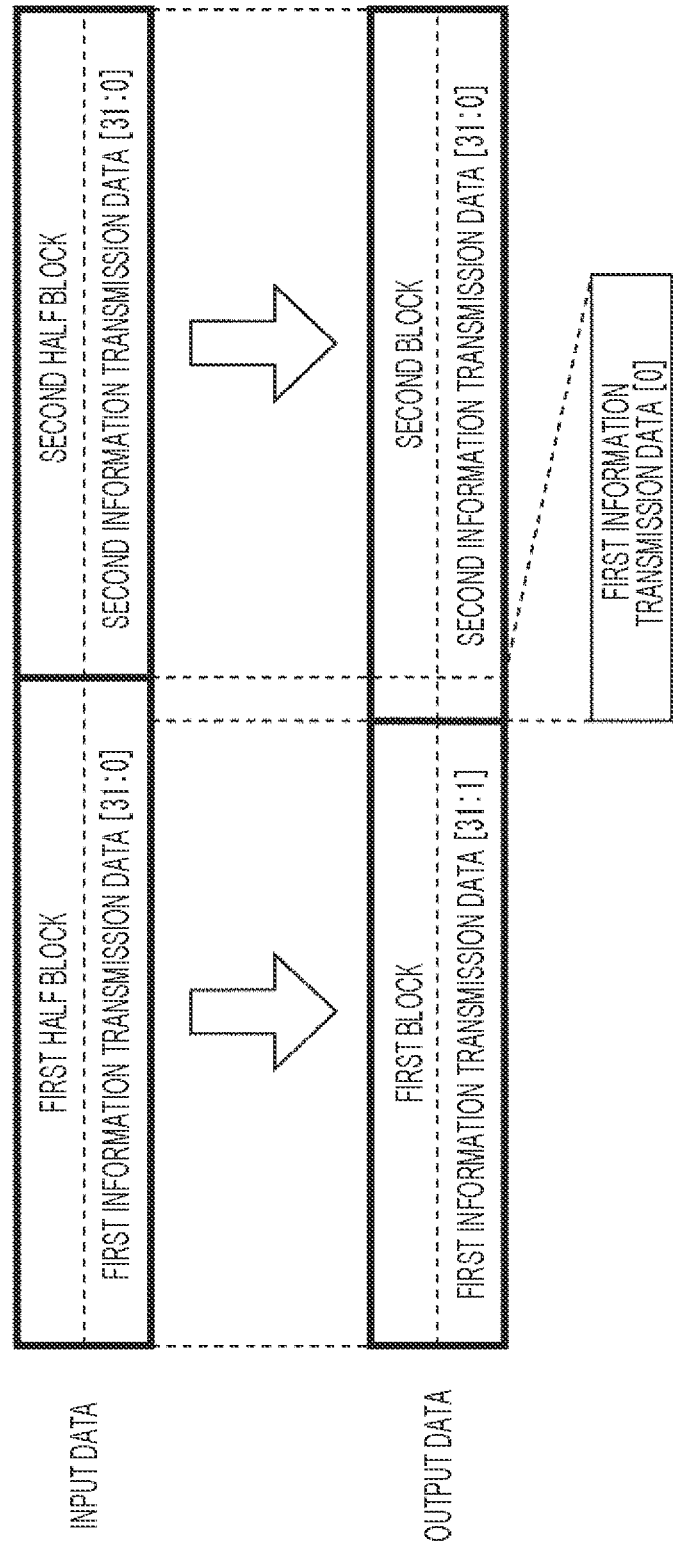
FIG. 44 is a diagram for describing conversion in Case 1.

Pre-encoding and encoding in Case 1 will be described with reference to FIG. 44. Case 1 is a case where all pieces of 64-bit data input to the pre-encoder 301 are information transmission data, and are divided into a first block of the information transmission data and a second block of the information transmission data.

That is, in Case 1, first information transmission data [31:0] as a 32-bit first half block and second information transmission data [31:0] as a 32-bit second half block are input to the pre-encoder 301.

The pre-encoder 301 sets 31-bit information transmission data [31:1] out of the first information transmission data [31:0] of the input 32-bit first half block as the first block, and outputs the first block to the encoder 11.

The pre-encoder 301 distributes first information transmission data [0], which is the last bit of the input 32-bit first information transmission data [31:0], to the second block. Furthermore, 32 bits obtained by adding 33 bits of the second information transmission data [31:0] of the second half block after the first information transmission data [0] are output as the second block to the encoder 11.

In other words, the pre-encoder 301 divides an input 64-bit data string into two of the first information transmission data [31:1] constituting 31 bits of the first half among the input 64 bits, and 33 bits obtained by combining the first information transmission data [0] of the remaining one bit, and the second information transmission data [31:0] constituting 32 bits of the second half among the input 64 bits.

When outputting the first block that is the information transmission data to the encoder 11, the pre-encoder 301 also supplies the DC flag indicating that the first block is the information transmission data to the encoder 11.

In a case where the supplied DC flag indicates that it is the information transmission data, the encoder 11 performs encoding on the supplied data of the first block by controlling the running disparity RD and the run length RL as described with reference to FIGS. 1 to 13. That is, there is executed a process of inverting the data of the first block by the running disparity RD or the run length RL and adding the flag indicating that the data is inverted, or a process of adding, without inverting the data, the flag indicating that the data is not inverted.

Since the first block of 31 bits is processed by the encoder 11 and the flag of one bit is added, the data output from the encoder 11 is 32-bit data.

Similarly, when outputting the second block as the information transmission data to the encoder 11, the pre-encoder 301 also supplies the DC flag indicating that the second block is the information transmission data to the encoder 11.

In a case where the supplied DC flag indicates that it is the information transmission data, the encoder 11 performs encoding on the supplied data of the second block by controlling the running disparity RD and the run length RL as described with reference to FIGS. 1 to 13. That is, there is executed a process of inverting the data of the second block by the running disparity RD or the run length RL and adding the flag indicating that the data is inverted, or a process of adding, without inverting the data, the flag indicating that the data is not inverted.

Since the 33-bit second block is processed by the encoder 11 and the one-bit flag is added, the data output from the encoder 11 is 34-bit data.

<Encoding in Case 2>

Pre-encoding and encoding in Case 2 will be described with reference to FIG. 45. Case 2 is a case where the first half block of the 64-bit data input to the pre-encoder 301 is information transmission data and the second half block is a control code, and the data is divided into a first block of the information transmission data and a second block of the control code.

That is, in Case 2, the first information transmission data [31:0] as the 32-bit first half block and a second control code [31:0] as the 32-bit second half block are input to the pre-encoder 301.

The pre-encoder 301 sets 31-bit information transmission data [31:1] out of the first information transmission data [31:0] of the input 32-bit first half block as the first block, and outputs the first block to the encoder 11.

The pre-encoder 301 distributes first information transmission data [0], which is the last bit of the input 32-bit first information transmission data [31:0], to the second block. Furthermore, the pre-encoder 301 adds, after the first information transmission data [0], a second conversion control code "30:0" obtained by converting the 32-bit second control code [31:0] of the second half block into 31 bits to form a 32-bit data string, further adds one bit of "0" or "1" data to generate a 33-bit second block, and outputs the generated block to the encoder 11.

In other words, the pre-encoder 301 divides the input 64-bit data string into two of the first information transmission data [31:1] constituting 31 bits of the first half among the input 64 bits and the 33-bit second block. The 33-bit second block is a data string including the first information transmission data [0] of the remaining one bit of the first information transmission data [31:0], a second conversion control code [30:0] obtained by converting the second control code [31:0] constituting 32 bits of the second half among the input 64 bits into a 31-bit control code, and a bit obtained by inverting the first information transmission data [0].

The running disparity RD of the second block is set to be 0 by adding the first information transmission data [0] and bits obtained by inverting the first information transmission data [0] before and after the second block.

The input 32-bit control code is converted into the 31-bit control code. The input 32-bit control code is, for example, a control code corresponding to the above-described 8B10B encoding, and has, for example, the symbol configuration described with reference to FIG. 33. The input 32-bit control code and the 31-bit control code after conversion will be described with reference to FIG. 46.

In the following description, in order to distinguish between the 8B10B encoding and the encoding described with reference to FIGS. 1 to 13, the encoding described with reference to FIGS. 1 to 13 is described as inversion encoding.

The control codes (described as 8b code in FIG. 46) in the 8B10B encoding include Idle Code, Start Code, End Code, Pad Code, Sync Code, Deskew Code, and Standby Code as described with reference to FIG. 33.

The Idle Code is represented by D00.0(00000000) of D Character that is an 8B10B Code. The Idle Code is a data string in which 32 bits are all "0" in the 8b code. The running disparity RD of the Idle Code is "−32". In the inversion encoding of the Idle Code (described as INV in the drawing), a first symbol (1st symbol) and a second symbol (2nd symbol) are all "0", and a third symbol (3rd symbol) and other than the last one bit of a fourth symbol (4th symbol) are all "1".

In the inversion encoding, the last one bit of the fourth symbol in the 8b code is not used, and thus it is a 31-bit control code. In a case of the control code, the encoder 11 adds "1" as the flag. The flag "1" indicates that the data is inverted, but also in the case of the control code, the flag is set to "1", indicating that the data is the control code. In the case of the control code, the encoder 11 sets the flag to "1", but does not invert the data.

In the case of the control code, since the flag is set to "1", the running disparity RD of the Idle Code in the inversion encoding including the flag is 0. As described below, in the control code in the inversion encoding, the running disparity RD is set to 0 in 32 bits including the flag.

Figure 46:
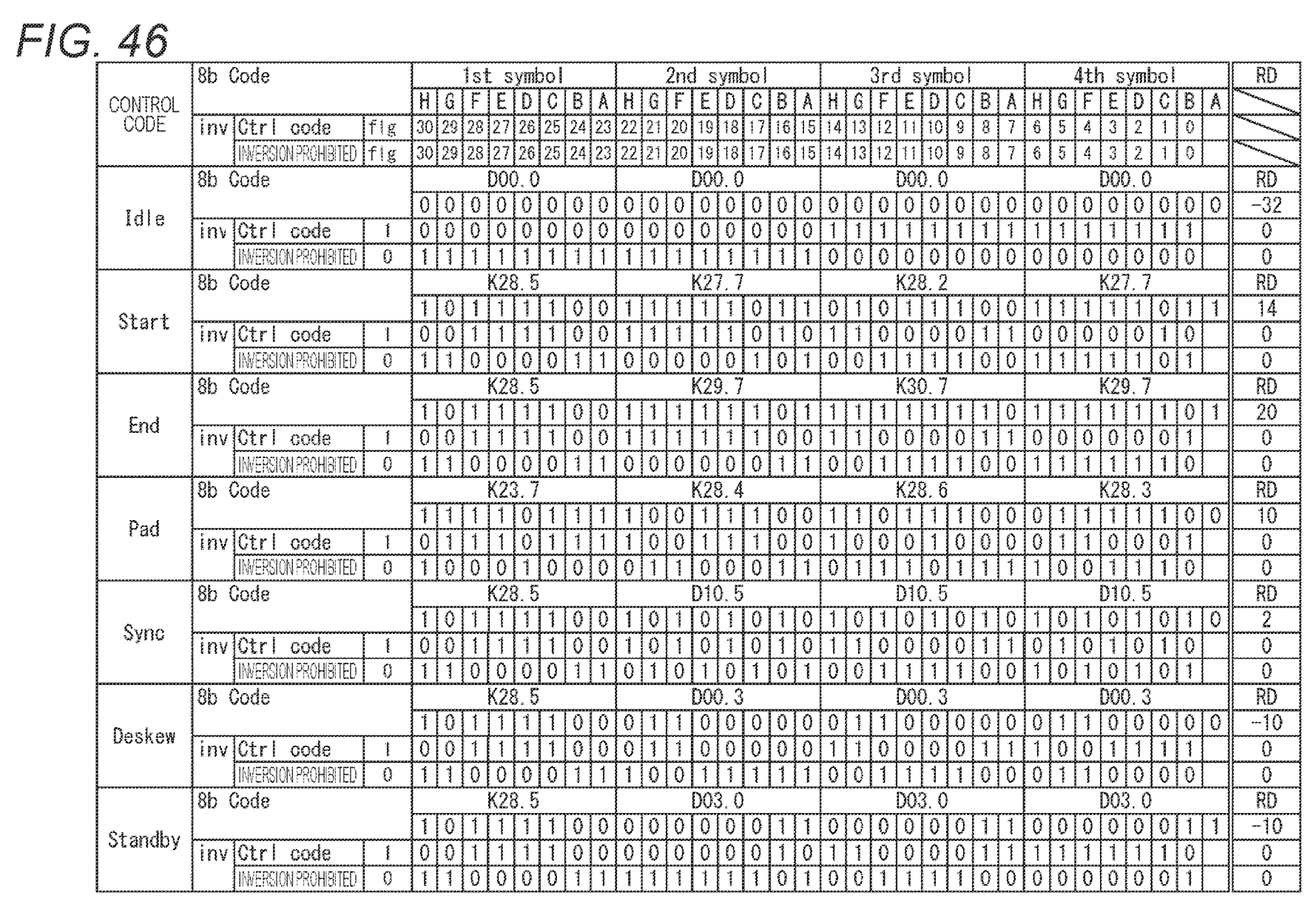

A data string described at a portion where inversion is prohibited in inv of the Idle Code in FIG. 46 is a data string obtained by inverting the Idle Code in the inversion encoding. That is, the first symbol (1st symbol) and the second symbol (2nd symbol) are all "1", and all of the third symbol (3rd symbol) and other than the last one bit of the fourth symbol (4th symbol) are "0". If such a data string is input to the pre-encoder 301 (or the encoder 11) as the information transmission data, set as data to be inverted, and inverted, the data string becomes the same as the Idle Code.

The data string that becomes the same data string as the control code by inversion is set as an inversion prohibited data string. Thus, in a case where such an inversion prohibited data string is input, the encoder 11 sets "0" as the flag, and sets the flag as the non-inverted data string. This data string set to be inversion prohibited is also a data string in which the running disparity RD including up to "0" as the flag is "0".

In the 8b code, the Start Code is represented by four symbols, K28.5, K27.7, K28.2, and K27.7, which are a combination of three types of K Characters. The running disparity RD of the Start Code in the 8b code is "14". The first symbol of the Start Code in the inversion encoding is "00111100", the second symbol is "11111010", the third symbol is "11000011", and the fourth symbol is "0000010".

Since the last one bit of the fourth symbol in the 8b code is not used, the Start Code in the inversion encoding is also a 31-bit control code. Furthermore, since the Start Code is also a control code, "1" is added as the flag in the encoder 11. Thus, the running disparity RD of the Start Code in the inversion encoding including the flag is 0.

Furthermore, an inversion prohibited data string of the Start Code is also set, and a data string that becomes the same as the Start Code by inversion is set as a data string that is not to be inverted. In a case where the inversion prohibited data string of the Start Code is also input to the encoder 11 as the information transmission data, "0" is set as the flag, and the data string is processed as a non-inverted data string. This data string set to be inversion prohibited is also a data string in which the running disparity RD including up to "0" as the flag is "0".

In the 8b code, the End Code is represented by four symbols, K28.5, K29.7, K30.7, and K29.7, which are a combination of three types of K Characters. The running disparity RD of the End Code in the 8b code is "20". The first symbol of the End Code in the inversion encoding is "00111100", the second symbol is "11111100", the third symbol is "11000011", and the fourth symbol is "0000001".

Since the last one bit of the fourth symbol in the 8b code is not used, the End Code in the inversion encoding is also a 31-bit control code. Furthermore, since the End Code is also a control code, "1" is added as the flag in the encoder 11. Thus, the running disparity RD of the End Code in the inversion encoding including the flag is 0.

Furthermore, an inversion prohibited data string of the End Code is also set, and a data string that becomes the same as the End Code by inversion is set as a data string that is not to be inverted. In a case where the inversion prohibited data string of the End Code is also input to the encoder 11 as the information transmission data, "0" is set as the flag, and the data string is processed as a non-inverted data string. This data string set to be inversion prohibited is also a data string in which the running disparity RD including up to "0" as the flag is "0".

In the 8b code, the Pad Code is represented by four symbols, K23.7, K28.4, K28.6, and K28.3, which are a combination of three types of K Characters. The running disparity RD of the Pad Code in the 8b code is "10". The first symbol of the Pad Code in the inversion encoding is "01110111", the second symbol is "10011100", the third symbol is "10001000", and the fourth symbol is "0110001".

Since the last one bit of the fourth symbol in the 8b code is not used, the Pad Code in the inversion encoding is also a 31-bit control code. Furthermore, since the Pad Code is also a control code, "1" is added as the flag in the encoder 11. Thus, the running disparity RD of the Pad Code in the inversion encoding including the flag is 0.

Furthermore, an inversion prohibited data string of the Pad Code is also set, and a data string that becomes the same as the Pad Code by inversion is set as a data string that is not to be inverted. In a case where the inversion prohibited data string of the Pad Code is also input to the encoder 11 as the information transmission data, "0" is set as the flag, and the data string is processed as a non-inverted data string. This data string set to be inversion prohibited is also a data string in which the running disparity RD including up to "0" as the flag is "0".

In the 8b code, the Sync Code is represented by four symbols including a combination of K28.5 of K Character and D10.5 of D Character. Although it has been described in FIG. 33 that Any  indicates that any type of symbol may be used, FIG. 46** specifically exemplifies a case where D10.5 of D Character is used.

The running disparity RD of the Sync Code in the 8b code is "2". The first symbol of the Sync Code in the inversion encoding is "00111100", the second symbol is "10101010", the third symbol is "11000011", and the fourth symbol is "0101010".

Since the last one bit of the fourth symbol in the 8b code is not used, the Sync Code in the inversion encoding is also a 31-bit control code. Furthermore, since the Sync Code is also a control code, "1" is added as the flag in the encoder 11. Thus, the running disparity RD of the Sync Code in the inversion encoding including the flag is 0.

Furthermore, an inversion prohibited data string of the Sync Code is also set, and a data string that becomes the same as the Sync Code by inversion is set as a data string that is not to be inverted. In a case where the inversion prohibited data string of the Sync Code is also input to the encoder 11 as the information transmission data, "0" is set as the flag, and the data string is processed as a non-inverted data string. This data string set to be inversion prohibited is also a data string in which the running disparity RD including up to "0" as the flag is "0".

In the 8b code, the Deskew Code is represented by four symbols including a combination of K28.5 of K Character and D00.3 of D Character. Although it has been described in FIG. 33 that Any  indicates that any type of symbol may be used, FIG. 46** specifically exemplifies a case where D00.3 of D Character is used.

The running disparity RD of the Deskew Code in the 8b code is "−10". The first symbol of the Deskew Code in the inversion encoding is "00111100", the second symbol is "01100000", the third symbol is "11000011", and the fourth symbol is "1001111".

Since the last one bit of the fourth symbol in the 8b code is not used, the Deskew Code in the inversion encoding is also a 31-bit control code. Furthermore, since the Deskew Code is also a control code, "1" is added as the flag in the encoder 11. Thus, the running disparity RD of the Deskew Code in the inversion encoding including the flag is 0.

Furthermore, an inversion prohibited data string of the Deskew Code is also set, and a data string that becomes the same as the Deskew Code by inversion is set as a data string that is not to be inverted. In a case where the inversion prohibited data string of the Deskew Code is also input to the encoder 11 as the information transmission data, "0" is set as the flag, and the data string is processed as a non-inverted data string. This data string set to be inversion prohibited is also a data string in which the running disparity RD including up to "0" as the flag is "0".

In the 8b code, the Standby Code is represented by four symbols including a combination of K28.5 of K Character and D03.0 of D Character. Although it has been described in FIG. 33 that Any  indicates that any type of symbol may be used, FIG. 46** specifically exemplifies a case where D03.0 of D Character is used.

The running disparity RD of the Standby Code in the 8b code is "−10". The first symbol of the Standby Code in the inversion encoding is "00111100", the second symbol is "00000010", the third symbol is "11000011", and the fourth symbol is "111110".

Since the last one bit of the fourth symbol in the 8b code is not used, the Standby Code in the inversion encoding is also a 31-bit control code. Furthermore, since the Standby Code is also a control code, "1" is added as the flag in the encoder 11. Thus, the running disparity RD of the Standby Code in the inversion encoding including the flag is 0.

Furthermore, an inversion prohibited data string of the Standby Code is also set, and a data string that becomes the same as the Standby Code by inversion is set as a data string that is not to be inverted. In a case where the inversion prohibited data string of the Standby Code is also input to the encoder 11 as the information transmission data, "0" is set as the flag, and the data string is processed as a non-inverted data string. This data string set to be inversion prohibited is also a data string in which the running disparity RD including up to "0" as the flag is "0".

In a case where such a control code is set, the pre-encoder 301 converts the input 8b code into an inversion encoding code. When this conversion is performed, a correspondence table between the control code in the 8b code depicted in FIG. 46 and the control code in the inversion encoding may be held, and the conversion may be performed by appropriately referring to the correspondence table. Furthermore, although the description will be continued on the assumption that the conversion process is included, the control code insertion unit 191 may insert the control code in the inversion encoding, and the pre-encoder 301 may not perform conversion.

Figure 45:
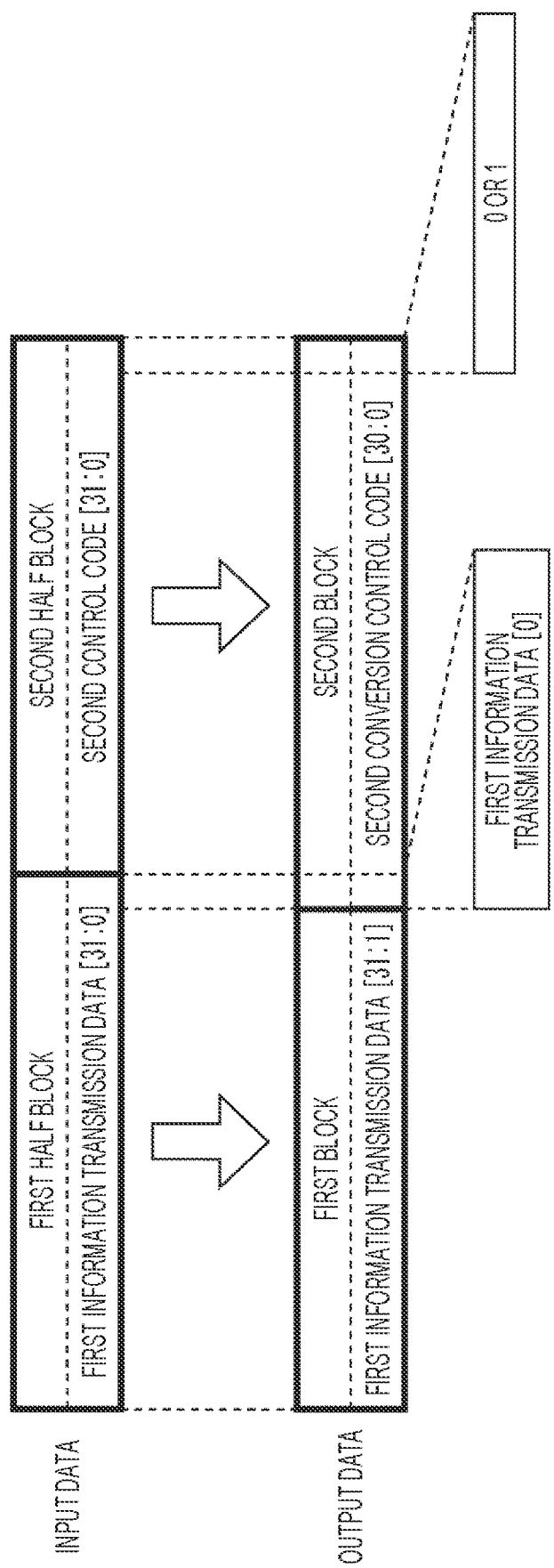
FIG. 45 is a diagram for describing conversion in Case 2.

Returning to the description with reference to FIG. 45, when outputting the first block that is the information transmission data to the encoder 11, the pre-encoder 301 also supplies the DC flag indicating that the first block is the information transmission data to the encoder 11.

In a case where the supplied DC flag indicates that it is the information transmission data, the encoder 11 performs encoding on the supplied data of the first block by controlling the running disparity RD and the run length RL as described with reference to FIGS. 1 to 13. That is, there is executed a process of inverting the data of the first block by the running disparity RD or the run length RL and adding the flag indicating that the data is inverted, or a process of adding, without inverting the data, the flag indicating that the data is not inverted.

Note that, in a case where the information transmission data is an inversion prohibited data string, the pre-encoder 301 may determine whether or not the information transmission data is such an inversion prohibited data string, and output a determination result as a DC flag, and the encoder 11 may perform processing with reference to the DC flag. Alternatively, in a case where the DC flag indicates that it is the information transmission data, the encoder 11 may determine whether or not the information transmission data is not an inversion prohibited data string, and execute processing based on the determination result.

Since the first block of 31 bits is processed by the encoder 11 and the flag of one bit is added, the data output from the encoder 11 is 32-bit data.

Similarly, when outputting the second block including the second conversion control code to the encoder 11, the pre-encoder 301 also supplies the DC flag indicating that the second block is the control code to the encoder 11.

In a case where the supplied DC flag indicates that it is the control code, the encoder 11 sets the flag to "1", adds the flag to the supplied 33-bit second block, and outputs the second block as 34-bit data.

<Encoding in Case 3>

Figure 47:
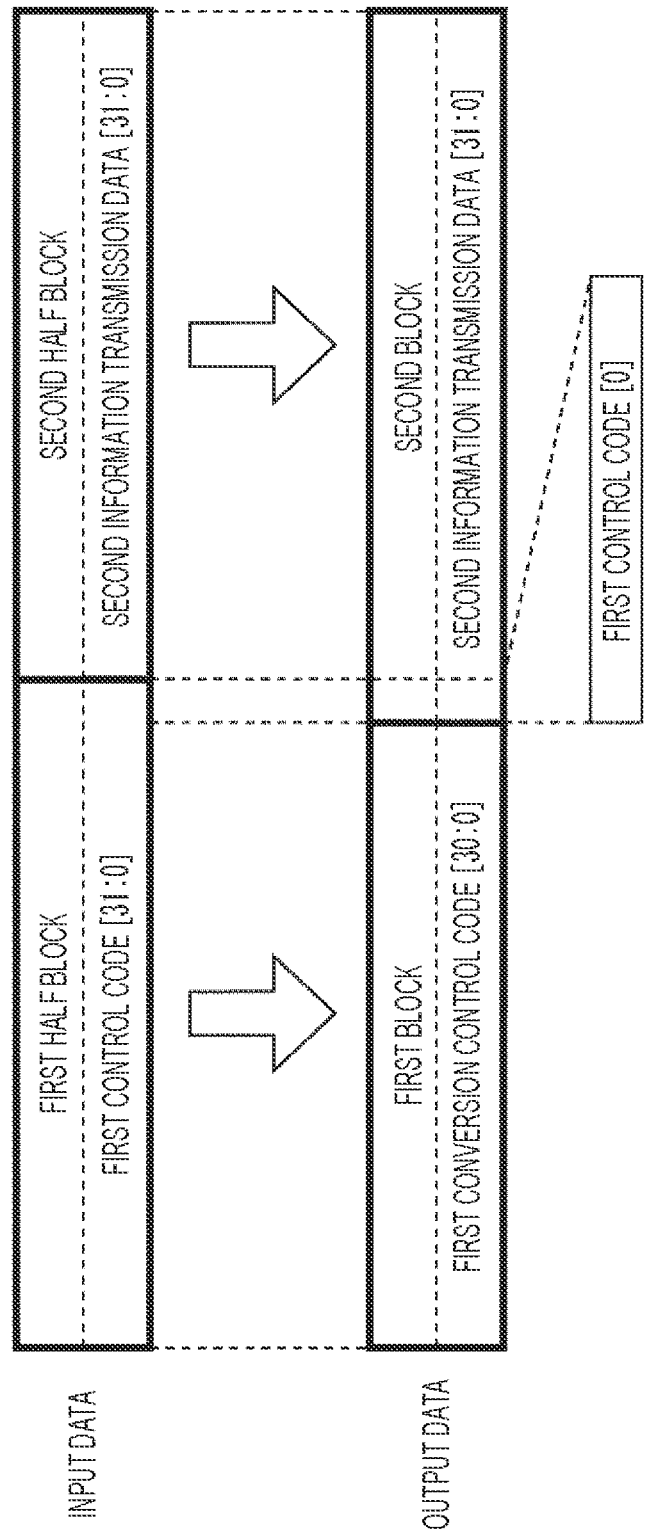
FIG. 47 is a diagram for describing conversion in Case 3.

Pre-encoding and encoding in Case 3 will be described with reference to FIG. 47. Case 3 is a case where the first half block of 64-bit data input to the pre-encoder 301 is a control code, the second half block is information transmission data, and the data is divided into a first block of the control code and a second block of the information transmission code.

That is, in Case 3, the first control code [31:0] as the 32-bit first half block and the second information transmission data [31:0] as the 32-bit second half block are input to the pre-encoder 301.

The pre-encoder 301 converts the input first control code [31:0] of the 32-bit first half block into, for example, a 31-bit first conversion control code [30:0] with reference to the table depicted in FIG. 46, sets the first conversion control code [30:0] as the first block, and outputs the first block to the encoder 11.

The pre-encoder 301 sorts the input second information transmission data [31:0] of the 32-bit second half block into the second block. Since the second block is 33 bits, one bit is added to the beginning of the second block. The value of A of the fourth symbol of the control code in the 8b code can be used as the added one bit. That is, the last bit of the first control code in the first half block is assigned to the first bit of the second block in the second block.

For example, in a case of the Idle Code, since the value of A of the fourth symbol of the control code in the 8b code is "0", the first bit of the second block is set to "0".

The bit put at the first of the second block, in this case, the first control code [0] is handled as dummy data on the decoder 12 side.

The pre-encoder 301 divides the input 64-bit data string into two blocks of the first control code [31:0] constituting 31 bits of the first half among the input 64 bits and the 33-bit second block. The 33-bit second block is a 33-bit data string obtained by adding second information transmission data [31:0] constituting 32 bits of the second half among the input 64 bits to the first control code [0] of the remaining one bit of the first control code [31:0].

When outputting the first block that is the control code to the encoder 11, the pre-encoder 301 also supplies the DC flag indicating that the first block is the control code to the encoder 11.

In a case where the supplied DC flag indicates that it is the control code, the encoder 11 sets the flag to "1", adds the flag to the supplied 31-bit first block, and outputs the first block as 32-bit data.

When outputting the second block as the information transmission data to the encoder 11, the pre-encoder 301 also supplies the DC flag indicating that the second block is the information transmission data to the encoder 11.

In a case where the supplied DC flag indicates that it is the information transmission data, the encoder 11 performs encoding on the supplied data of the second block by controlling the running disparity RD and the run length RL as described with reference to FIGS. 1 to 13. That is, there is executed a process of inverting the data of the second block by the running disparity RD or the run length RL and adding the flag indicating that the data is inverted, or a process of adding, without inverting the data, the flag indicating that the data is not inverted.

<Encoding in Case 4>

Figure 48:
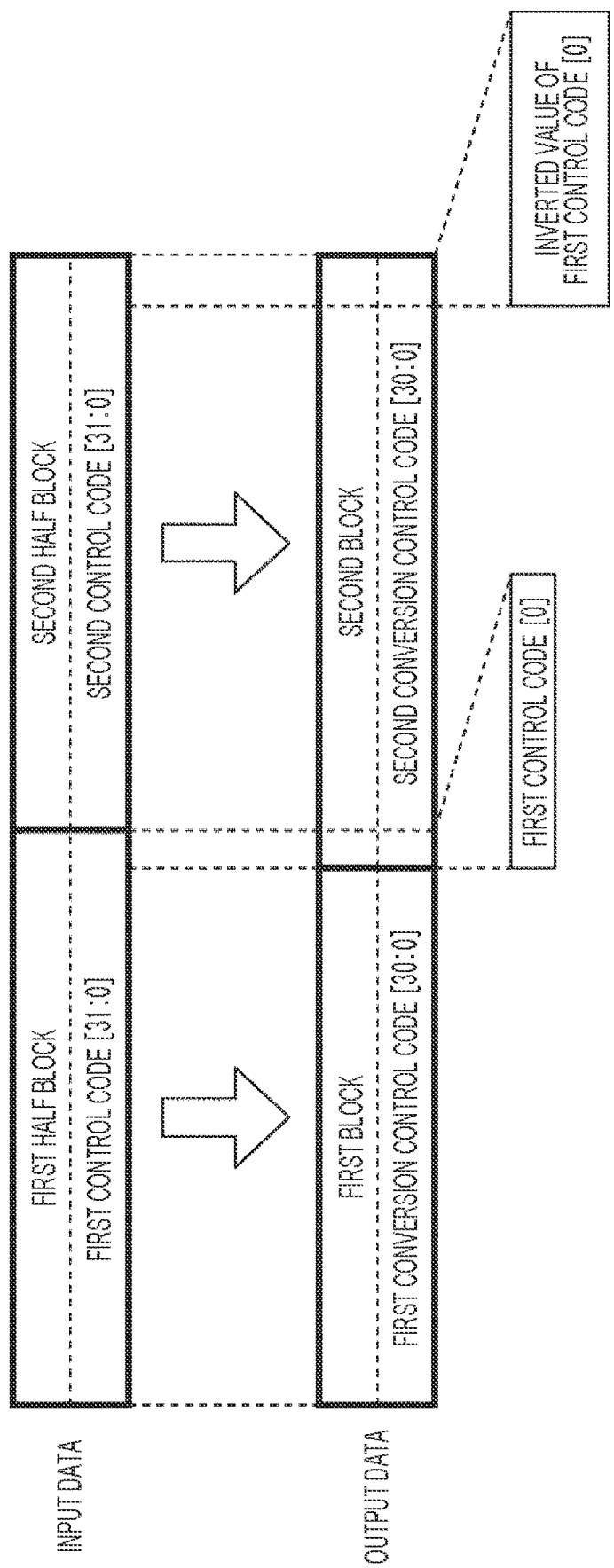
FIG. 48 is a diagram for describing conversion in Case 4.

Pre-encoding and encoding in Case 4 will be described with reference to FIG. 48. Case 4 is a case where all 64-bit data input to the pre-encoder 301 is a control code and is divided into the first block of a control code and the second block of a control code.

That is, in Case 4, the first control code [31:0] as the 32-bit first half block and the second control code [31:0] as the 32-bit second half block are input to the pre-encoder 301.

The pre-encoder 301 converts the input first control code [31:0] of the 32-bit first half block into, for example, a 31-bit first conversion control code [30:0] with reference to the table depicted in FIG. 46, sets the first conversion control code [30:0] as the first block, and outputs the first block to the encoder 11.

The pre-encoder 301 converts the input second control code [31:0] of the 32-bit second half block into a 31-bit second conversion control code [30:0] with reference to, for example, the table depicted in FIG. 46, and assigns the second conversion control code [30:0] to the second block. Since the second block is 33 bits, a total of two bits including the first one bit of the second block and the last one bit are added.

The value of A of the fourth symbol of the control code in the 8b code can be used as one bit added to the beginning. That is, the last bit (the first control code [0]) of the first control code in the first half block is assigned to the first bit of the second block. For example, in the case of the Idle Code, since the value of A of the fourth symbol of the control code in the 8b code is "0", the first bit of the second block is set to "0".

The one bit added to the end is a value obtained by inverting the value of the one bit added to the beginning. That is, since one bit added to the beginning is the first control code [0], the inverted value of the first control code [0] is set as the bit added to the end. For example, in the case of the Idle Code, since the value of A of the fourth symbol of the control code in the 8b code is "0" and this value is added to the beginning, the last bit of the second block is set to "1".

In this manner, two-bit data is added to the second block, but the running disparity RD can be set to 0 by setting the inverted value of one value to the other value.

The bit inserted in the beginning and the bit inserted in the end of the second block are handled as dummy data on the decoder 12 side.

The pre-encoder 301 divides the input 64-bit data string into two blocks by converting the first control code [31:0] constituting 32 bits of the first half among the input 64 bits into the first conversion control code [30:0] and converting the second control code [31:0] constituting 32 bits of the second half into the second conversion control code [30:0]. Furthermore, the pre-encoder 301 adds two bits to the second conversion control code [30:0] to form the 33-bit data string and generates the second block.

When outputting the first block that is the control code to the encoder 11, the pre-encoder 301 also supplies the DC flag indicating that the first block is the control code to the encoder 11. In a case where the supplied DC flag indicates that it is the control code, the encoder 11 sets the flag to "1", adds the flag to the supplied 31-bit first block, and outputs the first block as 32-bit data.

Similarly, when outputting the second block as the control code to the encoder 11, the pre-encoder 301 also supplies the DC flag indicating that the second block is the control code to the encoder 11. In a case where the supplied DC flag indicates that it is the control code, the encoder 11 sets the flag to "1", adds the flag to the supplied 33-bit second block, and outputs the second block as 34-bit data.

In this manner, the 64-bit data input by the pre-encoder 301 is divided into 31-bit data and 33-bit data. In the above description, the control code is converted with reference to the table depicted in FIG. 46, but in a case where the control code (the above-described 8b code) used in the 8B10B encoding is input and the 8b code is converted, conversion as described with reference to FIGS. 49 and 50 may be performed. In other words, as described with reference to FIGS. 49 and 50, the conversion control code has regularity, and can be generated from the 8b code on the basis of the rule.

Figure 49:
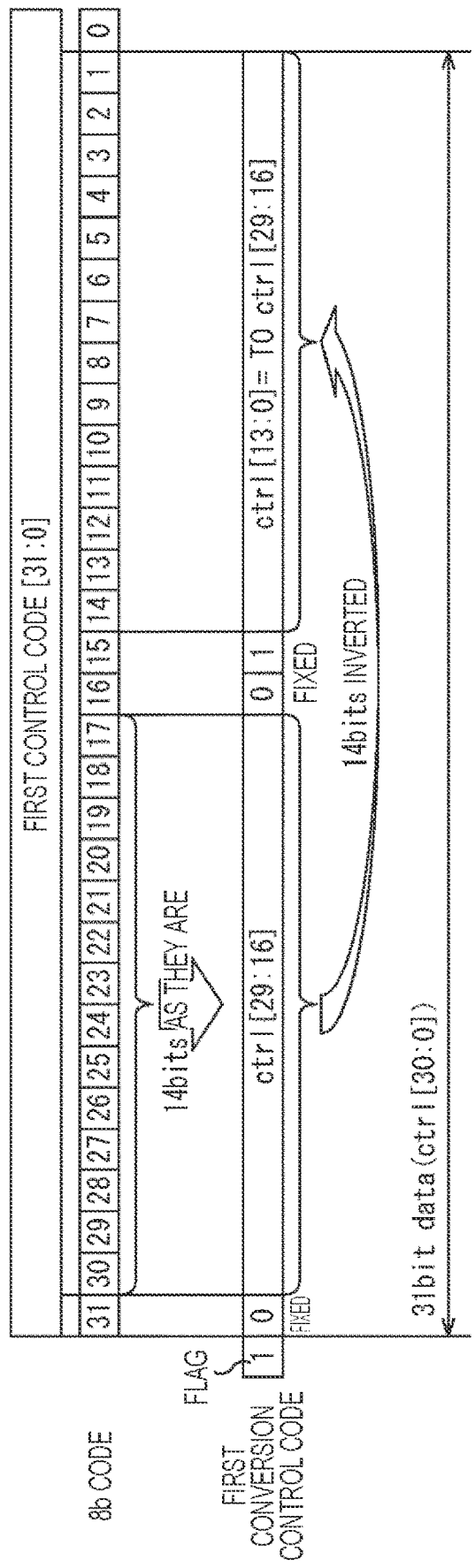
FIG. 49 is a diagram for describing a data conversion method.

FIG. 49 is a diagram for describing a conversion method in a case where the first half of the 64-bit data input to the pre-encoder 301 is a control code. That is, it is a case where the first half block of the input 64 bits described with reference to FIGS. 47 and 48 is the first control code [31:0], and the first control code [31:0] is converted into the first conversion control code [30:0].

In FIG. 49, the first control code of the 8b code is depicted at the top. The first control code [31:0] is 32-bit data. 14 bits of the first control code [30:17] out of the first control code [31:0] are used as they are as 14 bits of 16 to 29 of the first conversion control code. That is, the first control code [30:17] is used as a first conversion control code [29:16]. A first change control code [30:17] is used as data for distinguishing the control codes.

The first conversion control code [30] which is the first bit of the first conversion control code, in other words, the bit before the first conversion control code [29:16] is fixed to "0". Furthermore, a first conversion control code [15] and a first conversion control code [14] of the first conversion control code, in other words, two bits following the first conversion control code [29:16] are fixed with "0" and "1".

14 bits of a first conversion control code [13:0] are set to values obtained by inverting the 14 bits of the first conversion control code [29:16]. In other words, the 14 bits of the first conversion control code [13:0] are data obtained by inverting the 14 bits of the first control code [30:17] of the input 8b code.

In this manner, the conversion control code is generated from the input 8b code. As described above, the first conversion control code [30:0] is generated by using the 14 bits of the first control code [30:17] in the input first control code [31:0].

Zero is set as a bit to be the first conversion control code [30].

The 14 bits of the first control code [30:17] of the first control code [30:0] are set as the first conversion control code [29:16].

As two bits following the first conversion control code [29:16], the first conversion control code [15:14] is set to 0 and 1.

The 14 bits obtained by inverting the 14 bits of the first control code [30:17] are set as the first conversion control code [13:0].

By performing such a process, the first conversion control code [30:0] is generated.

The first conversion control code [29:16] and the first conversion control code [13:0] have a relationship in which data is inverted, and thus the running disparity RD for this portion is 0. Furthermore, since 0, 0, and 1 are included in the first conversion control code as fixed values, and the flag added to the control code is 1, the running disparity RD regarding this portion is also 0. Thus, the running disparity RD including the flag in the generated first conversion control code [30:0] is always 0.

Next, a conversion method in a case where the second half of the 64-bit data input to the pre-encoder 301 is a control code will be described with reference to FIG. 50. That is, it is a case where the input 64-bit second half block described with reference to FIGS. 45 and 48 is the second control code [31:0], and the second control code [31:0] is converted into the second conversion control code [30:0].

Figure 50:
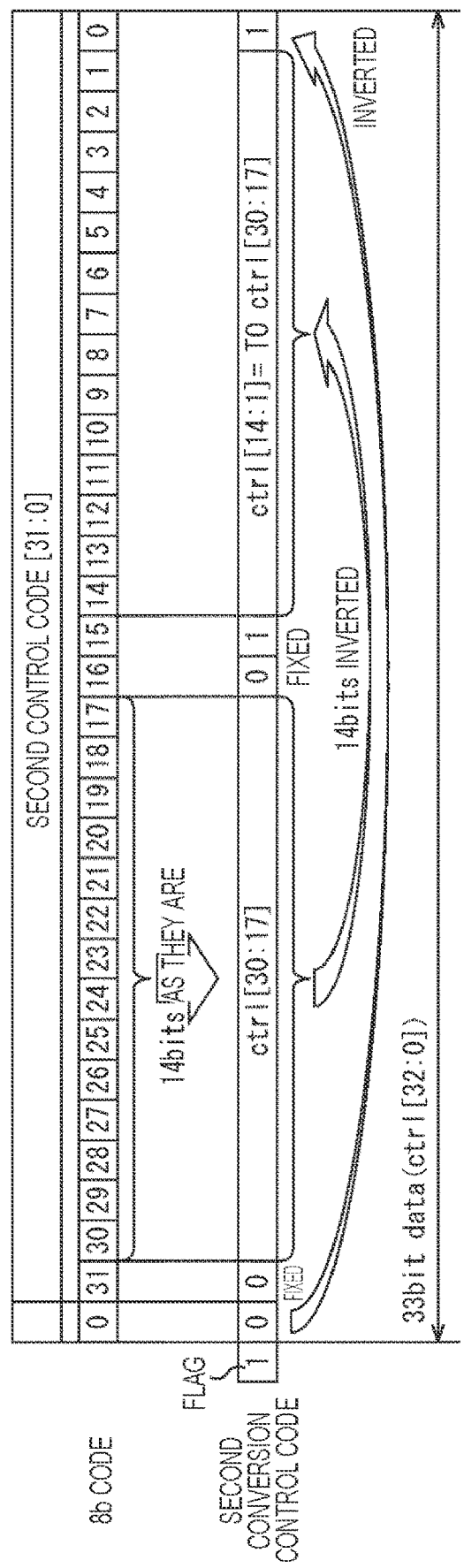
FIG. 50 is a diagram for describing the data conversion method.

Although basic conversion is the same as that in the case depicted in FIG. 49, the case depicted in FIG. 49 is a case of conversion into 31 bits, and the case depicted in FIG. 50 is a case of conversion into 33 bits. For this purpose, a process of further adding two bits is added. The two bits are a bit corresponding to a second conversion control code [32] and a bit corresponding to a second conversion control code [0].

That is, also in the case depicted in FIG. 50, 14 bits of a second control code [30:17] out of the second control code [31:0] are used as they are as 14 bits of 16 to 29 bits of the second conversion control code. In this case, the second control code [30:17] is used as a second conversion control code [30:17]. A second change control code [30:17] is used as data for distinguishing the control codes.

The first bit of the second conversion control code, in other words, a second conversion control code [31] which is a bit before the second conversion control code [30:17] is fixed to "0". Furthermore, a second conversion control code [16] and a second conversion control code [15] of the second conversion control code, in other words, two bits following the second conversion control code [30:17] are fixed with "0" and "1".

14 bits of a second conversion control code [14:1] are set to values obtained by inverting 14 bits of a second conversion control code [29:16]. In other words, the 14 bits of the second conversion control code [14:1] are data obtained by inverting 14 bits of the second control code [30:17] of the input 8b code.

Moreover, a bit corresponding to the second conversion control code [32] is added before a second conversion control code [31:1], and a bit corresponding to the second conversion control code [0] is added before the second conversion control code [31:1].

The last bit of the first half block among the input 64 bits, for example, the first information transmission data [0] of the first information transmission data [31:0] in the example depicted in FIG. 45 is assigned to the second conversion control code [32]. Furthermore, a value obtained by inverting the second conversion control code [32] is assigned to the second conversion control code [0].

In this manner, the conversion control code is generated from the input 8b code. As described above, a second conversion control code [32:0] is generated by using the 14 bits of the second control code [30:17] out of the input second control code [31:0].

The last bit of the previous block is assigned as a bit to be the second conversion control code [32].

Zero is set as a bit to be the second conversion control code [31].

The 14 bits of the second control code [30:17] are set as the second conversion control code [30:17].

As two bits following the second conversion control code [30:17], the second conversion control code [16:15] is set to 0 and 1.

The 14 bits obtained by inverting the 14 bits of the second control code [30:17] are set as the second conversion control code [14:1].

A value obtained by inverting the second conversion control code [32] is set as a bit to be the second conversion control code [0].

By performing such a process, the second conversion control code [32:0] is generated.

The data of the second conversion control code [30:17] and the second conversion control code [14:1] have a relationship in which data is inverted, and thus the running disparity RD for this portion is 0. Furthermore, the second conversion control code [32] and the second conversion control code [0] have a relationship in which data is inverted, and thus the running disparity RD for this portion is 0. Moreover, since 0, 0, and 1 are included in the second conversion control code as fixed values and the flag added to the control code is 1, the running disparity RD regarding this portion is also 0. Thus, the running disparity RD including the flag in the generated second conversion control code [32:0] is always 0.

As described with reference to FIGS. 49 and 50, the control code used in the inversion encoding may be generated by converting the input control code.

Figure 39:
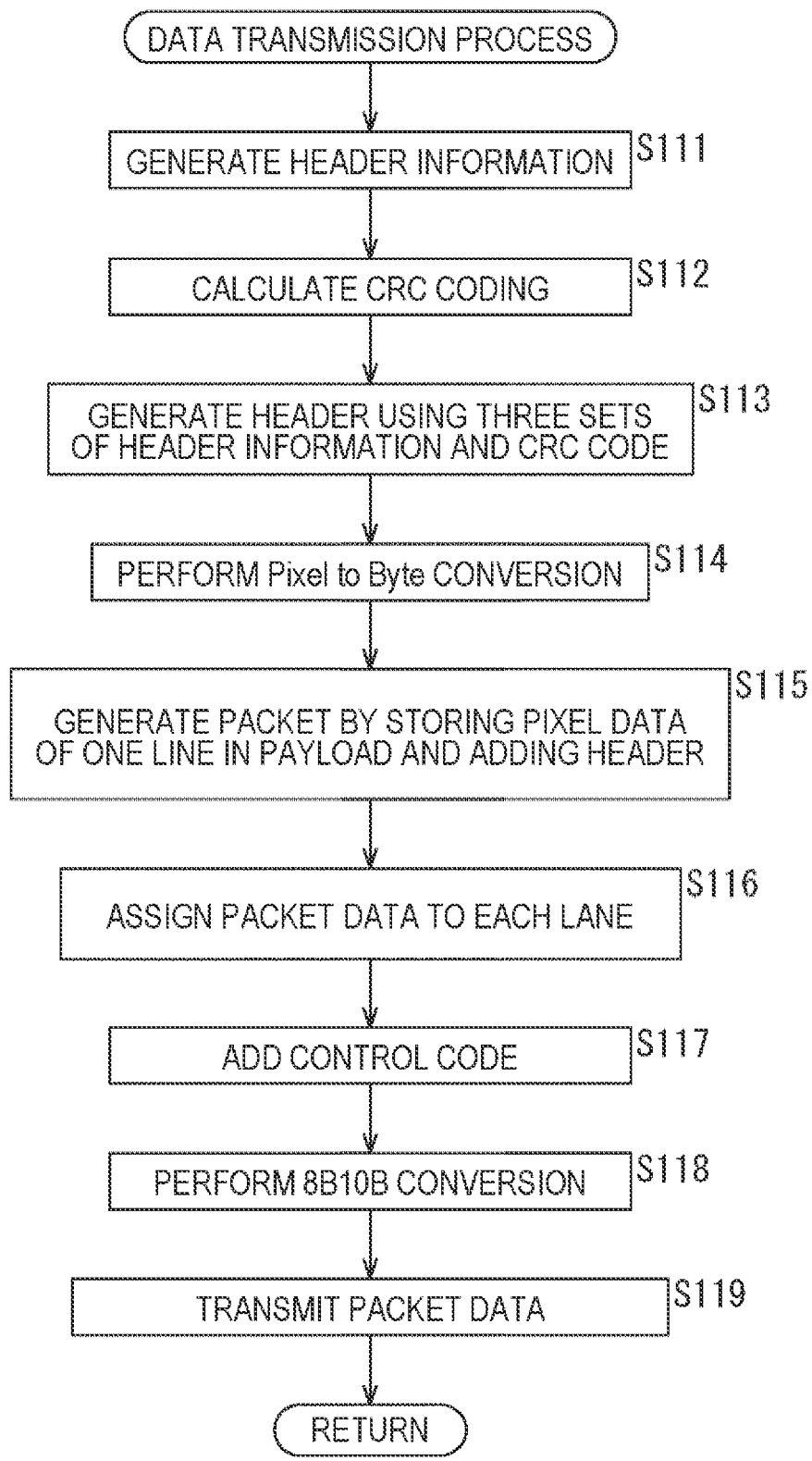
FIG. 39 is a flowchart describing a data transmission process performed in step S102 of FIG. 38.
Figure 40:
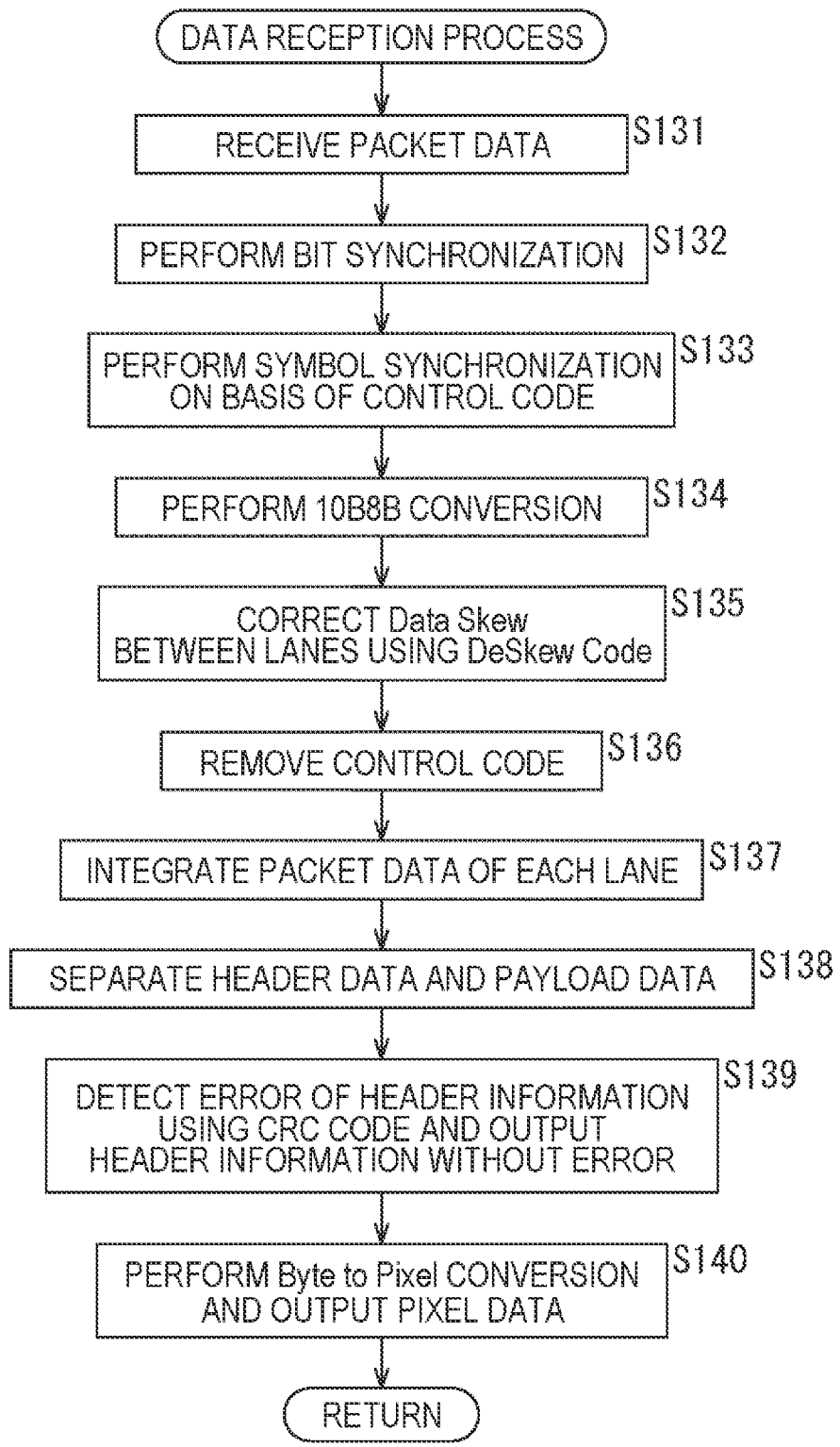
FIG. 40 is a flowchart describing a data reception process performed in step S103 of FIG. 38.

Even in a case where the control code and the information transmission data are encoded in this manner, the operations of the transmission unit 122a and the reception unit 131a depicted in FIG. 42 are operations based on the flowcharts depicted in FIGS. 38 to 40. Here, since the description overlaps, only different processing will be described.

As a data transmission process of the transmission unit 122a, in step S117 (FIG. 39), the control code insertion unit 191 adds a control code to the packet data supplied from the lane distribution unit 165. The added control code is a code obtained by converting the control code in the 8B10B encoding into the control code in the inversion encoding.

Alternatively, instead of performing such conversion by the control code insertion unit 191, the conversion may be configured to be performed by the encoder 11 (the pre-encoder 301 included in the encoder 11).

In step S118, the encoder 11 inversely encodes the packet data to which the control code is added. The processing in the encoder 11 will be described later with reference to FIG. 51.

As a data reception process of the reception unit 131a, in step S133 (FIG. 40), the symbol synchronization unit 214 performs symbol synchronization by detecting a control code included in packet data or the like. The control code used at this time is a control code in the inversion encoding.

In a case where the symbol synchronization unit 244 performs symbol synchronization with the control code in the 8B10B encoding, the control code that is data decoded by the decoder 12 and converted into the control code in the 8B10B encoding may be used.

In step S134, the decoder 12 decodes coded data that is inversely encoded. The processing in the decoder 12 will be described later with reference to FIG. 52.

<Processing of Encoder Including Control Code>

A control code having a special role and processing of the encoder 11 in a case of encoding information transmission data will be described with reference to a flowchart of FIG. 51.

In step S201, the encoder 11 receives inputs of data and a DC flag from the pre-encoder 301. In step S202, the encoder 11 determines whether or not the input data is a control code with reference to the DC flag. In a case where it is determined in step S202 that the input data is the control code, the processing proceeds to step S203.

In step S203, the flag is set to 1. As described above, the control code is set as data in which the flag is set to 1 and the inversion process is not performed. In the encoder 11, the control code is changed to an N or M-bit control code by the pre-encoder 301, and thus the flag is added to the control code and the control code is output.

In step S204, the running disparity RD and the run length RL of the control code to be output are calculated. In step S205, the generated data string is transmitted to the reception side. Steps S204 and S205 are the same processes as steps S22 and S23 (FIG. 9).

On the other hand, in a case where it is determined in step S202 that the input data is not the control code, the processing proceeds to step S206. In step S206, it is determined whether or not the input information transmission data is an inversion prohibited data string. As described with reference to FIG. 46, the inversion prohibited data string is a data string that becomes the same data string as the control code when inverted.

In a case where it is determined in step S206 that the input data is the inversion prohibited data string, the processing proceeds to step S207. In step S207, the flag is set to 0. In the encoder 11, the information transmission data is changed to N-bit or M-bit information transmission data by the pre-encoder 301, and thus the flag is added to the information transmission data, and the information transmission data is output. Thereafter, processes of steps S204 and S205 are executed, but since the processes of steps S204 and S205 have already been described, the description thereof will be omitted.

On the other hand, in a case where it is determined in step S206 that the input information transmission data is not the inversion prohibited data string, the processing proceeds to step S208. In step S208, an inversion encoding process is performed on the information transmission data. Furthermore, the processes of steps S204 and S205 are executed on the information transmission data on which the inversion encoding process has been executed.

Figure 9:
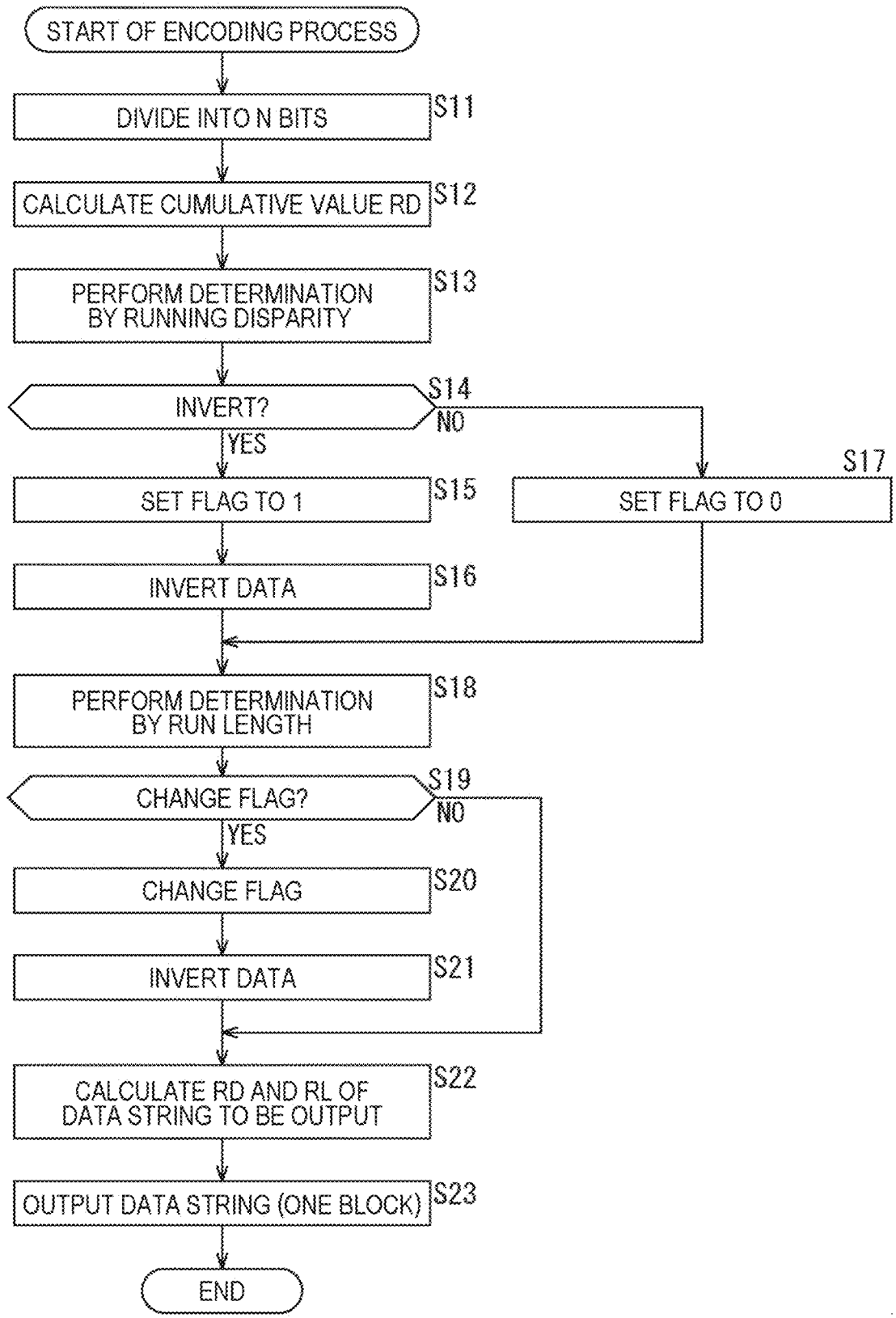
FIG. 9 is a flowchart for describing an encoding process.

Since the inversion encoding process executed in step S208 and the processes executed in steps S204 and S205 correspond to the processes of steps S12 to S23 in the flowchart depicted in FIG. 9, the description thereof has already been made and thus is omitted.

In this manner, in a case where a code having a special data string such as the control code is also handled in the inversion encoding, processing of adding the flag indicating that the control code is not to be inverted and allowing recognizing that it is the control code is included.

<Processing of Decoder Including Control Code>

A control code having a special role and processing of the decoder 12 in a case of decoding the information transmission data will be described with reference to a flowchart of FIG. 52.

In step S231, the decoder 12 determines whether or not the flag is 1. In a case where it is determined in step S231 that the flag is 1, the processing proceeds to step S232.

In step S232, it is determined whether or not the data string to be processed is the control code. In a case where it is determined in step S232 that the data string to be processed is the control code, the processing proceeds to step S233.

In step S233, data information is set to information indicating that it is the control code. The data information is information that is referred to when an output from the decoder 12 is processed in a subsequent stage of the decoder 12, and is information (flag) indicating whether or not it is the control code.

In step S234, the data information and the control code are output from the decoder 12.

On the other hand, in a case where it is determined in step S232 that the data string is not the control code, the processing proceeds to step S235. The processing comes to step S235 in a case where the flag is 1 and the data string is not the control code. That is, in a case where the processing has come to step S235, the data to be processed is inverted information transmission data.

In step S235, the data information is set to information indicating that it is the information transmission data. In step S236, the data string to be processed is inverted. Then, in step S237, the data information and the information transmission data are output from the decoder 12.

On the other hand, in a case where it is determined in step S231 that the flag is 0, the processing proceeds to step S238. The processing comes to step S238 in a case where the data to be processed is the information transmission data that is not inverted.

In step S238, the data information is set to information indicating that it is the information transmission data. In step S239, the data string to be processed is output as it is without being inverted. Then, in step S237, the data information and the information transmission data are output from the decoder 12.

In this manner, in a case where a code having a special data string such as the control code is also handled in decoding corresponding to the inversion encoding, a data string to which the flag indicating that the control code is not to be inverted and allowing recognizing that it is the control code is added is processed with reference to the flag.

<Other Encoding and Decoding Process>

As described above, the control code is not to be inverted, and 1 is added as the flag. Furthermore, among data (information transmission data) other than the control code, data that becomes the same data string as the control code when inverted is set as an inversion prohibited data string and is controlled not to be inverted, and 0 is added as the flag.

In a case where the information transmission data is inverted, 1 is added as the flag. The case where 1 is added as the flag is the same as a case of indicating that a code is a control code. In a case where an error occurs in the inverted information transmission data and the data string becomes the same as that of the control code, the flag is 1 on the decoding side, and the data is the same as that of the control code and thus is processed as the control code.

Furthermore, in a case where an error occurs in the control code, the flag is 1 on the decoder side, and thus there is a possibility that the control code is handled as the inverted information transmission data and decoded. Accordingly, a description for encoding and decoding is added to allow handling as the control code even in a case where an error occurs in the control code will be described.

Figure 53:
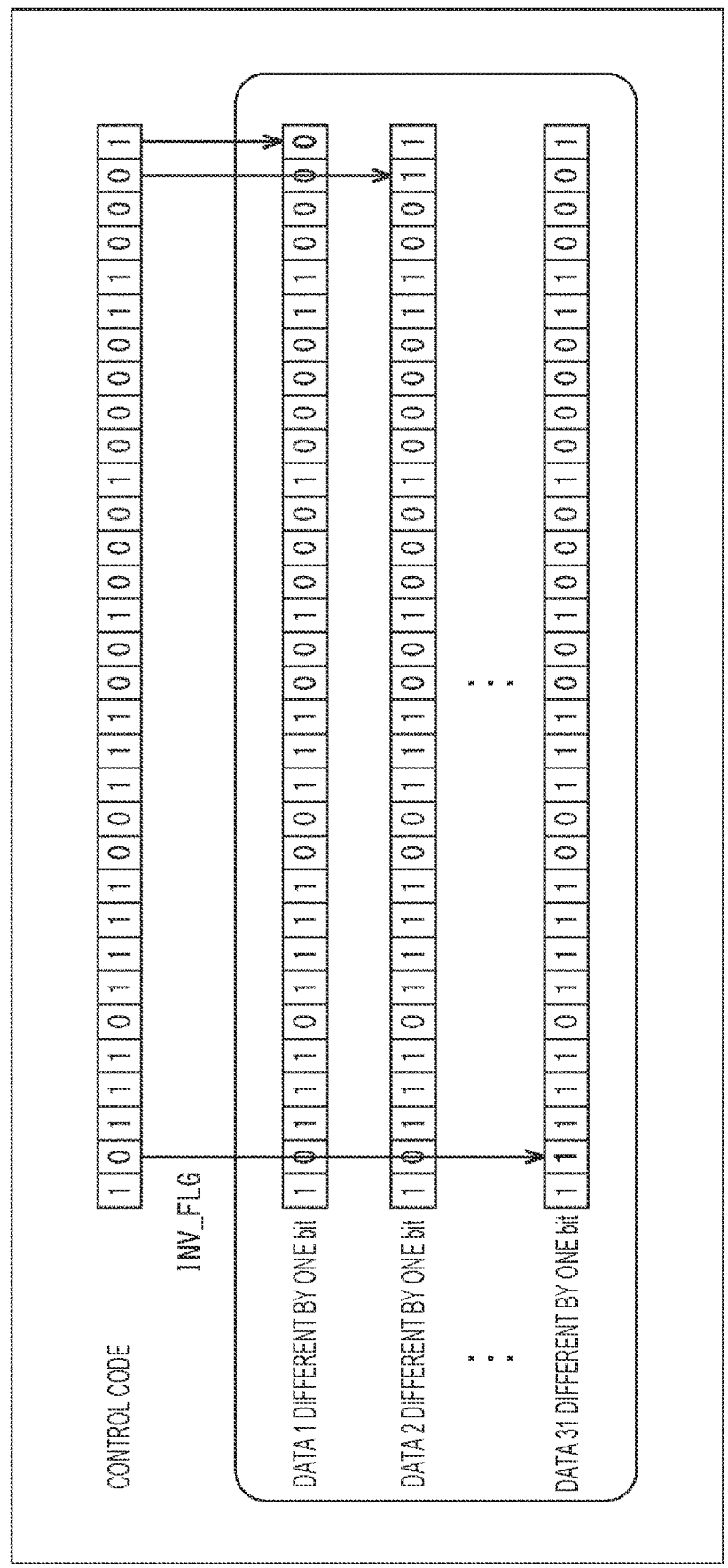
FIG. 53 is a diagram for describing a control code when an error occurs.

As depicted in FIG. 53, it is assumed that a one-bit error has occurred in the control code. The code depicted in the upper part of FIG. 53 is the Pad Code in the inversion encoding depicted in FIG. 46, and indicates a code in which 1 of the flag is added to the first one bit of the Pad Code. In a case where the data is encoded and transmitted to the decoding side in a state where no error occurs, the codes depicted in the upper part of FIG. 53 are exchanged.

In the Pad Code, for example, a case where the one-bit error has occurred is depicted in the lower part of FIG. 53. In the Pad Code represented as data 1 different by one bit, an error occurs in the last data, and data that has to be data of 1 when the code is a normal code is data of 0. When such data 1 different by one bit is processed on the decoder 12 side, since the flag is 1, it is processed as the inverted information transmission data.

Similarly, in the Pad Code represented as data 2 different by one bit, an error occurs in the second data from the end, and data that has to be data of 0 when the code is a normal code is data of 1. When such data 2 different by one bit is processed on the decoder 12 side, since the flag is 1, it is processed as the inverted information transmission data.

Moreover, in the Pad Code represented as data 31 different by one bit, an error occurs in the 31st data from the end, and data that has to be data of 0 when the code is a normal code is data of 1. When such data 31 different by one bit is processed on the decoder 12 side, since the flag is 1, it is processed as the inverted information transmission data.

As described above, in a case where the one-bit error occurs in the control code, there is a possibility that the control code is decoded as the information transmission data. Accordingly, decoding is performed in consideration of a case where the one-bit error occurs. Specifically, the decoder 12 handles the data 1 to 31 different by one bit as a control code. In this manner, the data 1 to 31 different by one bit are appropriately referred to as enlarged control codes.

Since there are 31 patterns of data 1 to 31 different by one bit, the decoder 12 processes the data including the 31 patterns as the control code. Thus, when the control code in which no error has occurred is included, 32 patterns are handled as the control code. Furthermore, here, the Pad Code has been described as an example of the control code, but as described with reference to FIG. 46, the control code includes Idle Code, Start Code, End Code, Sync Code, Deskew Code, and Standby Code in addition to the Pad Code. There are 32 patterns of data strings handled as control codes for each of these control codes.

In order to enable the decoder 12 side to handle the data 1 to 31 different by one bit as the control code in this manner, on the encoding side, control is performed not to invert the information transmission data that corresponds to any of the data 1 to 31 different by one bit when inverted. That is, the processing in which the range of the inversion prohibited data string is enlarged not only to the data string in which the control code is inverted but also to the enlarged control code is performed on the encoding side.

In a case where the information transmission data is inverted and the flag of 1 is added, and the data string after inversion is in the same pattern as any of the data strings 1 to 31 different by one bit, the information transmission data is handled as the control code on the decoder 12 side. In order to prevent such a situation, among the information transmission data, the information transmission data in which the data string after inversion becomes the same pattern as any of the data strings 1 to 31 different by one bit is prohibited from being inverted, and 0 is added as the flag.

Figure 54:
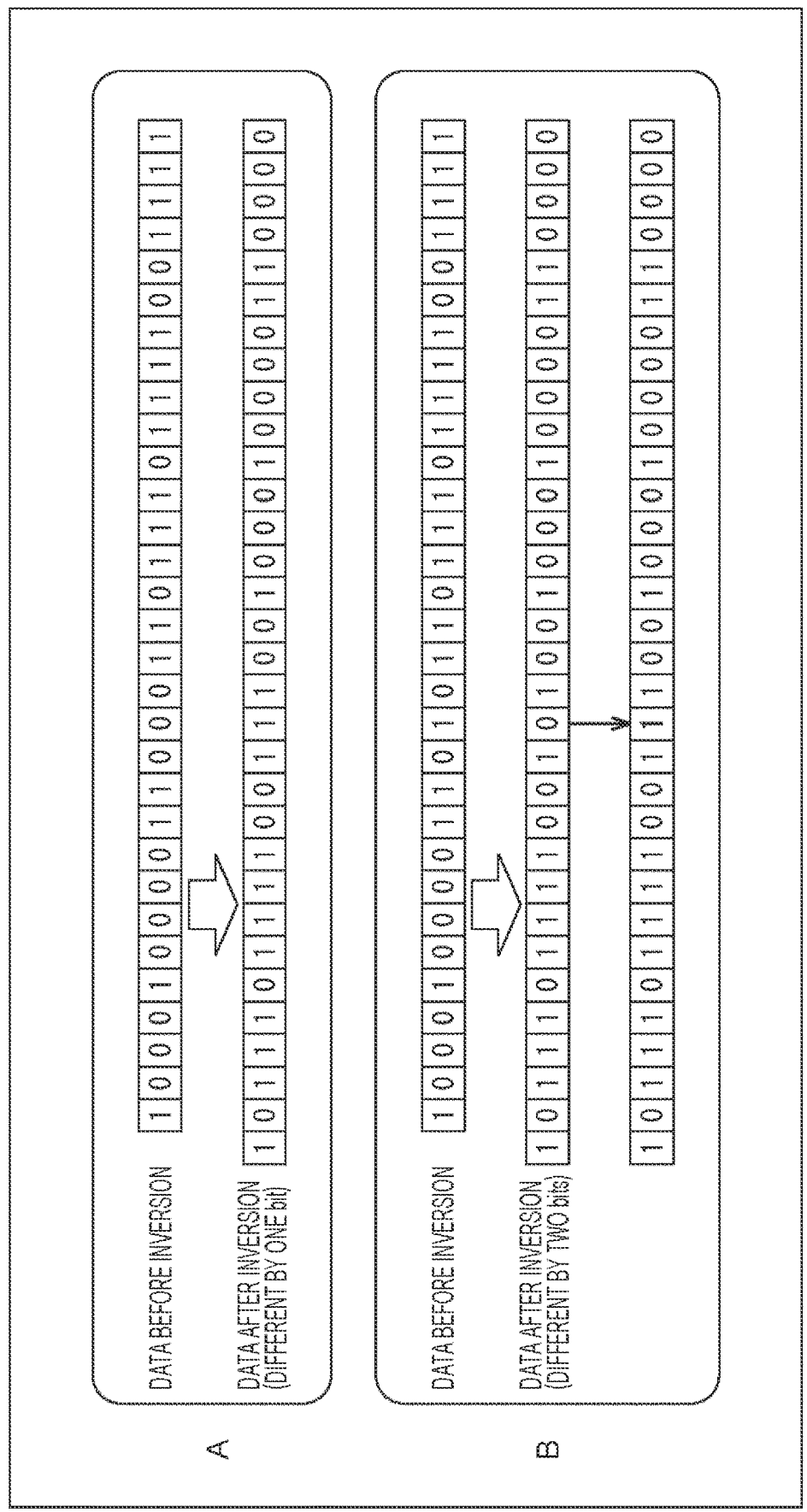
FIG. 54 is a diagram for describing an inversion prohibited data string.

Reference is made to A of FIG. 54. The upper part of A of FIG. 54 depicts data (information transmission data) before inversion. The information transmission data depicted in the upper part of A of FIG. 54 is data of 1000100001100011011101111001111. This information transmission data is not the control code.

When the information transmission data as depicted in the upper part of A of FIG. 54 is inverted, it becomes data depicted in the lower part of A of FIG. 54. The inverted information transmission data is 0111011110011100100010000110000. The inverted information transmission data is the same data string as the data 1 different by one bit among the data 1 to 31 different by one bit depicted in FIG. 53.

Furthermore, since the data depicted in the lower part of A of FIG. 54 is inverted data, 1 is added as the flag. Thus, when such inversion encoding is performed, on the decoder 12 side, since the flag is 1 and the data string is the same as the data 1 different by one bit, the data string is handled as the control code. However, since the data depicted in the lower part of A of FIG. 54 is data obtained by inverting the information transmission data and is not the control code, if the data is handled as the control code on the decoder 12 side, erroneous decoding occurs.

For this reason, the encoder 11 processes the information transmission data depicted in the upper part of A of FIG. 54 as data that is not to be inverted (inversion prohibited data string). That is, in a case where the information transmission data depicted in the upper part of A of FIG. 54 is input, the encoder 11 handles the input data as an inversion prohibited data string and executes processing of adding the flag of 0.

By performing encoding in this manner, the information transmission data depicted in the upper part of A of FIG. 54 is not inverted and the flag of 0 is added, and on the decoder 12 side, decoding is performed assuming that it is the information transmission data that is not inverted.

That is, the encoder 11 handles the information transmission data that becomes a data string different from the control code by one bit when inverted as the inversion prohibited data string, and performs encoding to add 0 as the flag. As described with reference to FIG. 54, since there are 31 patterns of data strings different by one bit from the control code, these 31 patterns of data strings are handled as inversion prohibited data strings on the encoder 11 side.

Furthermore, since there is a plurality of control codes as described above, data different by one bit of 31 patterns for each of the plurality of control codes and the information transmission data that becomes the same data string when inverted are also handled as non-inverted data.

Furthermore, as depicted in B of FIG. 54, when a two-bit error occurs, information transmission data that matches the control code may also be handled as the inversion prohibited data string.

When the information transmission data "1000100001101011011101111001111" depicted in the upper part of B of FIG. 54 is inverted, it is converted into a data string "0111011110010100100010000110000" depicted in the middle part. Moreover, in a case where a one-bit error occurs in the inverted data string, the data string becomes 0111011110011100100010000110000 depicted in the lower part.

The data string of 0111011110011100100010000110000 in which the one-bit error has occurred in the inverted data string is the same as the inverted data string depicted in the lower part of A of FIG. 54. The inverted data string depicted in the lower part of A of FIG. 54 is the same data string as the data 1 different by one bit depicted in FIG. 53.

In the information transmission data before inversion depicted in the upper part of B of FIG. 54, by occurrence of the one-bit error in the inverted data string, the data string becomes the same as the data 1 different by one bit when the one-bit error occurs in the control code. Such information transmission data may also be handled as inversion prohibited data. Here, such information transmission data is described as data different by two bits.

In this manner, the encoder 11 handles the information transmission data that becomes a control code when inverted, the information transmission data that becomes data different by one bit when a one-bit error occurs in the control code when inverted, and the information transmission data that becomes data different by two bits when a two-bit error occurs in the control code when inverted as the inversion prohibited data strings.

Figure 51:
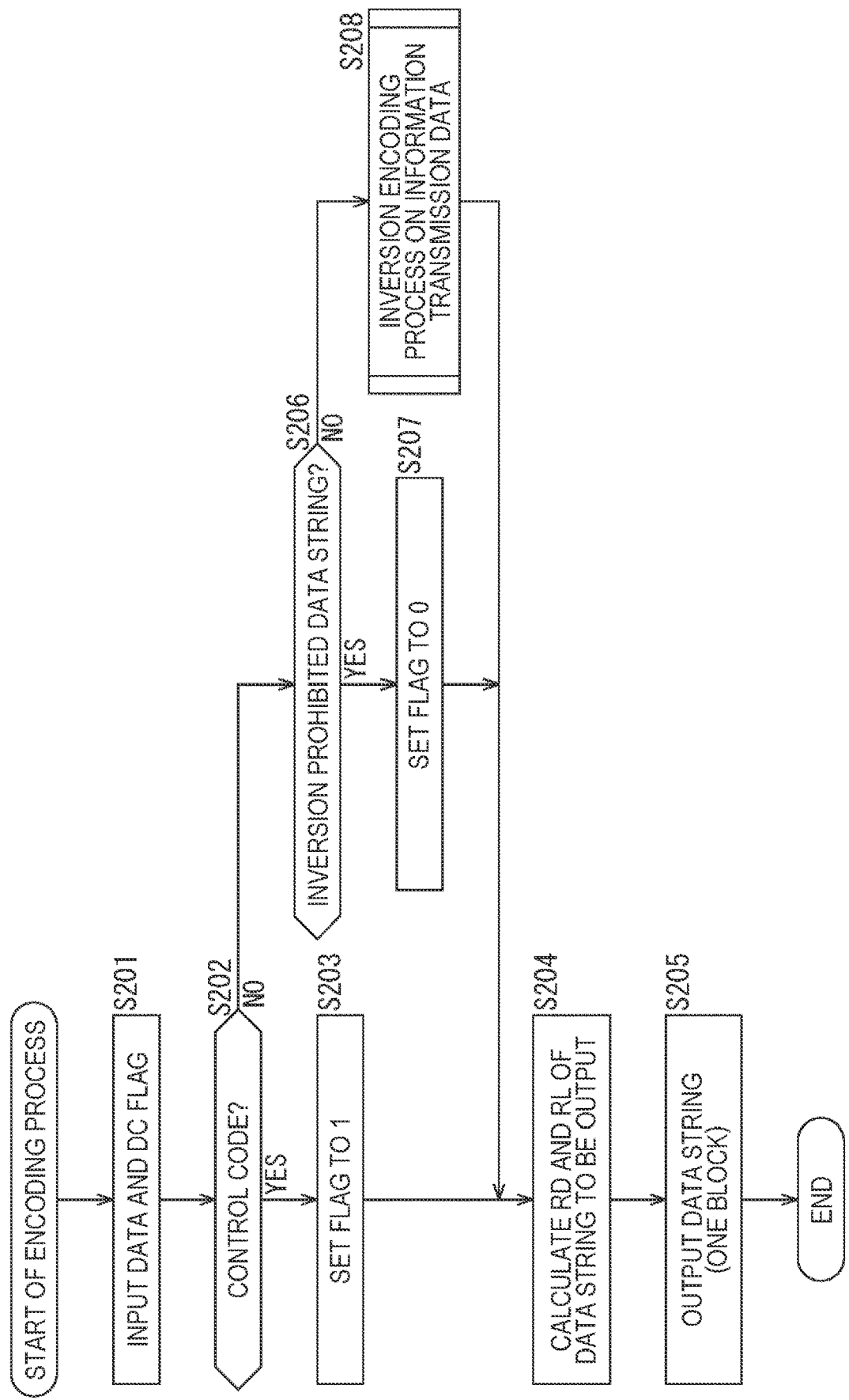
FIG. 51 is a flowchart for describing an encoding process.

In this manner, also in a case where the data string including the enlarged control code is handled as the inversion prohibited data string, the processing of the encoder 11 can be performed on the basis of the flowchart depicted in FIG. 51. That is, in step S206, it is determined whether or not the data string to be processed is the inversion prohibited data string, but the difference is that the data string set as the inversion prohibited data string is expanded not only to the information transmission data that becomes the control code when inverted but also to the above-described information transmission data (enlarged control data), and other processing can be similarly performed.

Figure 52:
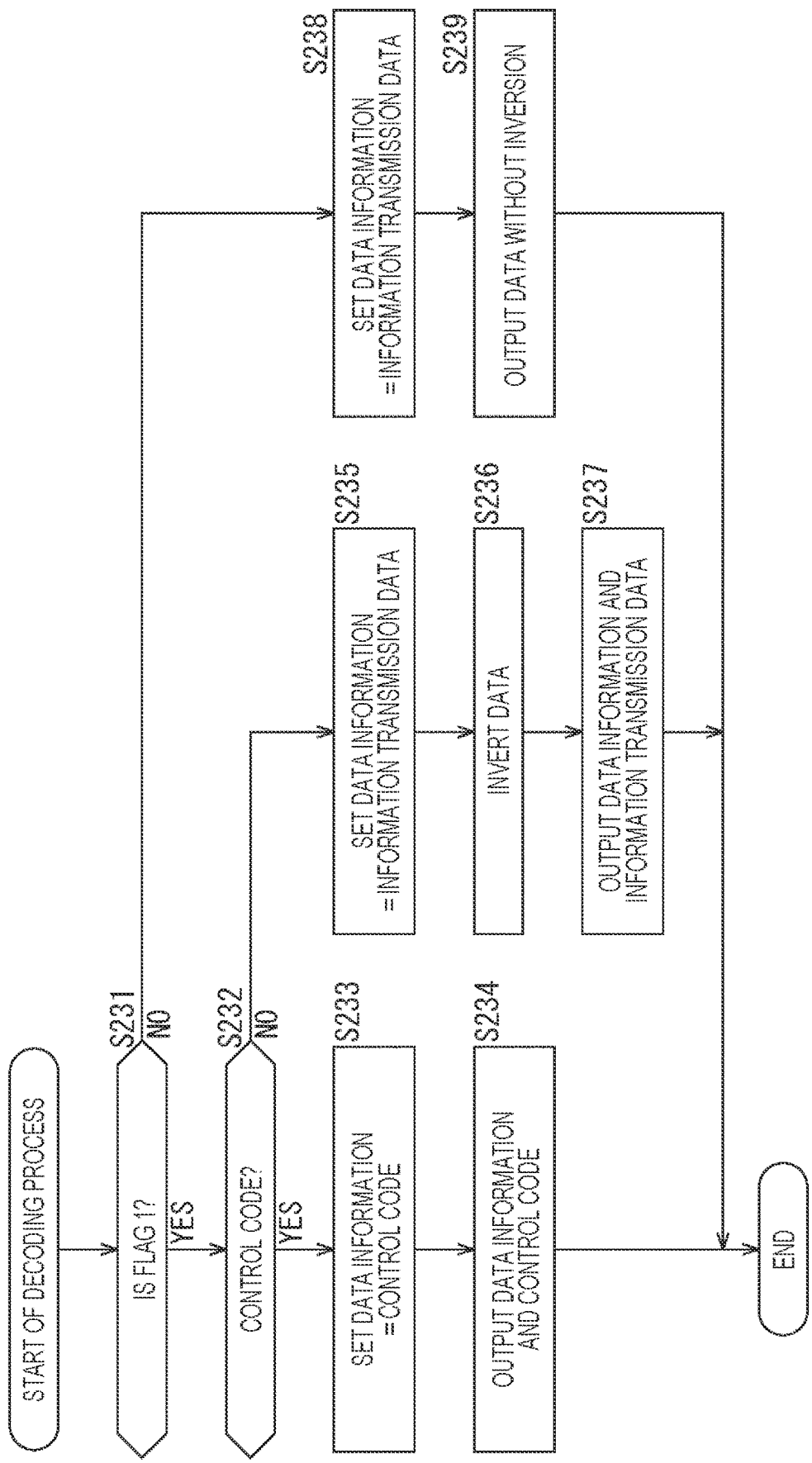
FIG. 52 is a flowchart for describing a decoding process.

Furthermore, the processing of the decoder 12 can be performed on the basis of the flowchart depicted in FIG. 52. That is, in step S232, it is determined whether or not it is the control code, but the difference is that the range of control codes for determining that it is the control code is not only the control codes but also is expanded to data different by one bit and data different by two bits, and other processing can be similarly performed.

The configurations of the encoder 11 and the decoder 12 can also be basically similar to the configurations of the encoder 11 depicted in FIG. 3 and the decoder 12 depicted in FIG. 4. However, since the range of the inversion prohibited data string is expanded on the encoder 11 side, it is necessary to add a function of executing the processing thereof. Furthermore, since the range of data strings to be determined as the control code is expanded on the decoder 12 side, it is necessary to add a function of executing the processing.

Figure 55:
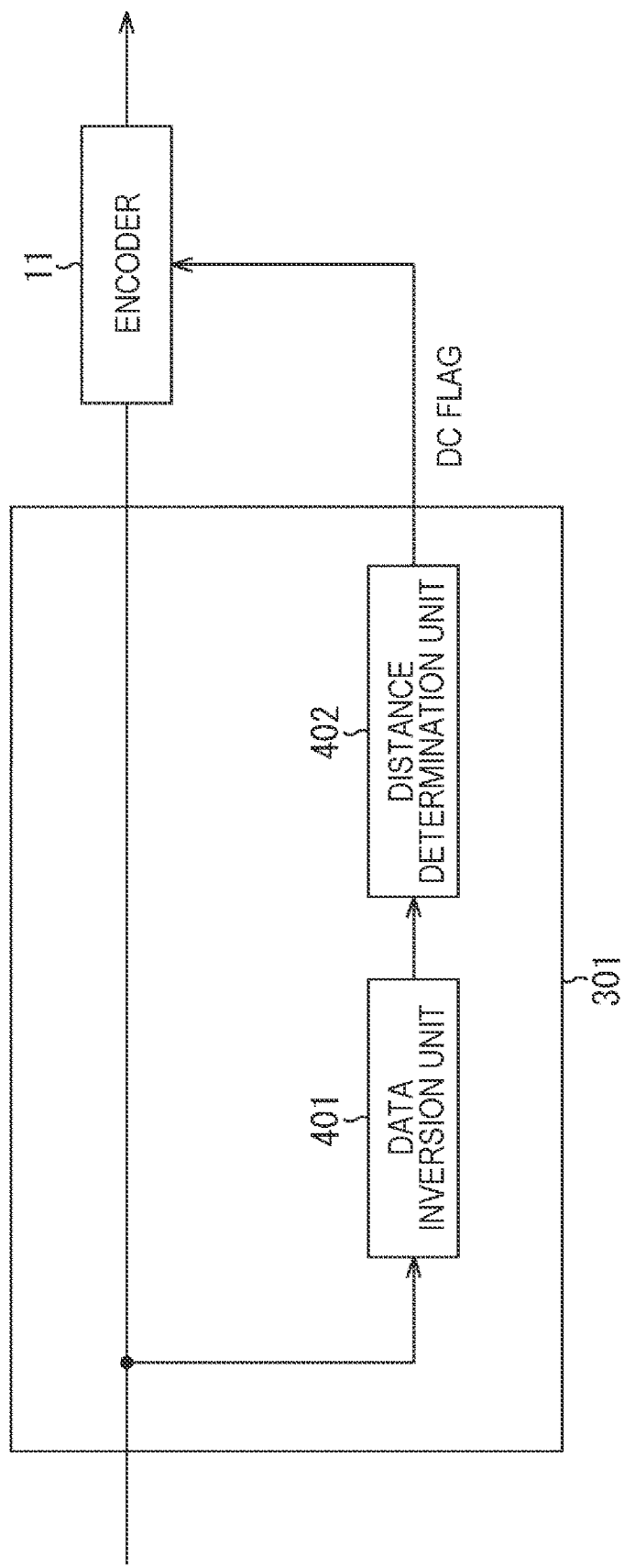
FIG. 55 is a diagram depicting a configuration example related to the encoder.

FIG. 55 depicts a configuration diagram related to the encoder 11 when the range to handle as the inversion prohibited data string is enlarged. The encoder 11 is configured to be supplied with an inversion prohibition flag from a distance determination unit 402. Furthermore, the distance determination unit 402 is configured to receive supply of data from the data inversion unit 401.

A configuration can be employed in which the data inversion unit 401 and the distance determination unit 402 are included in the pre-encoder 301. As described with reference to FIG. 43, the pre-encoder 301 distinguishes between the control code and the information transmission data, and supplies the DC flag indicating whether it is the control code or the information transmission data to the encoder 11.

A case where the data inversion unit 401 and the distance determination unit 402 are added to the pre-encoder 301 that performs such processing will be described as an example, but similarly to the pre-encoder 301, the data inversion unit 401 and the distance determination unit 402 may be provided separately from the encoder 11, or may be included in the encoder 11. The pre-encoder 301 outputs the DC flag, which is a flag indicating whether it is a control code or information transmission data. Such a DC flag is output in order to prohibit the inversion in a case of a control code. Thus, the DC flag may be used as the inversion prohibition flag and may be used as a flag indicating whether the data is inversion prohibited data or data that may be inverted.

The data inversion unit 401 included in the pre-encoder 301 inverts input data. As the data to be inverted, it is sufficient if the information transmission data is to be processed, and when control data is input, the processing in the data inversion unit 401 may not be executed. The inverted data is supplied to the distance determination unit 402. The distance determination unit 402 compares the control code with the inverted information transmission data.

The distance determination unit 402 determines whether or not the inverted data string corresponds to any one of the control code, the data string different by one bit, and the data string different by two bits. This determination is made by determining how many bits the inverted data string differs from the control code. In other words, the distance between the inverted data string and the control code is determined. For example, by determining the humming distance, a different bit depth between the inverted data string and the control code is determined.

In a case where the inverted data string matches the control code, in other words, the humming distance=0, the inverted data string is determined as the inversion prohibited data string. Furthermore, in a case where the inverted data string and the control code are different by one bit, in other words, humming distance=1, the inverted data string is determined as the inversion prohibited data string. Furthermore, in a case where the inverted data string and the control code are different by two bits, in other words, humming distance=2, the inverted data string is determined as the inversion prohibited data string.

In a case where the inverted data string and the control code are different by three bits or more, in other words, the humming distance is 3 or more, the distance determination unit 402 determines that the inverted data string is the information transmission data.

In a case where the distance determination unit 402 determines that the data string is the inversion prohibited data string, the DC flag indicating that the data string is the inversion prohibited data string is supplied to the encoder 11. The DC flag is any of a flag indicating that it is a control code, a flag indicating that it is information transmission data, and a flag indicating that it is information transmission data but is inversion prohibited data.

In this manner, it may be determined whether or not the inverted data matches the enlarged control code, and encoding may be performed using a determination result.

In addition, here, the enlarged range of control codes is up to the control code, data different by one bit, and data different by two bits, but data different by three bits or data different by four bits can also be included. Whether to secure the bit depth in which an error occurs can be appropriately set in consideration of performance required for the system and the like.

Figure 56:
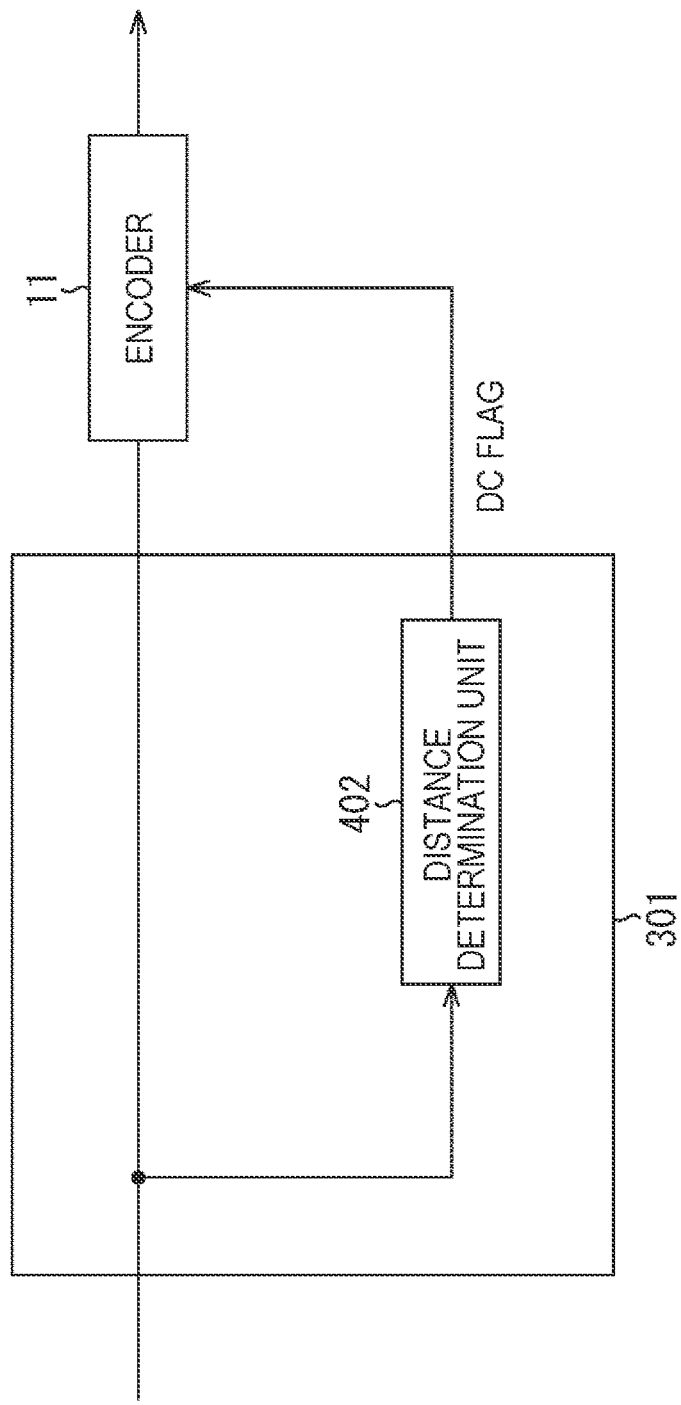
FIG. 56 is a diagram depicting another configuration example related to the encoder.

The data and the inverted control code can be configured to be compared without inverting the data. FIG. 56 depicts another configuration diagram related to the encoder 11 when the range to handle as the inversion prohibited data string is enlarged. The encoder 11 is configured to be supplied with the DC flag from the distance determination unit 411 included in the pre-encoder 301.

The distance determination unit 411 determines a distance between the input data and the inverted control code. In a case where the input data string matches the inverted control code (in a case where the humming distance=0), the distance determination unit 411 determines that the data string is the inversion prohibited data string, and outputs the DC flag indicating that the inversion is prohibited.

Further, in a case where the input data string and the inverted control code are different by one bit (in a case where the humming distance=1), the distance determination unit 411 determines that the data string is the inversion prohibited data string, and outputs the DC flag indicating that the inversion is prohibited. Furthermore, in a case where the input data string and the inverted control code are different by two bits (in a case where humming distance=2), the distance determination unit 411 determines that the data string is the inversion prohibited data string and outputs the DC flag indicating that the inversion is prohibited.

In a case where the input data string and the inverted control code are different by three bits or more (in a case where the humming distance is three or more), the distance determination unit 411 determines that the data is the information transmission data and outputs the DC flag indicating that the data that may be determined.

In this manner, it may be determined whether or not the input data matches the data string obtained by inverting the enlarged control code, and encoding may be performed using the determination result.

As described above, in the encoder 11, the information transmission data that matches the enlarged control code is handled as the inversion prohibited data string and is not to be inverted, and 0 is set as the flag.

Figure 57:
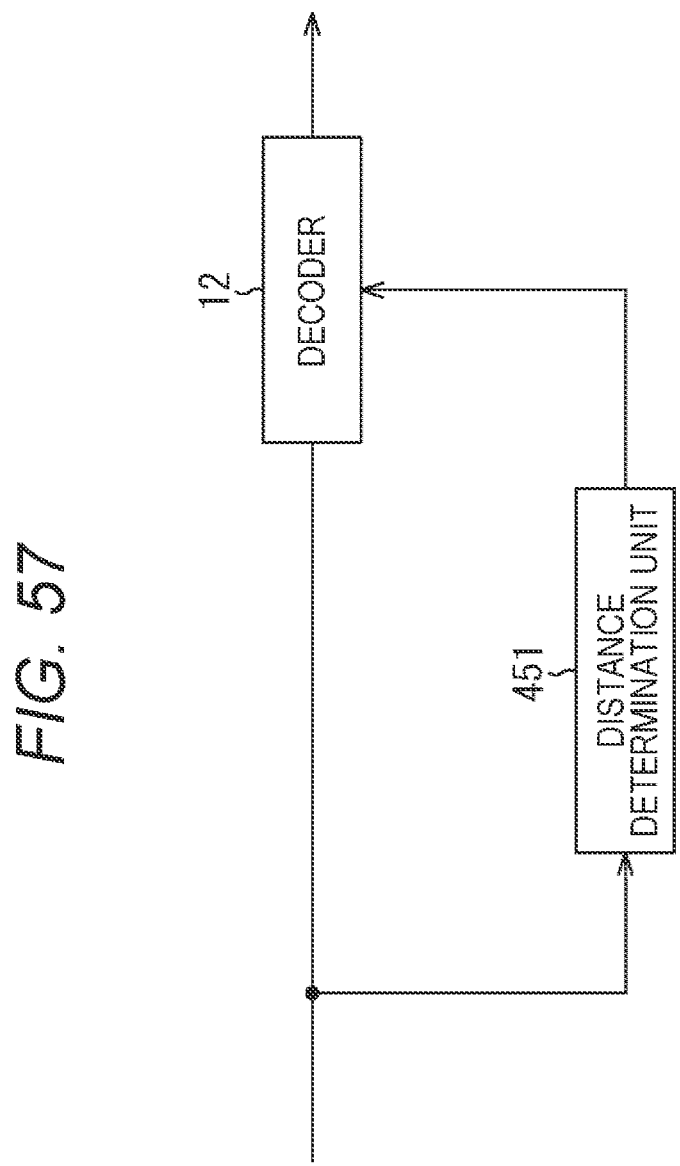
FIG. 57 is a diagram depicting a configuration example related to a decoder.

A configuration related to the decoder 12 in a case where such an enlarged control code is also handled will be described. FIG. 57 is a diagram depicting a configuration example related to the decoder 12 in a case of handling an enlarged control code.

The decoder 12 is configured to perform decoding using the determination result from the distance determination unit 451. The same data string as the data string input to the decoder 12 is input, and the distance determination unit 451 determines the distance between the input data string and the control code. The distance determination unit 451 basically determines the distance between the input data string and the control code similarly to the distance determination unit 402 (411) on the encoder 11 side.

In a case where the flag of the input data string is 1, the input data string is a control code or inverted information transmission data. In order to determine the enlarged control code as the control code, it is necessary to determine whether the data string in which the flag is 1 is the control code, the enlarged control code, or the inverted information transmission data.

Accordingly, the distance determination unit 451 determines the distance between the input data string and the control code. In a case where the input data string matches the control code (in a case where the humming distance=0), the distance determination unit 451 determines that the input data string is the control code.

Furthermore, in a case where the input data string and the control code are different from each other by one bit (in a case where the humming distance=1), the distance determination unit 451 determines that the input data string is the control code. Furthermore, in a case where the input data string and the control code are different from each other by two bits (in a case where the humming distance=2), the distance determination unit 451 determines that the input data string is the control code.

In a case where the input data string differs from the control code by three bits or more (in a case where the humming distance is three or more), the distance determination unit 451 determines that the input data string is the information transmission data.

In this manner, it is determined whether or not the input data matches the enlarged control code, and decoding may be performed using a determination result, in other words, information indicating whether the input data is the control code or the information transmission data.

In this manner, by handling the enlarged control code as the control code, even in a case where an error occurs in the control code, it is possible to handle the enlarged control code as the control code.

<Encoding and Decoding Using Scrambling Together>

Encoding and decoding are performed such that the enlarged control code is also handled as the control code, and thereby resistance when an error occurs can be enhanced. On the other hand, in a case where the enlarged control code can also be handled as the control code, there is a possibility that inversion prohibited information transmission data increases on the encoder 11 side.

As the number of pieces of the inversion prohibited information transmission data increases, the running disparity RD may increase. For example, in a case where the inversion prohibited information transmission data is continuous, there is a possibility that the running disparity RD increases. Furthermore, in a case of processing a vertical stripe image (an image referred to as what is called a killer pattern or the like) in which gradations move up and down as an image, there is a possibility that the inversion prohibited data string continues, and there is a possibility that the running disparity RD increases.

As described above, according to encoding and decoding to which the present technology is applied, the running disparity RD and the run length RL can be controlled (suppressed), but there is a possibility that the running disparity RD increases in a case where encoding and decoding that handle even the enlarged control code are performed. Accordingly, encoding and decoding capable of improving error tolerance by controlling (suppressing) the running disparity RD and the run length RL and handling even the enlarged control code will be described.

Figure 58:
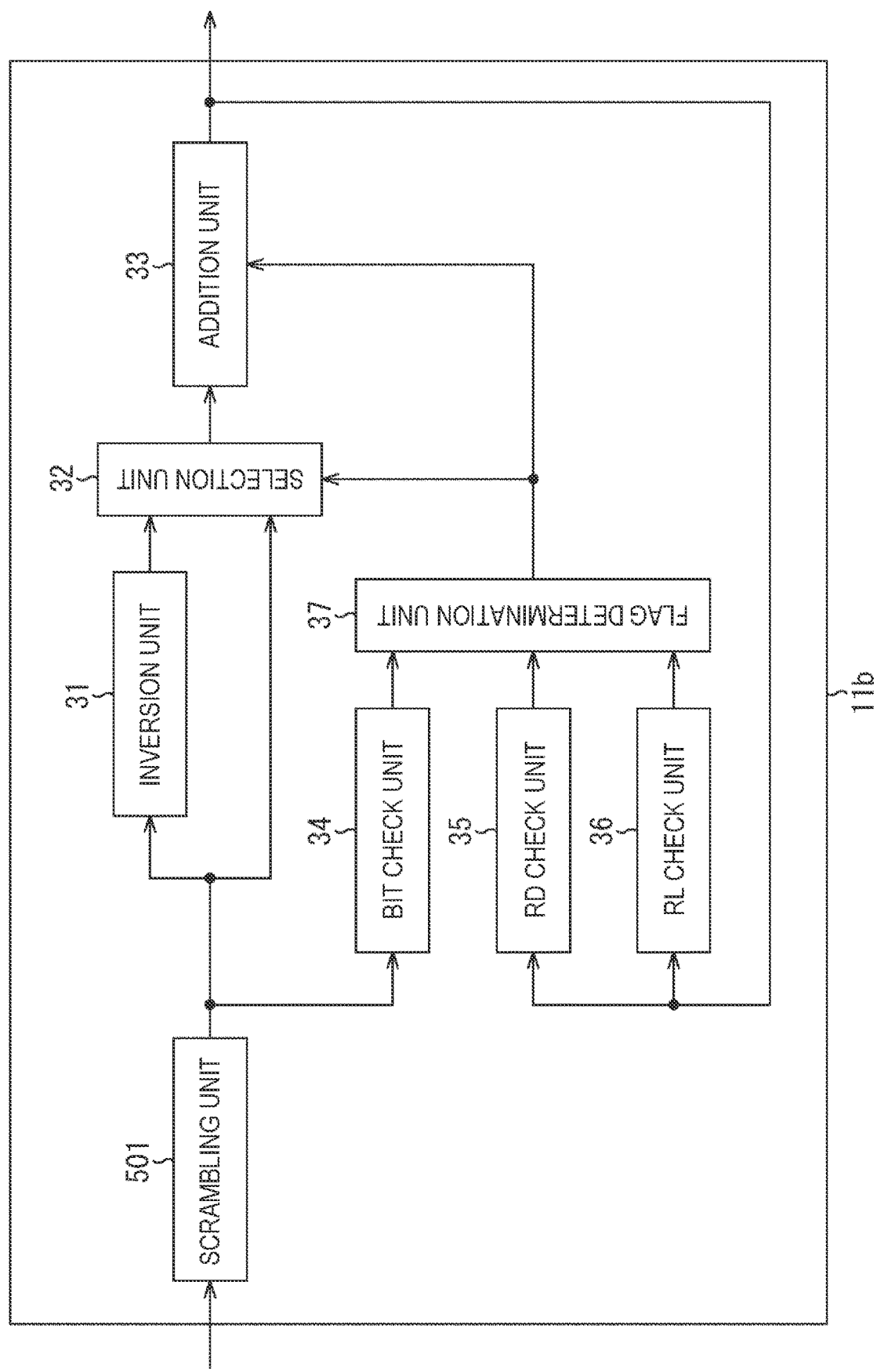
FIG. 58 is a diagram depicting another configuration example of the encoder.

FIG. 58 is a diagram depicting another configuration example of the encoder 11. As compared to the encoder 11 depicted in FIG. 3, the encoder 11b depicted in FIG. 58 is different in that a scrambling unit 501 is added, and the other points are the same. The description of the same parts as those of the encoder 11 depicted in FIG. 3 will be omitted.

The scrambling unit 501 scrambles the information transmission data input to the encoder 11b The encoder 11b performs encoding based on inversion encoding, similarly to the encoder 11 depicted in FIG. 3. The data is scrambled before the inversion encoding is performed. However, the control code is excluded from the target of scrambling, and is processed without being scrambled.

The encoder 11b may be configured such that data and a DC flag are supplied from the pre-encoder 301 (FIG. 43), or may be configured such that the pre-encoder 301 is not provided. The encoder 11b can be applied to a case of performing encoding that handles the enlarged control code and performing inversion encoding that can control the running disparity RD and the run length RL. Furthermore, the encoder 11b can be applied even in a case where encoding that does not handle the enlarged control code is performed, and can be applied in a case where encoding that can control the running disparity RD and the run length RL is performed even in such a case.

The scrambling is performed by randomizing patterns of 0 and 1 with frequent shifts so that 0 and 1 are not continuous with high probability. Furthermore, this scrambling can be returned to the original data string again on the reception side. The scrambling unit 501 performs scrambling by a generator polynomial, for example. As scrambling by a generator polynomial, scrambling using a pseudo random bit sequence (PRBS) can be applied.

An example of the generator polynomial is expressed by following Expression (7).

$$\text{PayloadScramble} = X^{15} + X^{14} + 1 \tag{7}$$

The scrambling unit 501 also scrambles the inversion prohibited data, and prevents 0 or 1 from continuing. Thus, even in a case where a situation in which inversion prohibited data is continuous occurs, it is possible to suppress an increase in the running disparity RD.

Furthermore, since the inversion encoding process is performed on the information transmission data scrambled by the scrambling unit 501, it is possible to further perform encoding by controlling the running disparity RD and the run length RL.

Figure 59:
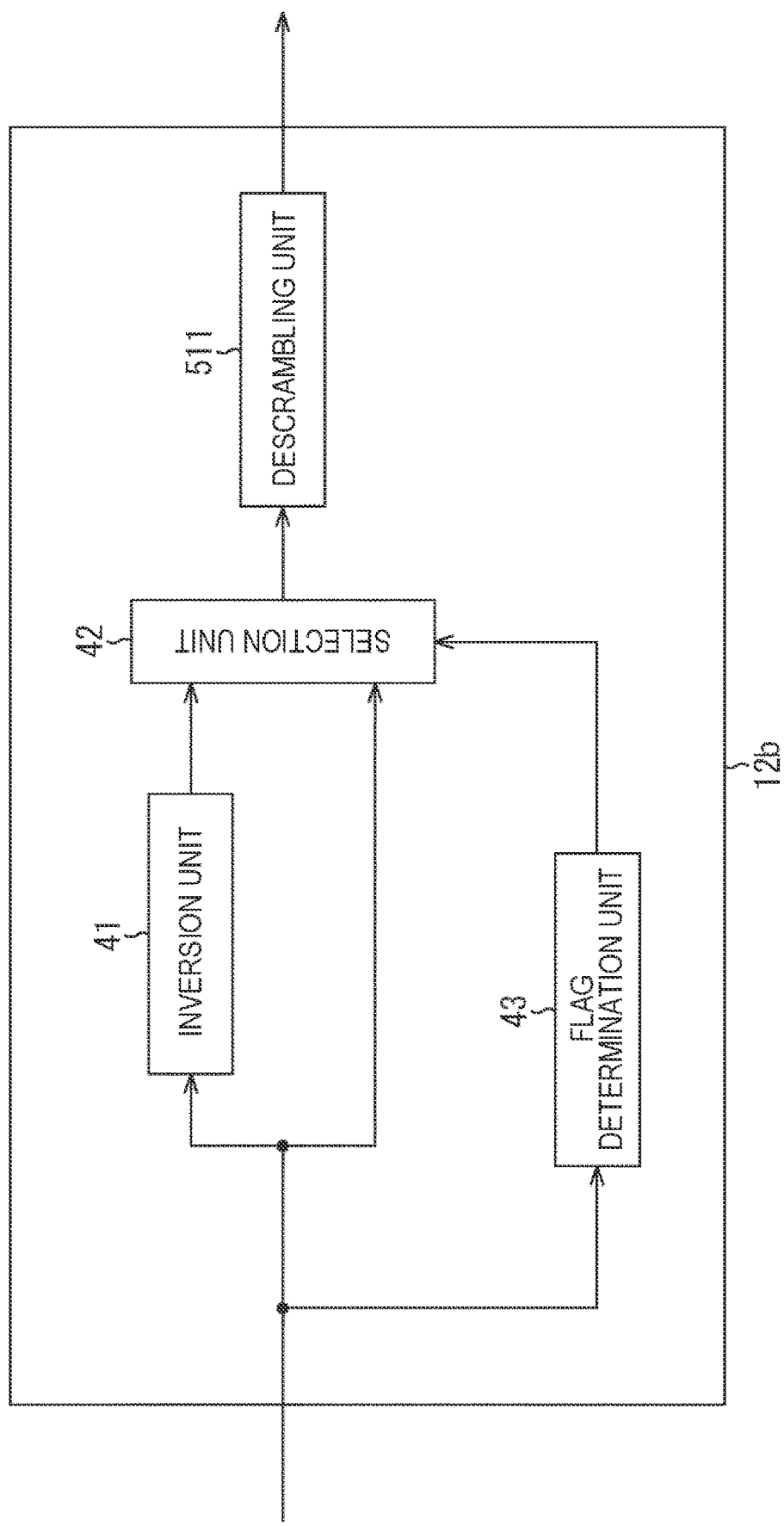
FIG. 59 is a diagram depicting another configuration example of the decoder.

FIG. 59 depicts a configuration example of the decoder 12b corresponding to the encoder 11b depicted in FIG. 58. The decoder 12b depicted in FIG. 59 is different from the decoder 12 depicted in FIG. 4 in that a descrambling unit 511 is added, and the other points are the same. The description of the same parts as those of the decoder 12 depicted in FIG. 4 will be omitted.

The descrambling unit 511 receives the supply of the decoded scrambled data string in the decoder 12b and executes a descrambling process. On the encoding side, scrambling is performed in processing before inversion encoding is performed. On the decoding side, an inversion decoding process is executed on the data on which the inversion encoding has been performed, a data string before the inversion encoding is performed is acquired, and then a process of descrambling is executed.

<Processing of Encoder and Decoder>

The processing of the encoder 11b depicted in FIG. 58 will be described with reference to a flowchart of FIG. 60.

Figure 60:
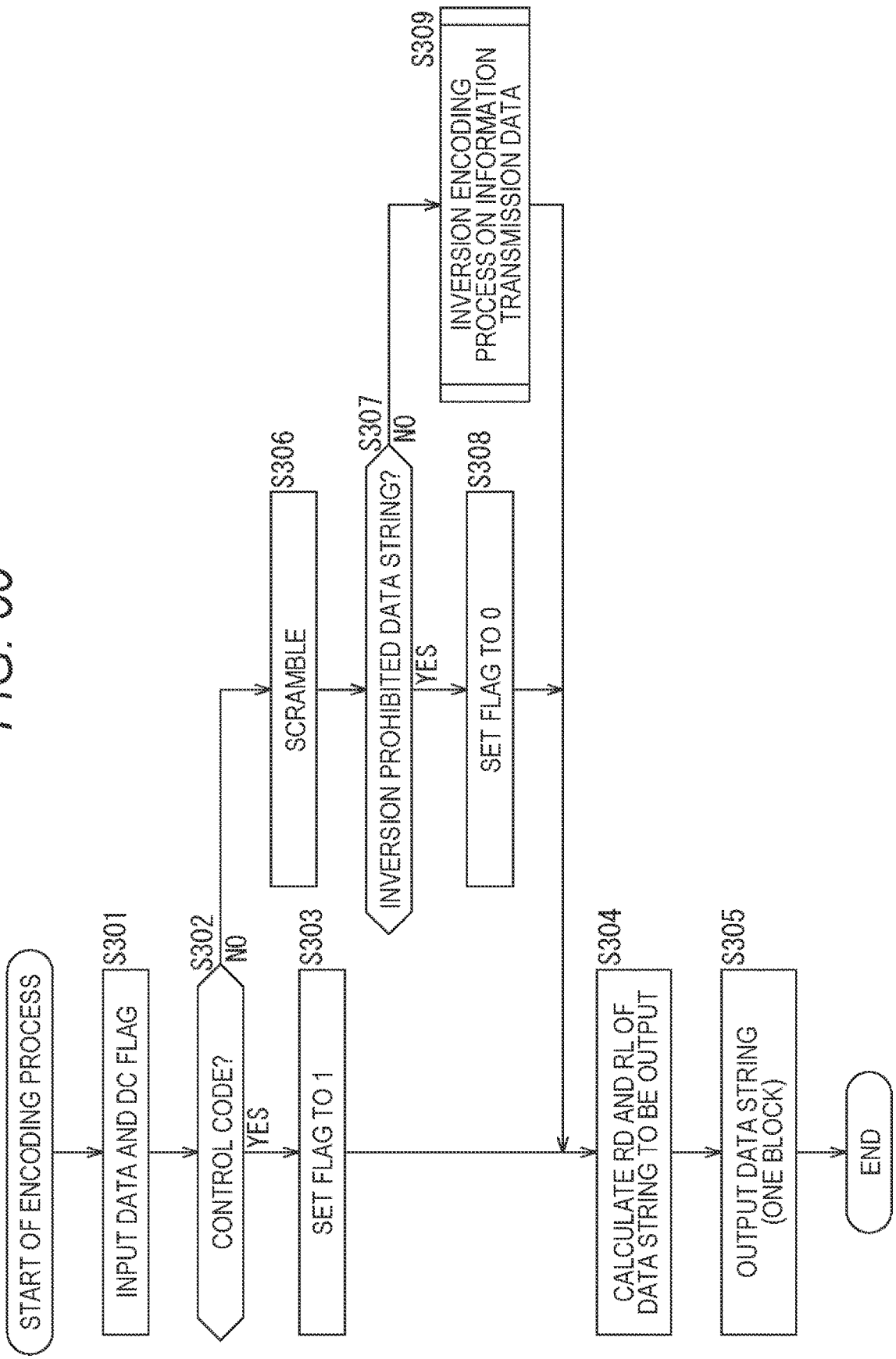
FIG. 60 is a flowchart for describing other processing of the encoder.

Processing of the flowchart depicted in FIG. 60 is different in that processing in which the scrambling unit 501 performs scrambling is added to the processing of the flowchart depicted in FIG. 51 and other processing is similar, and thus the description of similar processing will be omitted.

Steps S301 to S305 are processes similar to steps S201 to S205 (FIG. 51), and when the control code is input, the data string in which the flag is set to 1 is output without performing the inversion encoding process. Furthermore, the scrambling processing in the scrambling unit 501 is not executed on the control code.

On the other hand, in a case where it is determined in step S302 that the data string to be processed is not the control code, that is, in a case where it is determined that the data string is the information transmission data, the processing proceeds to step S306. In step S306, the information transmission data to be processed is scrambled by the scrambling unit 501.

The processes of steps S307 to S309 are executed on the scrambled information transmission data. The processes of steps S307 to S309 are similar to steps S206 to S208 (FIG. 51) and related to inversion encoding.

In this manner, the information transmission data is scrambled, and then the inversion encoding process is executed to perform encoding.

Next, processing of the decoder 12b depicted in FIG. 59 will be described with reference to a flowchart of FIG. 61.

Figure 61:
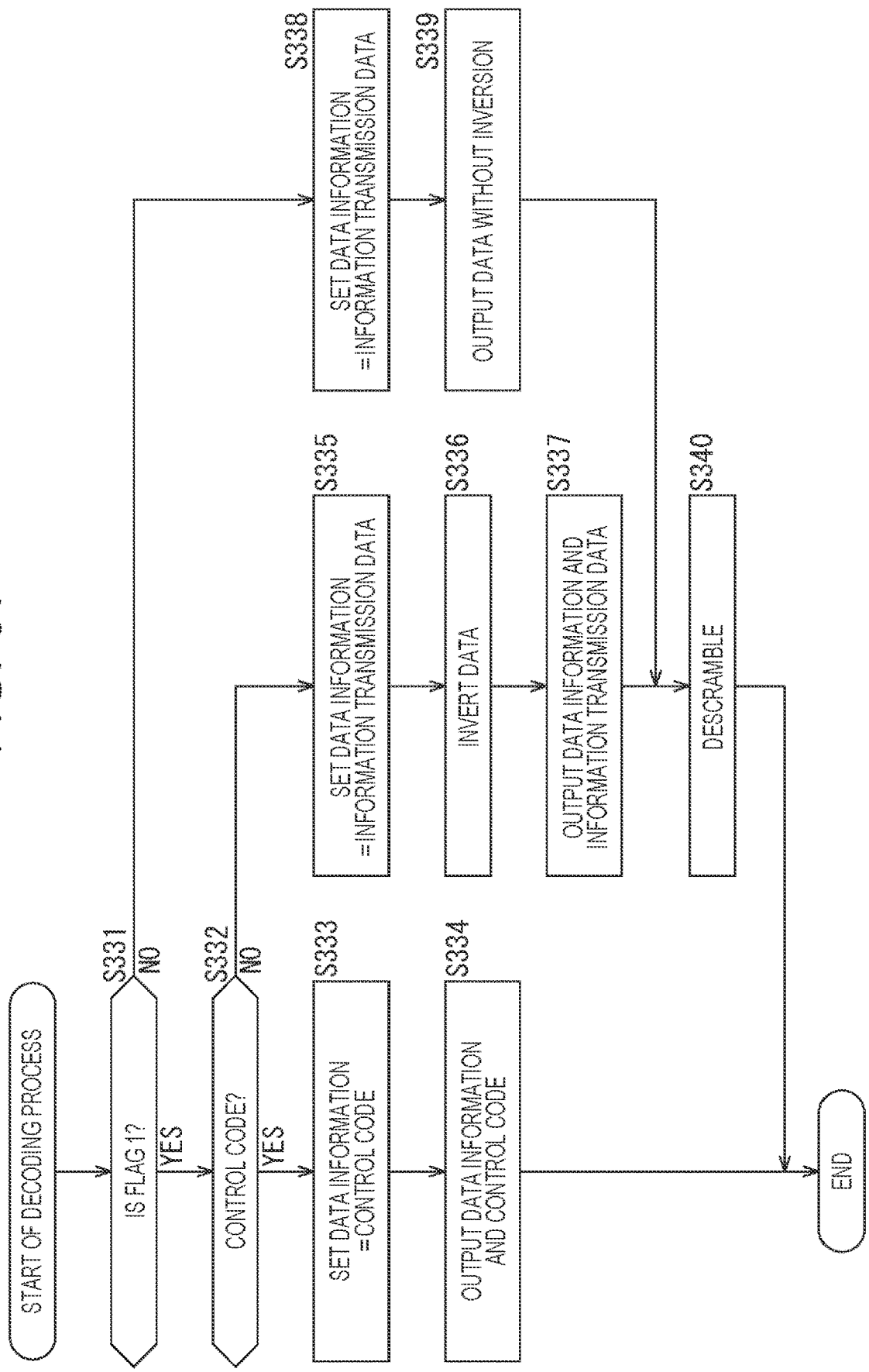
FIG. 61 is a flowchart for describing other processing of the decoder.

Processing of the flowchart depicted in FIG. 61 is different in that processing in which the descrambling unit 511 performs descrambling is added to the processing of the flowchart depicted in FIG. 52 and other processing is similar, and thus the description of similar processing will be omitted.

Steps S331 to S339 are processes similar to steps S231 to S239 (FIG. 52), and an inversion decoding process for the information transmission data is executed. In a case of the control code, since the inversion encoding and the scrambling are not executed, in a case where the data string is determined to be the control code, the data string is processed as the control code.

On the other hand, on data that is not the control code, that is, the information transmission data, the inversion decoding process is executed, to thereby acquire the information transmission data in a scrambled state.

In step S340, the descrambling unit 511 generates a descrambled data string by executing a descrambling process on the scrambled information transmission data.

In this manner, the inversion decoding is performed on the inversely encoded information transmission data, and decoding is performed by executing descrambling processing on the scrambled information transmission data.

By performing encoding and decoding in this manner, the running disparity RD and the run length RL can be further controlled (suppressed).

Note that, in a case where scrambling is performed, a control code for resetting scrambling may be newly defined and exchanged between the encoder 11 and the decoder 12. Furthermore, the control code for resetting the scrambling may enable timing of reset to be performed for an arbitrary number of lines (LINE).

<Other Processing of Encoder and Decoder>

Other processing of the encoder 11b depicted in FIG. 58 will be described with reference to a flowchart of FIG. 62.

Figure 62:
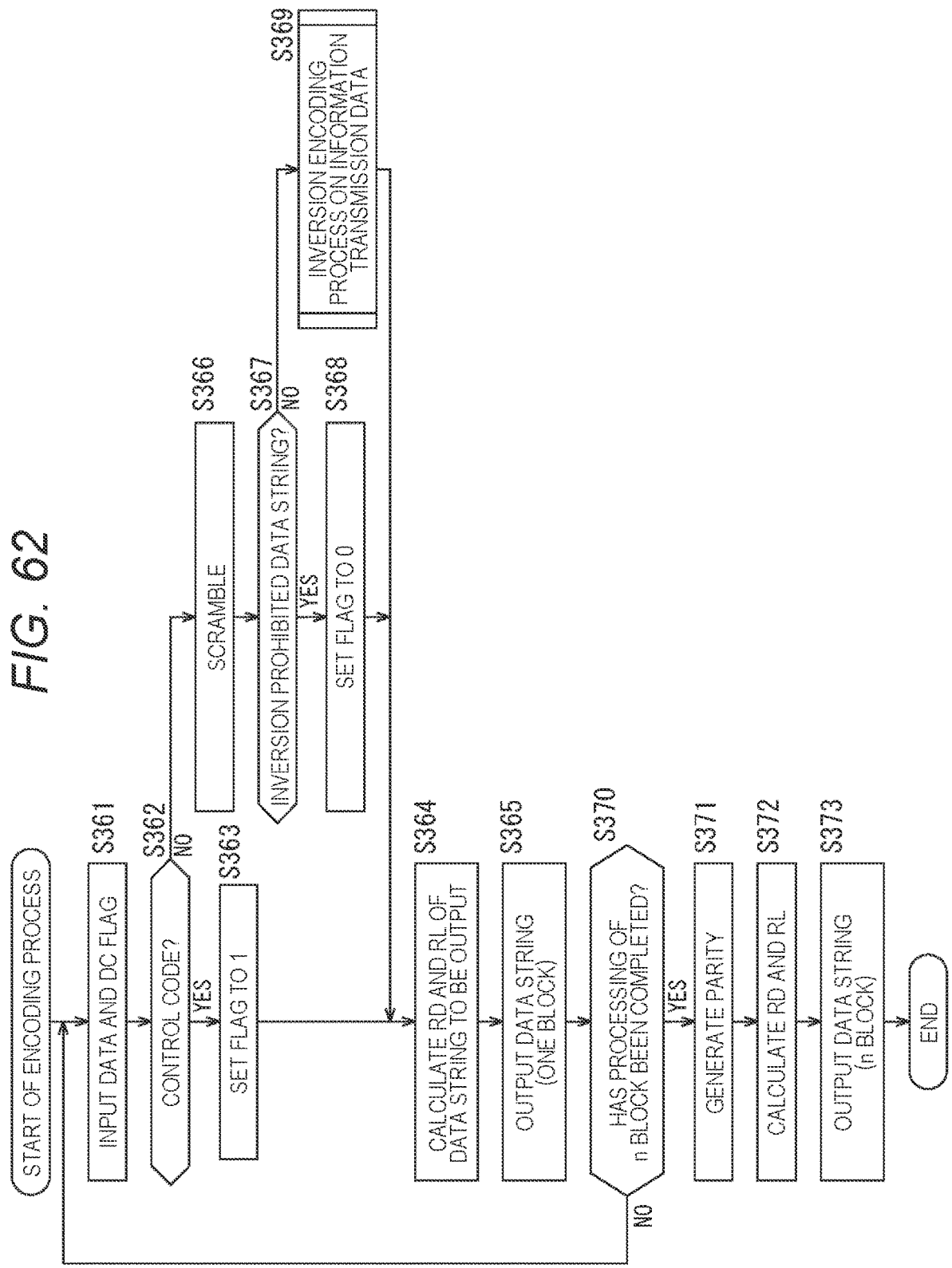
FIG. 62 is a flowchart for describing other processing of the encoder.

Processing of the flowchart depicted in FIG. 62 is different in that processing of adding the parity is included in the processing of the flowchart depicted in FIG. 60 and other processing is similar, and thus the description of similar processing will be omitted.

Steps S361 to S365 are processes similar to steps S301 to S305 in FIG. 60 (steps S201 to S205 in FIG. 51), and a process for one predetermined block is performed.

In step S370, it is determined whether or not the processing of n blocks has been completed. For example, in a case where the parity is calculated and added to every four blocks as described with reference to FIG. 12 or 13, n blocks are set to four blocks (n=4), and in step S370, it is determined whether or not the processing of the four blocks has been completed.

In a case where it is determined in step S370 that the processing of the n blocks has not been completed, the processing returns to step S361, and the subsequent processing is repeated. On the other hand, in a case where it is determined in step S370 that the processing of the n blocks has been completed, the processing proceeds to step S371.

In step S371, the parity is generated and added to the n block. The generation of the parity can be performed on the basis of the method described with reference to FIG. 12 or 13.

In step S372, the running disparity RD and the run length RL of the data string to be output are calculated. This processing is basically performed similarly to step S364 (processing of S204 of FIG. 51), but in step S372, the running disparity RD and the run length RL of n blocks including the parity are calculated.

In step S373, data strings of n blocks are output.

Figure 63:
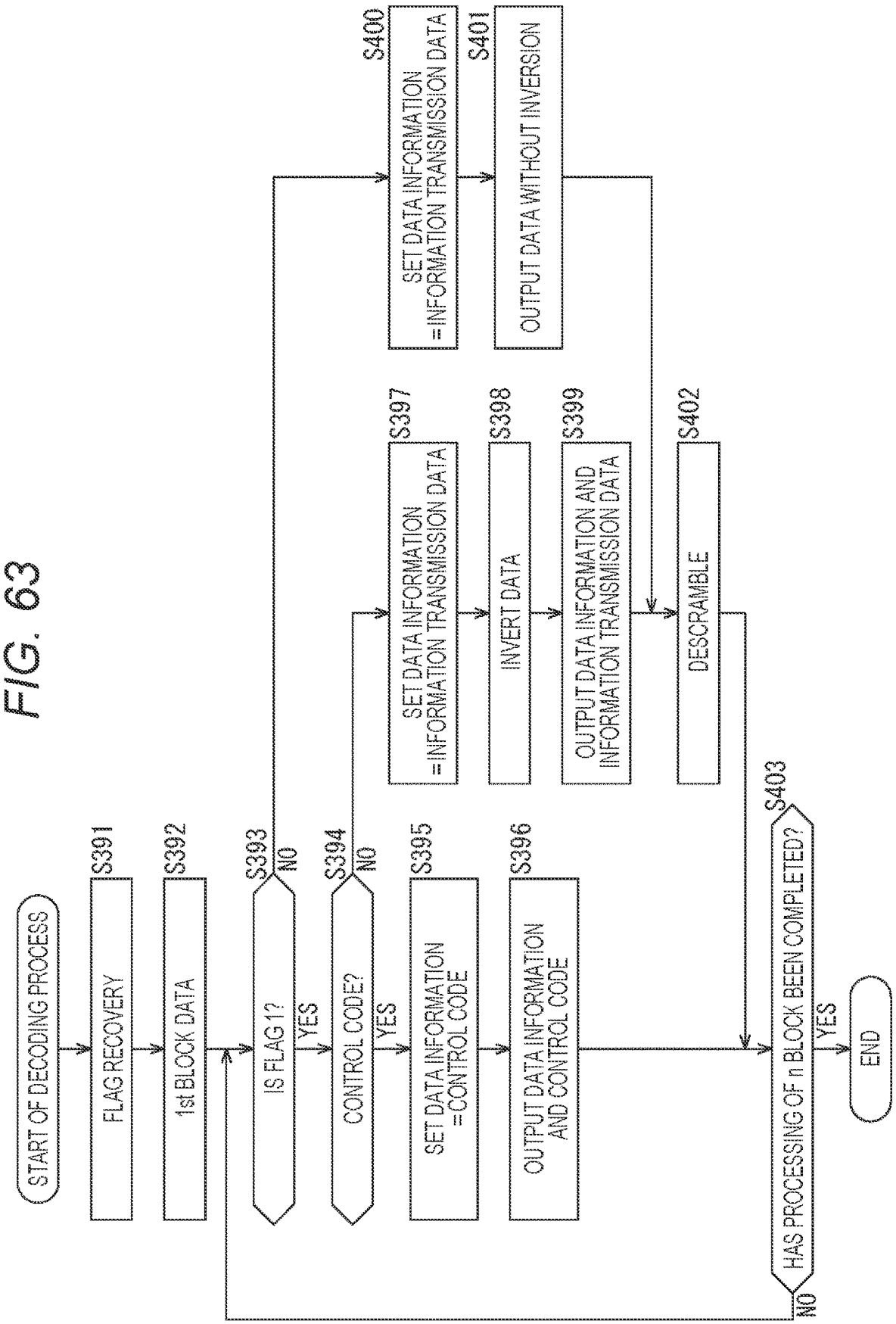
FIG. 63 is a flowchart for describing other processing of the decoder.

Next, other processing of the decoder 12b depicted in FIG. 59 will be described with reference to a flowchart of FIG. 63.

The processing of the flowchart depicted in FIG. 61 described above is processing for one received block, whereas processing of the flowchart depicted in FIG. 63 described below is different in that it is processing for n received blocks and other processing is similar, and thus the description of similar processing will be omitted.

In step S391, flag recovery is performed. Every time the data string of n blocks is processed, the flag is recovered. The flag is the flag added to each block described with reference to FIGS. 12 and 13, and is recovered by determining whether or not there is an error in the flag using the parity.

In step S392, the data string (1st block data) of the first block among the received data strings of n blocks is set as the data string of the block to be processed.

Since steps S393 to S402 are processes similar to steps S331 to S340 in FIG. 61 (steps S231 to S239 in FIG. 52), and the description thereof will be omitted.

In step S403, it is determined whether or not the processing of n blocks has been completed. In a case where it is determined in step S403 that the processing of the n blocks has not been completed, the processing returns to step S393, the next block is set as a target of processing, and the processing of step S393 and subsequent steps is repeated.

On the other hand, in a case where it is determined in step 403 that the processing of the n blocks has been completed, the decoding process on the data string of the n blocks is terminated.

By performing encoding and decoding in this manner, the running disparity RD and the run length RL can be further controlled (suppressed).

According to encoding and decoding to which the present technology is applied, the running disparity RD and the run length RL can be controlled (suppressed) with a simple circuit configuration without deteriorating transmission efficiency. Furthermore, by making it possible to detect the error of the flag, it is possible to perform processing with improved reliability of the received data on the reception side.

Furthermore, the running disparity RD and the run length RL of the data string having a special data string such as the control code can be limited. Thus, even in a case where the control codes are continuous, it is possible to suppress deterioration of the running disparity RD and the run length RL. Furthermore, by suppressing deterioration of the running disparity RD and the run length RL of the control code, it is possible to improve a system of processing using the control code such as a clock on the reception side.

<Configuration Example of Computer>

The series of processes described above can be executed by hardware or can be executed by software. In a case where the series of processes is executed by software, a program constituting the software is installed on a computer built into dedicated hardware or a general-purpose personal computer from a program recording medium, or the like.

Figure 64:
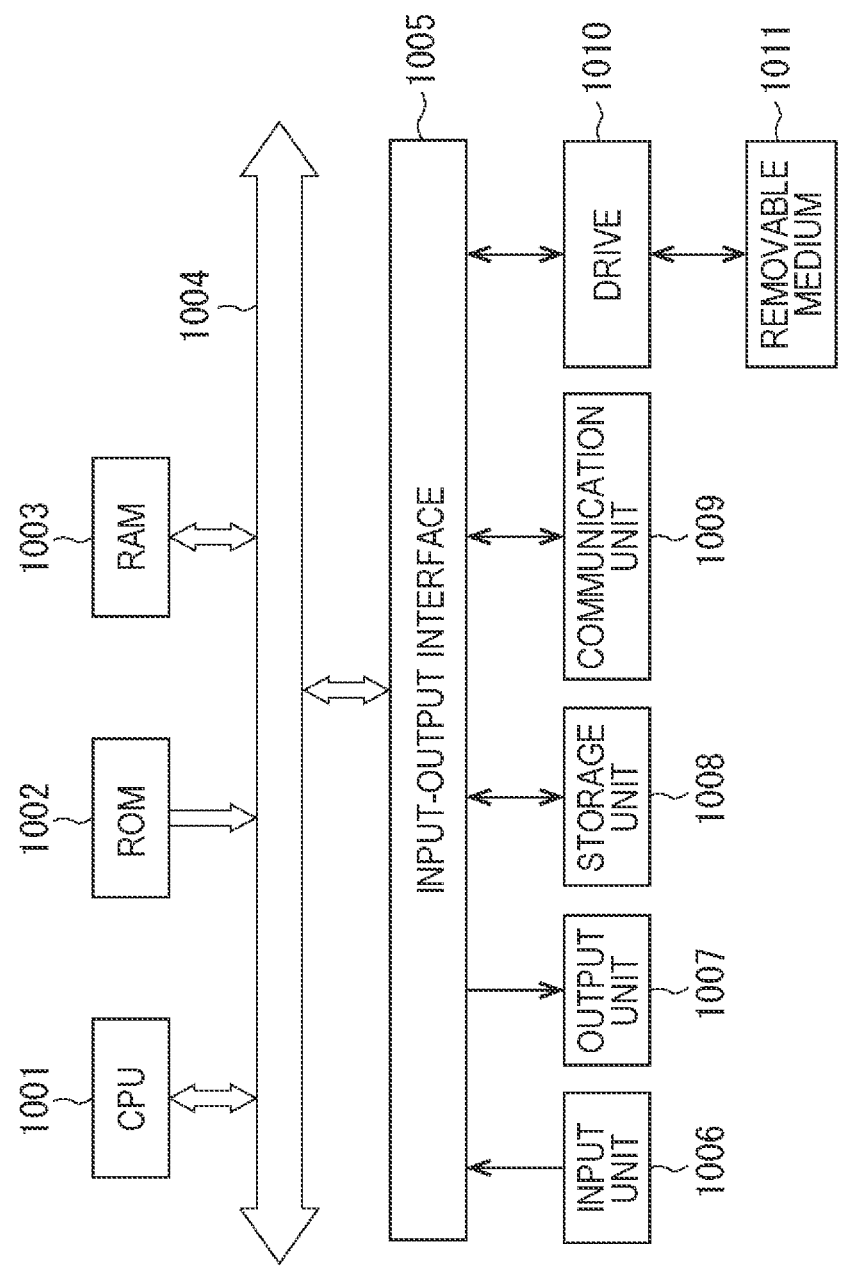
FIG. 64 is a block diagram depicting a configuration example of a computer.

FIG. 64 is a block diagram depicting a configuration example of hardware of a computer that executes the above-described series of processes by a program.

A central processing unit (CPU) 1001, a read only memory (ROM) 1002, and a random access memory (RAM) 1003 are interconnected via a bus 1004.

An input-output interface 1005 is further connected to the bus 1004. An input unit 1006 including a keyboard, a mouse, and the like, and an output unit 1007 including a display, a speaker, and the like are connected to the input-output interface 1005. Furthermore, the input-output interface 1005 is connected to a storage unit 1008 including a hard disk and a non-volatile memory and the like, a communication unit 1009 including a network interface and the like, and a drive 1010 that drives a removable medium 1011.

In the computer configured as described above, for example, the CPU 1001 loads a program stored in the storage unit 1008 into the RAM 1003 via the input-output interface 1005 and the bus 1004 and executes the program, to thereby perform the above-described series of processes.

For example, the program to be executed by the CPU 1001 is recorded on the removable medium 1011 or provided via a wired or wireless transmission medium such as a local area network, the Internet, or a digital broadcast, and installed in the storage unit 1008.

Note that the program executed by the computer may be a program for processing in time series in the order described in the present description, or a program for processing in parallel or at a necessary timing such as when a call is made.

The effects described herein are merely examples and are not limited, and other effects may be provided.

The embodiments of the present technology are not limited to the above-described embodiments, and various modifications are possible without departing from the gist of the present technology.

For example, the present technology can employ a configuration of cloud computing in which one function is shared by a plurality of devices via a network and processed jointly.

Furthermore, each step described in the above-described flowcharts can be executed by one device, or can be executed in a shared manner by a plurality of devices.

Moreover, in a case where a plurality of processes is included in one step, the plurality of processes included in the one step can be executed in a shared manner by a plurality of devices in addition to being executed by one device.

<Example of Application to Endoscopic Surgery System>

The technology according to the present disclosure (the present technology) can be applied to various products. For example, the technology according to the present disclosure may be applied to an endoscopic surgery system.

Figure 65:
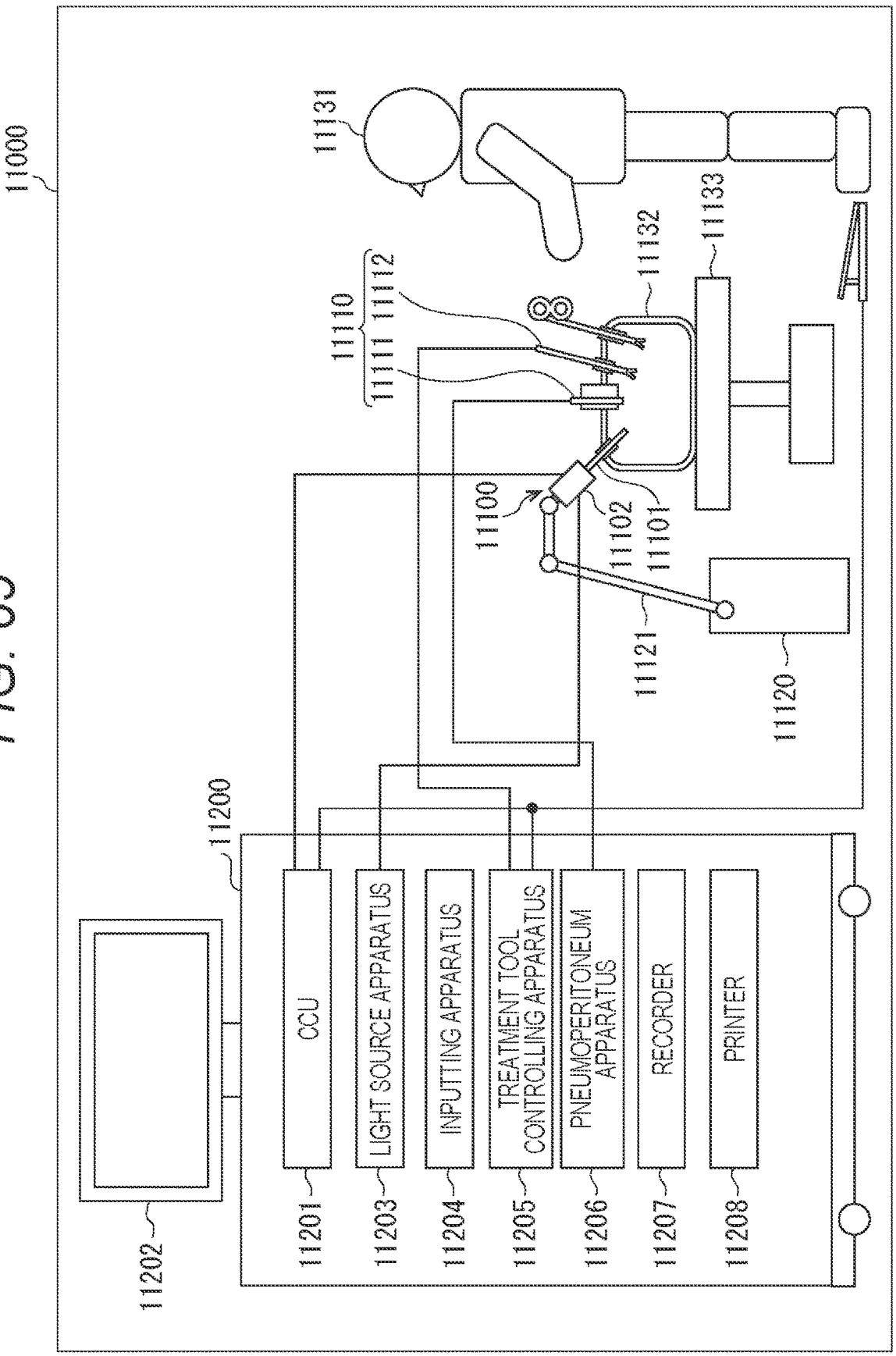
FIG. 65 is a diagram depicting an example of a schematic configuration of an endoscopic surgery system.

FIG. 65 is a view depicting an example of a schematic configuration of an endoscopic surgery system to which the technology according to an embodiment of the present disclosure (present technology) can be applied.

In FIG. 65, a state is depicted in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as PAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 66:
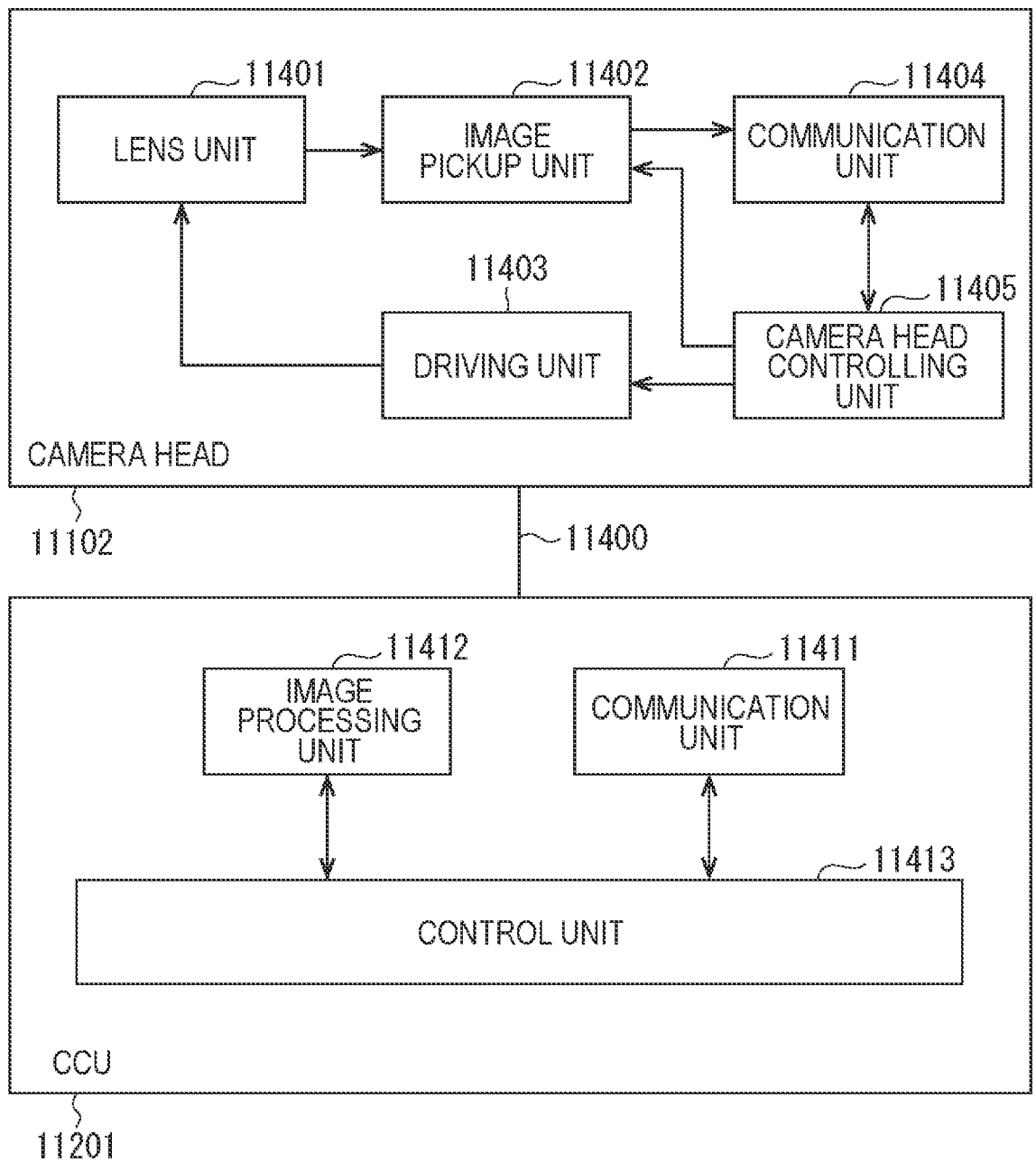
FIG. 66 is a block diagram depicting an example of functional configurations of a camera head and a camera control unit (CCU).

FIG. 66 is a block diagram depicting an example of a functional configuration of the camera head 11102 and the CCU 11201 depicted in FIG. 65.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

In the present description, the system represents the entire device including a plurality of devices.

Note that the effects described herein are merely examples and are not limited, and other effects may be provided.

Note that the embodiments of the present technology are not limited to the above-described embodiments, and various modifications are possible without departing from the gist of the present technology.

Note that the present technology can have configurations as follows.

(1)

An encoding device including:
a scrambling unit that scrambles an input data string;
a calculation unit that calculates a first running disparity of the data string scrambled by the scrambling unit;
a determination unit that determines whether or not to invert the data string scrambled by the scrambling unit on the basis of the first running disparity calculated by the calculation unit and a second running disparity calculated at a time point before the first running disparity; and
an addition unit that inverts or non-inverts the data string scrambled by the scrambling unit on the basis of a determination result by the determination unit, adds a flag indicating the determination result, and outputs the data string.

(2)

The encoding device according to (1) above, in which
the scrambling unit does not perform scrambling in a case where the input data is a control code.

(3)

The encoding device according to (1) or (2) above, in which
the determination unit compares a first absolute value of a value obtained by adding the first running disparity and the second running disparity with a second absolute value of a value obtained by adding an inverted value of the first running disparity and the second running disparity, and determines to perform inversion in a case where the second absolute value is smaller than the first absolute value.

(4)

The encoding device according to (3) above, in which the first running disparity and the second running disparity are values including the flag.

(5)

The encoding device according to any one of (1) to (4) above, in which after the determination by the determination unit, it is determined whether or not a run length continuing from a time point before a data string scrambled by the scrambling unit is a predetermined threshold or more, and in a case where the run length is equal to or more than a predetermined threshold, processing is performed with a determination result different from the determination result of the determination unit.

(6)

The encoding device according to any one of (1) to (5) above, in which when a data string of a predetermined bit depth is set as one block and a plurality of blocks is set as one processing unit, the flag of a last block of the one processing unit is set to a calculation result of exclusive OR of the flags added to blocks other than the last block of the one processing unit.

(7)

The encoding device according to (6) above, in which the last block is processed as a data string that is not to be inverted.

(8)

The encoding device according to any one of (1) to (7) above, in which when a data string of a predetermined bit depth is set as one block and a plurality of blocks is set as one processing unit, a result of a Humming coding process performed on the flag included in the one processing unit is added after a last block of the one processing unit.

(9)

The encoding device according to any one of (1) to (8) above, in which the determination unit determines to perform inversion in a case where the first running disparity is larger than 0 and the second running disparity is larger than 0, and determines not to perform inversion in a case where the first running disparity is larger than 0 and the second running disparity is smaller than 0.

(10)

The encoding device according to any one of (1) to (9) above, in which the determination unit determines not to perform inversion in a case where the first running disparity is smaller than 0 and the second running disparity is larger than 0, and determines to perform inversion in a case where the first running disparity is smaller than 0 and the second running disparity is larger than 0.

(11)

An encoding method including, by an encoding device:
scrambling an input data string;
calculating a first running disparity of the scrambled data string;
determining whether or not to invert the scrambled data string on the basis of the calculated first running disparity and a second running disparity calculated at a time point before the first running disparity; and
inverting or non-inverting the scrambled data string on the basis of a determination result, adding a flag indicating the determination result, and outputting the data string.

(12)

A program for causing a computer that controls an encoding device to execute processing including:
scrambling an input data string;
calculating a first running disparity of the scrambled data string;
determining whether or not to invert the scrambled data string on the basis of the calculated first running disparity and a second running disparity calculated at a time point before the first running disparity; and
inverting or non-inverting the scrambled data string on the basis of a determination result, adding a flag indicating the determination result, and outputting the data string.

(13)

A decoding device including:
a determination unit that refers to a flag added to an input data string and determines whether or not the data string has been inverted;
an output unit that inverts and outputs the input data string in a case where the determination unit determines that the data string has been inverted, and outputs the input data string without inversion in a case where the determination unit determines that the data string has not been inverted; and
a descrambling unit that descrambles the data string output by the output unit.

(14)

The decoding device according to (13) above, in which the determination unit does not execute processing by the descrambling unit in a case where the data string is determined to be a control code.

(15)

The decoding device according to (13) or (14) above, further including calculating a running disparity of the data output from the output unit and determining whether or not the running disparity tends to increase, to determine whether or not an error has occurred in the input data.

(16)

The decoding device according to any one of (13) to (15) above, in which when a data string of a predetermined bit depth is set as one block and a plurality of blocks is set as one processing unit, the flag of a last block of the one processing unit determines whether or not there is an error in the flag from a calculation result of exclusive OR of the flags included in the one processing unit when the one processing unit set in a calculation result of exclusive OR of the flag added to blocks other than the last block of the one processing unit is decoded.

(17)

The decoding device according to any one of (13) to (16) above, in which when a data string of a predetermined bit depth is set as one block and a plurality of blocks is set as one processing unit, when the one processing unit to which a Humming result obtained by performing a Humming coding process on the flag included in the one processing unit is added after a last block of the one processing unit is decoded, the Humming result is decoded, and whether or not there is an error in the flag is determined.

(18)

A decoding method including, by a decoding device:
- referring to a flag added to an input data string and determining whether or not the data string has been inverted;
- inverting and outputting the input data string in a case where the data string is determined to have been inverted, and outputting the input data string without inversion in a case where the data string is determined to have not been inverted; and
- descrambling the data string output.

(19)

A program for causing a computer that controls a decoding device to execute processing including:
- referring to a flag added to an input data string and determining whether or not the data string has been inverted;
- inverting and outputting the input data string in a case where the data string is determined to have been inverted, and outputting the input data string without inversion in a case where the data string is determined to have not been inverted; and
- descrambling the data string output.

REFERENCE SIGNS LIST

11 Encoder
12 Decoder
31 Inversion unit
32 Selection unit
33 Addition unit
34 Bit check unit
35 RD check unit
36 RL check unit
37 Flag determination unit
41 Inversion unit
42 Selection unit
43 Flag determination unit
61 Error detection unit
71 State control unit
72 Header generation unit
73 Data insertion unit
74 Footer generation unit
81 Block
82 Parity bit
100 Transmission system
111 Image sensor
121 Image pickup unit
122 Transmission unit
131 Reception unit
132 Image processing unit
151 System control unit
152 Frame data input unit
153 Register
161 TX protocol management unit
162 Byte converter
163 Payload ECC insertion unit
164 Packet generation unit
165 Lane distribution unit
171 State control unit
172 Header generation unit
173 Data insertion unit
174 Footer generation unit
181 TX state control unit
182 Clock generation unit
183 Signal processing unit
191 Control code insertion unit
192 8B10B symbol encoder
193 Synchronization unit
194 Transmission unit
201 RX state control unit
202 Signal processing unit
211 Reception unit
212 Clock generation unit
213 Synchronization unit
214 Symbol synchronization unit
215 10B8B symbol decoder
216 Skew correction unit
217 Control code removal unit
221 RX protocol management unit
222 Lane integration unit
223 Packet separation unit
224 Payload error correction unit
225 Pixel conversion unit
231 State control unit
232 Header error correction unit
233 Data removal unit
234 Footer error detection unit
241 Frame data output unit
242 Register
243 System control unit
244 Symbol synchronization unit
301 Pre-encoder
401 Data inversion unit
402 Distance determination unit
451 Distance determination unit
501 Scrambling unit
511 Descrambling unit

The invention claimed is:

1. An encoding device comprising:
a memory storing instructions, and
at least one processor configured to execute the instructions to perform operations comprising:
- scrambling an input data string to produce a scrambled data string;
- calculating a first running disparity of the scrambled data string;
- determining whether or not to invert the scrambled data string on a basis of the first running disparity and a second running disparity calculated at a time point before the first running disparity;
- determining a flag in association with the input data string;
- calculating a parity code using the flag; and
- adding the parity code at an end of a block that includes the scrambled data string.

2. The encoding device according to claim 1, wherein the operations further comprise:
refraining from scrambling in a case where the input data string is a control code.

3. The encoding device according to claim 1, wherein the operations further comprise:
comparing a first absolute value of a value obtained by adding the first running disparity and the second running disparity with a second absolute value of a value obtained by adding an inverted value of the first running disparity and the second running disparity, and determining to perform inversion in a case where the second absolute value is smaller than the first absolute value.

4. The encoding device according to claim 3, wherein the first running disparity and the second running disparity are values including the flag.

5. The encoding device according to claim 1, wherein the operations further comprise:
after an initial determination whether or not to invert, determining whether or not a run length continuing from a time point before the scrambled data string is a predetermined threshold or more, and in a case where the run length is equal to or more than a predetermined threshold, performing processing according to a determination result different from the initial determination.

6. The encoding device according to claim 1, wherein the parity code is determined as a result of a Humming coding process performed on the flag.

7. The encoding device according to claim 1, wherein the operations further comprise:
determining to perform inversion in a case where the first running disparity is larger than 0 and the second running disparity is larger than 0, and
determining not to perform inversion in a case where the first running disparity is larger than 0 and the second running disparity is smaller than 0.

8. The encoding device according to claim 1, wherein the operations further comprise:
determining not to perform inversion in a case where the first running disparity is smaller than 0 and the second running disparity is larger than 0, and determining to perform inversion in a case where the first running disparity is smaller than 0 and the second running disparity is larger than 0.

9. An encoding method comprising, by an encoding device:
scrambling an input data string to produce a scrambled data string;
calculating a first running disparity of the scrambled data string;
determining whether or not to invert the scrambled data string on a basis of the calculated first running disparity and a second running disparity calculated at a time point before the first running disparity;
determining a flag in association with the input data string;
calculating a parity code using the flag; and
adding the parity code at an end of a block that includes the scrambled data string.

10. The encoding method according to claim 9, wherein the parity code is determined as a result of a Humming coding process performed on the flag.

11. A non-transitory computer readable medium storing a program for controlling an encoding device, the program being executable by a processor to perform operations comprising:
scrambling an input data string to produce a scrambled data string;
calculating a first running disparity of the scrambled data string;
determining whether or not to invert the scrambled data string on a basis of the calculated first running disparity and a second running disparity calculated at a time point before the first running disparity;
determining a flag in association with the input data string;
calculating a parity code using the flag; and
adding the parity code at an end of a block that includes the scrambled data string.

12. The non-transitory computer readable medium according to claim 11, wherein the parity code is determined as a result of a Humming coding process performed on the flag.

13. A decoding device comprising:
a memory storing instructions, and
at least one processor configured to execute the instructions to perform operations comprising:
referring to a flag added to an input data string and determining whether or not the data string has been inverted;
referring to a parity code at an end of a block that includes the data string, the parity code having been calculated using the flag;
inverting and outputting the input data string in a case where the data string is determined to have been inverted, and outputting the input data string without inversion in a case where the data string is determined not to have been inverted; and
descrambling the data string output.

14. The decoding device according to claim 13, wherein the operations further comprise:
refraining from descrambling in a case where the input data string is determined to be a control code.

15. The decoding device according to claim 13, wherein the operations further comprise:
calculating a running disparity of the data string output and determining whether or not the running disparity tends to increase, to determine whether or not an error has occurred in the input data.

16. The decoding device according to claim 13, wherein the parity code is determined as a result of a Humming coding process performed on the flag.

17. A decoding method comprising, by a decoding device:
referring to a flag added to an input data string and determining whether or not the data string has been inverted;
referring to a parity code at an end of a block that includes the data string, the parity code having been calculated using the flag;
inverting and outputting the input data string in a case where the data string is determined to have been inverted, and outputting the input data string without inversion in a case where the data string is determined to have not been inverted; and
descrambling the data string output.

18. The decoding method according to claim 17, wherein the parity code is determined as a result of a Humming coding process performed on the flag.

19. A non-transitory computer readable medium storing a program for controlling a decoding device, the program being executable by a processor to perform operations comprising:
referring to a flag added to an input data string and determining whether or not the data string has been inverted;
referring to a parity code at an end of a block that includes the data string, the parity code having been calculated using the flag;
inverting and outputting the input data string in a case where the data string is determined to have been inverted, and outputting the input data string without inversion in a case where the data string is determined to have not been inverted; and
descrambling the data string output.

20. The non-transitory computer readable medium according to claim 19, wherein the parity code is determined as a result of a Humming coding process performed on the flag.

* * * * *